US009692103B2

(12) United States Patent
Srirattana et al.

(10) Patent No.: US 9,692,103 B2
(45) Date of Patent: Jun. 27, 2017

(54) RF COUPLER WITH SWITCH BETWEEN COUPLER PORT AND ADJUSTABLE TERMINATION IMPEDANCE CIRCUIT

(71) Applicant: Skyworks Solutions, Inc., Woburn, MA (US)

(72) Inventors: Nuttapong Srirattana, Billerica, MA (US); David Scott Whitefield, Andover, MA (US); David Ryan Story, Ladera Ranch, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/745,210

(22) Filed: Jun. 19, 2015

(65) Prior Publication Data

US 2016/0172739 A1 Jun. 16, 2016

Related U.S. Application Data

(60) Provisional application No. 62/090,015, filed on Dec. 10, 2014, provisional application No. 62/110,248, filed on Jan. 30, 2015.

(51) Int. Cl.
*H01P 5/18* (2006.01)
*H03H 7/38* (2006.01)

(52) U.S. Cl.
CPC .................................... *H01P 5/185* (2013.01)

(58) Field of Classification Search
CPC ........................................................ H01P 5/18
(Continued)

(56) References Cited

U.S. PATENT DOCUMENTS 3,611,199 A * 10/1971 Safran ..................... H01P 1/185 333/109
4,460,875 A 7/1984 Harman
(Continued)

FOREIGN PATENT DOCUMENTS

EP 2503701 A2 9/2012
JP 2013126067 A * 6/2013 .............. H04B 1/40
(Continued)

OTHER PUBLICATIONS

Invitation to Pay Additional Fees from the International Searching Authority for corresponding International Application No. PCT/US2015/064444 dated Apr. 1, 2016.
(Continued)

*Primary Examiner* — Dean Takaoka
(74) *Attorney, Agent, or Firm* — Lando & Anastasi, LLP

(57) ABSTRACT

Aspects of this disclosure relate to a radio frequency coupler and a switch between a port of the radio frequency coupler and an adjustable termination impedance circuit. In an embodiment, an apparatus includes a radio frequency (RF) coupler, a termination impedance circuit, and a switch circuit. The RF coupler can provide an indication of forward RF power at a coupled port in a forward power state and provide an indication of reverse RF power at an isolated port in a reverse power state. The termination impedance circuit can provide an adjustable termination impedance. The switch circuit can electrically connect the termination impedance circuit to the isolated port in the forward power state and electrically isolate the termination impedance circuit from the isolated port of the RF coupler in the reverse power state.

20 Claims, 27 Drawing Sheets

(58) Field of Classification Search
USPC .......................................... 333/109–112, 116
See application file for complete search history.

(56) References Cited

U.S. PATENT DOCUMENTS

| | | | | |
|---|---|---|---|---|
| 4,764,740 | A * | 8/1988 | Meyer | H01P 1/185 333/103 |
| 5,038,112 | A * | 8/1991 | O'Neill | H03G 7/00 330/207 P |
| 5,363,071 | A * | 11/1994 | Schwent | H01P 5/04 333/111 |
| 5,745,016 | A * | 4/1998 | Salminen | G01R 1/24 324/95 |
| 6,020,795 | A | 2/2000 | Kim | |
| 6,078,299 | A | 6/2000 | Scharfe, Jr. | |
| 6,108,527 | A | 8/2000 | Urban et al. | |
| 6,329,880 | B2 * | 12/2001 | Akiya | 330/207 P |
| 6,496,708 | B1 | 12/2002 | Chan et al. | |
| 6,771,141 | B2 | 8/2004 | Iida et al. | |
| 6,972,640 | B2 | 12/2005 | Nagamori et al. | |
| 7,042,309 | B2 | 5/2006 | Podell | |
| 7,305,223 | B2 | 12/2007 | Liu et al. | |
| 7,319,370 | B2 | 1/2008 | Napijalo | |
| 7,493,093 | B2 | 2/2009 | Boerman et al. | |
| 7,538,635 | B2 * | 5/2009 | Fukuda | H01P 5/227 333/111 |
| 7,546,089 | B2 * | 6/2009 | Bellantoni | H01P 5/04 333/101 |
| 8,175,554 | B2 | 5/2012 | Camuffo et al. | |
| 8,248,302 | B2 * | 8/2012 | Tsai | H01P 1/18 333/117 |
| 8,289,102 | B2 * | 10/2012 | Yamamoto | H01P 5/184 333/116 |
| 8,315,576 | B2 | 11/2012 | Jones | |
| 8,417,196 | B2 | 4/2013 | Kitching et al. | |
| 8,606,198 | B1 | 12/2013 | Wright | |
| 9,014,647 | B2 | 4/2015 | Kitching et al. | |
| 9,214,967 | B2 | 12/2015 | Reisner et al. | |
| 9,356,330 | B1 | 5/2016 | Donoghue et al. | |
| 2002/0113666 | A1 | 8/2002 | Yamazaki et al. | |
| 2002/0139975 | A1 | 10/2002 | Lewis et al. | |
| 2004/0127178 | A1 | 7/2004 | Kuffner | |
| 2005/0040912 | A1 | 2/2005 | Pelz | |
| 2005/0146394 | A1 | 7/2005 | Podell | |
| 2005/0170794 | A1 * | 8/2005 | Koukkari | H01P 1/22 455/120 |
| 2008/0070519 | A1 | 3/2008 | Okabe | |
| 2008/0112466 | A1 | 5/2008 | Sasaki | |
| 2009/0134953 | A1 | 5/2009 | Hunt et al. | |
| 2011/0057746 | A1 | 3/2011 | Yamamoto et al. | |
| 2011/0063044 | A1 | 3/2011 | Jones | |
| 2011/0199166 | A1 | 8/2011 | Carrillo-Ramirez | |
| 2011/0279192 | A1 | 11/2011 | Nash et al. | |
| 2011/0298559 | A1 | 12/2011 | Kitching et al. | |
| 2012/0019332 | A1 | 1/2012 | Hino et al. | |
| 2013/0005284 | A1 | 1/2013 | Dalipi | |
| 2013/0113575 | A1 | 5/2013 | Easter | |
| 2013/0194054 | A1 | 8/2013 | Presti | |
| 2013/0207741 | A1 | 8/2013 | Presti | |
| 2013/0307635 | A1 | 11/2013 | Kase et al. | |
| 2014/0266499 | A1 * | 9/2014 | Noe | H01P 5/04 333/111 |
| 2014/0368293 | A1 | 12/2014 | Mukaiyama | |
| 2015/0002239 | A1 | 1/2015 | Tanaka | |
| 2015/0200437 | A1 | 7/2015 | Solomko et al. | |
| 2015/0349742 | A1 | 12/2015 | Chen et al. | |
| 2016/0028147 | A1 | 1/2016 | Srirattana et al. | |
| 2016/0028420 | A1 | 1/2016 | Srirattana et al. | |
| 2016/0043458 | A1 | 2/2016 | Sun et al. | |
| 2016/0065167 | A1 * | 3/2016 | Granger-Jones | H01F 38/14 333/112 |
| 2016/0079649 | A1 * | 3/2016 | Ilkov | H03H 7/383 343/853 |
| 2016/0079650 | A1 * | 3/2016 | Solomko | H03H 7/48 333/103 |
| 2016/0172737 | A1 * | 6/2016 | Srirattana | H01P 5/184 333/111 |
| 2016/0172738 | A1 * | 6/2016 | Srirattana | H01P 5/184 333/111 |
| 2016/0172739 | A1 | 6/2016 | Srirattana et al. | |
| 2016/0172740 | A1 * | 6/2016 | Srirattana | H01P 5/184 333/111 |

FOREIGN PATENT DOCUMENTS

| | | | |
|---|---|---|---|
| KR | 20040037465 | A | 5/2004 |
| KR | 20110118289 | A | 10/2011 |

OTHER PUBLICATIONS

International Search Report and Written Opinion from corresponding PCT Application No. PCT/US2015/064444 dated Jun. 6, 2016.

* cited by examiner

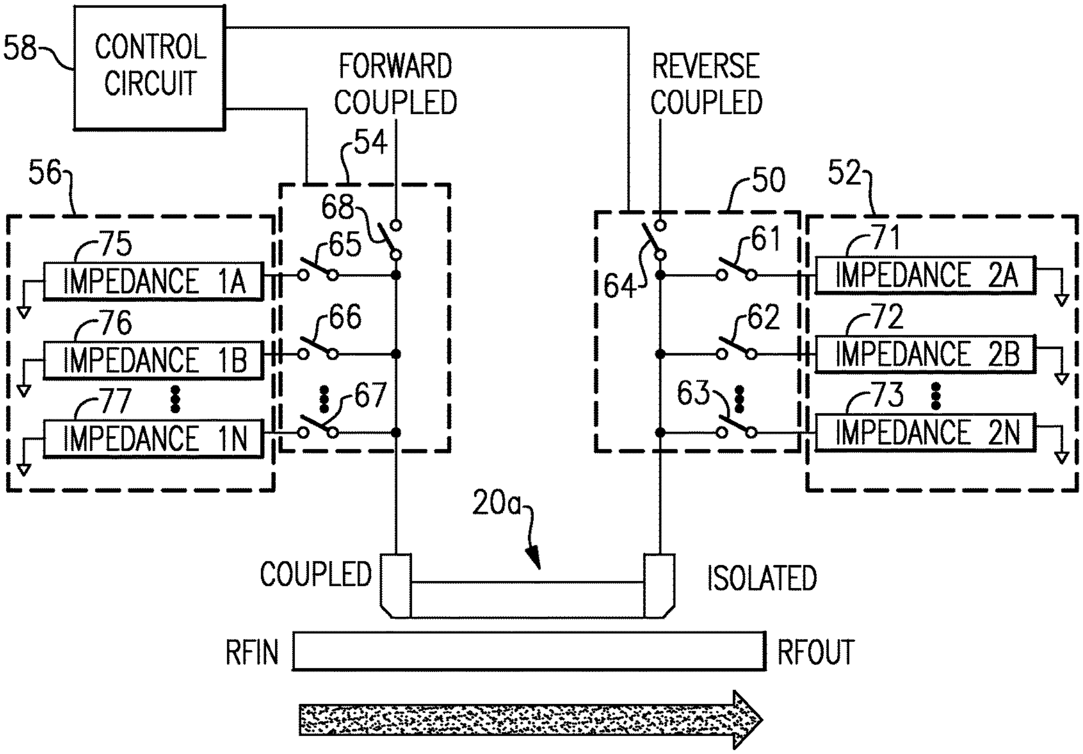
FIG.5
FIG.6A
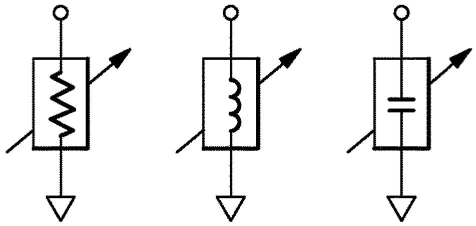
FIG.6B
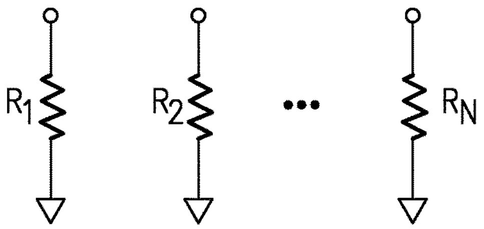

RF COUPLER WITH SWITCH BETWEEN COUPLER PORT AND ADJUSTABLE TERMINATION IMPEDANCE CIRCUIT

CROSS-REFERENCE TO RELATED APPLICATIONS

This application claims the benefit of priority under 35 U.S.C. §119(e) of U.S. Provisional Patent Application No. 62/090,015, filed Dec. 10, 2014 and titled "RADIO FREQUENCY COUPLER", the entire disclosure of which is hereby incorporated by reference in its entirety herein. This application also claims the benefit of priority under 35 U.S.C. §119(e) of U.S. Provisional Patent Application No. 62/110,248, filed Jan. 30, 2015 and titled "RADIO FREQUENCY COUPLERS", the entire disclosure of which is hereby incorporated by reference in its entirety herein.

The present disclosure relates to U.S. patent application Ser. No. 14/745,213, titled "RF COUPLER HAVING COUPLED LINE WITH ADJUSTABLE LENGTH," U.S. patent application Ser. No. 14/745,145, titled "RF COUPLER WITH DECOUPLED STATE," and U.S. patent application Ser. No. 14/745,154, titled "RF COUPLER WITH ADJUSTABLE TERMINATION IMPEDANCE," each filed on Jun. 19, 2015, and the disclosure of each of which is hereby incorporated by reference herein in its entirety.

BACKGROUND

Technical Field

This disclosure relates to electronic systems and, in particular, to radio frequency (RF) couplers.

Description of the Related Technology

Radio frequency (RF) sources, such as RF amplifiers, can provide RF signals. When an RF signal generated by an RF source is provided to a load, such as to an antenna, a portion of the RF signal can be reflected back from the load. An RF coupler can be included in a signal path between the RF source and the load to provide an indication of forward RF power of the RF signal traveling from the RF amplifier to the load and/or an indication of reverse RF power reflected back from the load. RF couplers include, for example, direction couplers, bi-directional couplers, multi-band couplers (e.g., dual-band couplers), etc.

An RF coupler can have a coupled port, an isolated port, a power input port, and a power output port. When a termination impedance is presented to the isolated port, an indication of forward RF power traveling from the power input port to the power output port can be provided at the coupled port. When a termination impedance is presented to the coupled port, an indication of reverse RF power traveling from the power output port to the power input port can be provided at the isolated port. The termination impedance has been implemented by a 50 Ohm shunt resistor in a variety of conventional RF couplers.

An RF coupler has a coupling factor, which can represent how much power is provided to the coupled port of the RF coupler relative to the power of an RF signal at the power input port. RF couplers typically cause an insertion loss in an RF signal path. Thus, an RF signal received at the power input port of an RF coupler can have a lower power when provided at the power output port of the RF coupler. Insertion loss can be due to a portion of the RF signal being provided to the coupled port (or to the isolated port) and/or to losses associated with the main transmission line of the RF coupler.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an apparatus that includes a radio frequency coupler. The radio frequency coupler includes a power input port, a power output port, a coupled port, a multi-section coupled line, and a switch configured to adjust an effective length of the multi-section coupled line.

The effective length of the multi-section coupled line can be a length of the coupled line electrically connected between the coupled port and a termination impedance. The multi-section coupled line can include at least a first section and a second section, and the switch is disposed in series between the first section and the second section. The radio frequency coupler can further include a second switch, the multi-section coupled line can include a third section, and the second switch can be configured to selectively electrically connect the third section to the coupled port.

The apparatus can further include a first termination impedance element electrically coupleable to a first section of the multi-section couple line and a second termination impedance element electrically coupleable to a second section of the multi-section coupled line.

The apparatus can further include an adjustable termination impedance circuit electrically connectable to a section of the multi-section coupled line, in which the adjustable termination impedance circuit is configured to provide a termination impedance to the section of the multi-section coupled line.

The apparatus can further include an adjustable termination impedance circuit and a switch network, in which the switch network is configured to selectively electrically couple the adjustable termination impedance circuit to a first section of the multi-section coupled line and to selectively electrically couple the adjustable termination impedance circuit to a second section of the multi-section coupled line.

The radio frequency coupler can include a main line implemented by a continuous conductive structure electrically connecting the power input port and the power output port. The radio frequency coupler can be configured to operate in a decoupled state in which each section of the multi-section coupled line is decoupled from a main line electrically connecting the power input port and the power output port.

The apparatus can further include a switch network arranged to configure the radio frequency coupler into a first state to provide an indication of forward power and into a second state to provide an indication of reflected power.

The apparatus can include a control circuit configured to adjust the state of the switch. The apparatus can further include a switch network configured to electrically couple a first impedance element to a first end of a first section of the multi-section coupled line and electrically couple a second end of the first section of the multi-section coupled line to a power output in a first state, and to electrically couple a second impedance element to a first end of a second section of the multi-section coupled line and electrically couple a second end of the second section of the multi-section coupled line to the power output in a second state.

The apparatus can further include a package enclosing the radio frequency coupler. The apparatus can further include an antenna switch module in communication with the radio frequency coupler, in which the antenna switch module enclosed within the package. The apparatus can further include a power amplifier configured to provide a radio frequency signal to the radio frequency coupler by way of the antenna switch module, in which the power amplifier is enclosed within the package.

Another aspect of this disclosure is an apparatus that includes a radio frequency coupler that includes a power input port, a power output port, a port configured to provide an indication of power of a radio frequency signal traveling between the power input port and the power output port, and a coupled line. The coupled line includes at least a first section and a second section. The radio frequency coupler further includes a switch electrically connected to a node in a path between the first section of the coupled line and the second section of the coupled line. The switch is configured to adjust a length of the coupled line electrically connected between the port configured to provide the indication of power and a termination impedance.

The port configured to provide the indication of power of a radio frequency signal traveling between the power input port and the power output port can be a coupled port that provides an indication of power traveling from the power input port to the power output port. The port configured to provide the indication of power of a radio frequency signal traveling between the power input port and the power output port can be an isolated port that provides an indication of power traveling from the power output port to the power input port. The switch can be disposed in series between the first section and the second section. The radio frequency coupler can further include a third section of the coupled line and a second switch disposed in series between the second section and the third section, in which the second switch is configured to selectively electrically connect the third section to the port configured to provide the indication of power of the radio frequency signal traveling between the power input port and the power output port.

Another aspect of this disclosure is an apparatus that includes a radio frequency coupler. The radio frequency coupler includes a power input port, a power output port, a coupled port, and a coupled line having an adjustable effective length that contributes to a coupling factor of the radio frequency coupler.

The coupled line can include a plurality of sections electrically connectable in series with each other, in which each section of the plurality of sections is selectively electrically coupleable to the coupled port. The radio frequency coupler can further include a switch disposed between two adjacent sections of the plurality of sections, in which the switch is configured to selectively electrically couple the two adjacent sections to each other responsive to a control signal.

Another aspect of this disclosure is an apparatus that includes a radio frequency (RF) coupler and a switch network. The RF coupler has at least a power input port, a power output port, a coupled port, and an isolated port. The switch network is configurable into at least a first state and a second state. The switch network is configured to electrically connect a termination impedance to the isolated port in the first state, and the switch network is configured to decouple an RF signal traveling between the power input port and the power output port from the isolated port and the coupled port in the second state.

The RF coupler can further include at least one coupling factor switch configured to adjust an effective length of a multi-section coupled line of the RF coupler that is electrically connected to the coupled port. The coupling factor switch can be configured to electrically isolate two adjacent sections of the multi-section coupled line while the switch network operates in the second state.

The switch network can be configured to adjust the termination impedance electrically coupled to the isolated port. The switch network can be configured to adjust the termination impedance electrically coupled to the isolated port responsive to a signal indicative of a selected frequency band.

The apparatus can include a control circuit configured to transition the switch network from the first state to the second state. Alternatively or additionally, the control circuit can be configured to adjust the termination impedance that is electrically connected to the isolated termination based at least partly on a control signal. The control signal can be indicative of at least one of a power mode or a frequency band of operation of the apparatus.

The apparatus can include a termination impedance circuit having a connection node, the switch network can be configurable into a third state, the switch network can be configured to electrically connect the isolated port to the connection node in the first state to electrically connect the termination impedance to the isolated port, and the switch network can be configured to electrically connect the connection node to the coupled port in a third state. The termination impedance can be implemented by at least two switches and at least two passive impedance elements in series between the isolated port and a reference potential.

Another aspect of this disclosure is an apparatus that includes a radio frequency (RF) coupler and a switch network. The RF coupler has at least a power input port, a power output port, a coupled port, an isolated port, a main line, and a coupled line. The switch network is configurable into at least a first state and a second state. The switch network is configured to electrically connect a termination impedance to one of the isolated port or the coupled port in the first state. The switch network is configured to decouple the coupled line from the main line in the second state.

The apparatus can include the termination impedance. The switch network can be configurable into a third state, in which the switch network is configured to electrically connect another termination impedance to the other of the isolated port or the coupled port in the third state. Alternatively, the switch network can be configurable into a third state, in which the switch network is configured to electrically connect the termination impedance to the other of the isolated port or the coupled port in the third state.

The apparatus can include a control circuit in communication with the switch network, and the control circuit can be configured to control the switch network to transition from the first state to the second state.

The apparatus can be configured as a packaged module that includes a package enclosing the RF coupler and the switch network.

The coupled line can include at least a first section and a second section, and the RF coupler can further includes a coupling factor switch configured to electrically connect the first section to the second section when on and to electrically decouple the first section from the second section when off.

Another aspect of this disclosure is a radio frequency (RF) coupler, a switch network, and a control circuit. The RF coupler has at least a power input port, a power output port, a coupled port, an isolated port, a main line electrically connecting the power input port and the power output port, and a coupled line electrically connecting the coupled port and the isolated port. The control circuit is configured to control the switch network to electrically decouple the isolated port and the coupled port from one or more termination impedances in a first mode of operation to decouple the coupled line from the main line. The control circuit is further configured to control the switch network to electrically connect one of the coupled port or the isolated port to at least one of the one or more termination impedances in a second mode of operation to provide an indication of power of the radio frequency signal traveling between the power input port and the power output port in the second mode of operation.

The control circuit can be configured to control the switch network to electrically connect the isolated port to the one of the one or more termination impedances in the second mode of operation, and the indication of power of the radio frequency signal can be representative of forward radio frequency power traveling from the power input port to the power output port. The control circuit can be further configured to control the switch network to electrically connect the coupled port to another of the one or more termination impedances in a third mode of operation to provide an indication of power of the radio frequency signal traveling from the power output port to the power input port.

Another aspect of this disclosure is an apparatus that includes a radio frequency (RF) coupler, a termination impedance circuit, and a switch circuit. The RF coupler has at least a power input port configured to receive an RF signal, a coupled port and an isolated port. The RF coupler is configured to provide an indication of forward RF power of the RF signal at the coupled port in a forward power state and to provide an indication of reverse RF power of the RF signal at the isolated port in a reverse power state. The termination impedance circuit is configured to provide an adjustable termination impedance. The switch circuit is configured to electrically connect the termination impedance circuit to the isolated port in the forward power state and to electrically isolate the termination impedance circuit from the isolated port of the RF coupler in the reverse power state.

The apparatus can include a second termination impedance circuit configured to provide a second adjustable termination impedance, and the switch circuit can be configured to selectively electrically connect the second termination impedance circuit to the coupled port of the RF coupler and to selectively electrically isolate the second termination impedance circuit from the coupled port of the RF coupler.

The switch circuit can be configured to electrically connect the termination impedance circuit to the coupled port when the switch circuit isolates the isolated port from the termination impedance circuit.

The apparatus can include a memory and a control circuit, the control circuit arranged to configure at least a portion of the termination impedance circuit based on data stored in the memory. The apparatus can have a decoupled state in which a coupled line of the RF coupler is decoupled from a transmission line of the RF coupler.

Another aspect of this disclosure is an apparatus that includes a radio frequency (RF) coupler, a termination impedance circuit, and an isolation switch. The RF coupler has at least a power input port, a power output port, a coupled port, and an isolated port. The termination impedance circuit is configured to provide an adjustable termination impedance. The isolation switch is disposed between the isolated port and the termination impedance circuit. The isolation switch is configured to electrically connect the isolated port to the termination impedance circuit when the isolation switch is on such that the coupled port provides an indication of RF power traveling from the power input port to the power output port. The isolation switch is configured to electrically isolate the isolated port from the termination impedance circuit when the isolation switch is off.

The isolation switch can be a single pole, single throw switch. The isolation switch can include a series-shunt-series circuit topology.

The apparatus can include a second termination impedance circuit configured to provide a second adjustable termination impedance and a second isolation switch, in which the second isolation switch is disposed between the second termination impedance circuit and the coupled port.

The apparatus can include a second isolation switch disposed between the termination impedance circuit and the coupled port, in which the second isolation switch is configured to electrically connect the coupled port to the termination impedance circuit when the second isolation switch is on such that the isolated port provides an indication of RF power traveling from the power output port to the power input port, and the second isolation switch is configured to electrically isolate the coupled port from the termination impedance circuit when the second isolation switch is off.

The termination impedance circuit can include a plurality of switches and a plurality of passive impedance elements. The isolation switch and at least one of the plurality of switches can be in series between each of the plurality of passive impedance elements and the isolated port.

Another aspect of this disclosure is an apparatus that includes a radio frequency (RF) coupler, a termination impedance circuit, and a switch circuit. The RF coupler has at least a power input port configured to receive an RF signal, a coupled port and an isolated port. The RF coupler is configured to provide an indication of forward RF power of the RF signal at the coupled port in a forward power state and to provide an indication of reverse RF power of the RF signal at the isolated port in a reverse power state. The termination impedance circuit is configured to provide an adjustable termination impedance. The switch circuit is configured to selectively electrically connect the termination impedance circuit to a selected port of the RF coupler and to selectively electrically isolate the termination impedance circuit from the selected port of the RF coupler, in which the selected port is the isolated port or the coupled port.

The apparatus can include a second termination impedance circuit configured to provide a second adjustable termination impedance, the selected port being the isolated port, and the switch circuit can be configured to selectively electrically connect the second termination impedance circuit to the coupled port of the RF coupler and to selectively electrically isolate the second termination impedance circuit from the coupled port of the RF coupler.

The selected port can be the isolated port and the switch circuit can be configured to electrically connect the termination impedance circuit to the coupled port when the switch circuit isolates the isolated port from the termination impedance circuit. The apparatus can include a control circuit configured to adjust the adjustable termination impedance based at least partly on an indication of a frequency of the RF signal. The apparatus can include a memory and a control circuit, in which the control circuit is arranged to configure at least a portion of the termination impedance circuit based on data stored in the memory.

The termination impedance circuit can include a switch disposed between the switch circuit and a passive impedance element. The termination impedance circuit can include at least two switches and at least two passive impedance elements, in which the two switches and the two passive impedance elements are disposed in series between the switch circuit and ground. The termination impedance circuit can include a switch bank of switches disposed in parallel with each other and passive impedance elements, in which each of the switches of the switch bank being disposed between the switch circuit and a respective passive impedance element of the passive impedance elements.

Another aspect of this disclosure is an apparatus that includes a radio frequency (RF) coupler and a termination impedance circuit. The RF coupler has at least a power input port, a power output port, a coupled port, and an isolated port. The termination impedance circuit is configured to provide an adjustable termination impedance. The termination impedance circuit includes two switches and a passive impedance element which are in series between a reference potential and a selected port of the RF coupler. The selected port of the RF coupler is one of the isolated port of the RF coupler or the coupled port of the RF coupler.

The selected port can be the isolated port. The two switches and a passive impedance element are also in series between the coupled port and the reference potential. The reference potential can be ground. The selected port can be the coupled port. The passive impedance element can be coupled in series between the two switches. At least one of the two switches can be configured to change state responsive to a control signal indicative of at least one of a process variation or a frequency band of operation.

The termination impedance circuit can include a second passive impedance element, in which the two switches, the passive impedance element, and the second passive impedance element can be in series between the reference potential and the selected port of the RF coupler. The passive impedance element can be a resistor and the second passive impedance element can be an inductor. Alternatively, the passive impedance element can be a capacitor and the second passive impedance element can be an inductor. As another alternative, the passive impedance element can be a resistor and the second passive impedance element can be a capacitor.

The termination impedance circuit can include a resistor, a capacitor, and an inductor. The termination impedance circuit can include a plurality of passive impedance elements and a bank of switches, in which the plurality of passive impedance elements include the passive impedance element, the bank of switches includes one of the two switches, and the termination impedance circuit includes series combinations of each of the switches of the bank of switches and a respective passive impedance element of the plurality of passive impedance elements arranged in parallel with each other.

Another aspect of this disclosure is a radio frequency (RF) coupler and a termination impedance circuit. The RF coupler has at least a power input port, a power output port, a coupled port, and an isolated port. The termination impedance circuit is configured to provide an adjustable termination impedance. The termination impedance circuit includes a resistor, a switch, and a passive impedance element arranged in series between a reference potential and a selected port of the RF coupler. The selected port is one of the isolated port of the RF coupler or the coupled port of the RF coupler. The passive impedance element includes at least one of a capacitor or an inductor.

The apparatus can include a second switch, in which the second switch is arranged in series with the switch between the reference potential and the selected port of the RF coupler. The RF coupler can be configured to provide an indication of forward power at the coupled port in a first state and to provide an indication of reflected power at the isolated port in a second state.

Another aspect of this disclosure is an apparatus that includes a radio frequency (RF) coupler and a termination impedance circuit. The RF coupler has at least a power input port, a power output port, a coupled port, and an isolated port. The termination impedance circuit includes passive impedance elements and switches. The switches are configured to selectively electrically connect a subset of the passive impedance elements between the isolated port and ground responsive to one or more control signals. The subset of the passive impedance elements includes two passive impedance elements electrically connected in series with each other between the isolated port and ground. The two passive impedance elements include at least one of a resistor or an inductor.

The subset of passive impedance elements can include at least two of a resistor, a capacitor, or an inductor. At least one of the one or more control signals can be indicative of at least one of a process variation or a frequency band of operation. The apparatus can include an isolation switch disposed between the termination impedance circuit and the isolated port of the RF coupler.

Another aspect of this disclosure is an apparatus that includes a radio frequency (RF) coupler, a termination circuit, a memory, and a control circuit. The RF coupler has at least a power input port, a power output port, a coupled port, and an isolated port. The termination circuit is configured to provide an adjustable termination impedance to at least one of the isolated port or the coupled port. The termination circuit includes switches and passive impedance elements. The memory is configured to store data to set a state of one or more of the switches of the termination circuit. The control circuit is in communication with the memory. The control circuit is configured to provide one or more control signals to set the state of the one or more switches based at least partly on the data stored in the memory.

The data stored in the memory can be indicative of a process variation. Alternatively or additionally, the data stored in the memory can be indicative of an application parameter. The memory can include persistent memory elements, such as fuse elements. the memory can be embodied on same die as at least one of the control circuit or the termination circuit. The apparatus can include a package enclosing the memory and the RF coupler. The apparatus can include a switch disposed between the termination circuit and the RF coupler. The termination impedance circuit can be coupleable to the isolated port in a first state and coupleable to the coupled port in a second state.

Another aspect of this disclosure is an electronically-implemented method that includes: obtaining data indicative of a desired termination impedance at a port of a radio frequency (RF) coupler; and storing the data to physical memory such that the stored data is accessible to a control circuit, in which the control circuit is arranged to configure at least a portion of a termination circuit electrically connected to the port of the RF coupler based at least partly on the data stored to the memory.

The data stored to the physical memory is indicative of a process variation and/or an application parameter. The physical memory can be a persistent memory. The physical memory can include fuse elements. The port can be an isolated port of the RF coupler. Alternatively, the port can be a coupled port of the RF coupler.

The control circuit can be configured to set a state of one or more switches of a termination circuit electrically connected to the port of the RF coupler based at least partly on the data stored to the memory. The method can include setting the state of the one or more switches of the termination circuit based at least partly on the data stored to the memory.

Another aspect of this disclosure is an apparatus that includes a bi-directional radio frequency (RF) coupler, a termination impedance circuit, and a switch circuit having at least a first state and a second state. The switch circuit is configured to electrically connect the termination impedance circuit to different ports of the bi-directional RF coupler in different states.

The different ports can include an isolated port of the RF coupler and a coupled port of the RF coupler.

Another aspect of this disclosure is an apparatus that includes a bi-directional radio frequency (RF) coupler having at least a power input port, a power output port, a coupled port, and an isolated port. The apparatus also includes one or more termination adjustable impedance circuits configured to present a first impedance to the isolated port in a first mode of operation and to present an second termination impedance to the coupled port in a second mode of operation.

The apparatus can include a control circuit configured to cause the one or more termination adjustable circuits to change state.

The one or more adjustable termination circuits can include a first termination impedance circuit to present the first termination impedance and a second termination impedance circuit to present the second termination impedance. Alternatively, the one or more adjustable termination circuits can include a shared termination impedance circuit to present the first termination impedance and the second termination impedance.

The one or more termination adjustable circuits can include a switch network and passive impedance elements configured to provide the first termination impedance. The passive impedance elements can include a plurality of resistors each having a first end electrically connected to a respective switch of the switch network and a second end electrically connected to ground.

The one or more termination adjustable circuits can include at least one of an adjustable resistance, an adjustable capacitance, or an adjustable inductance. The one or more adjustable termination impedance circuits can be configured to present the first impedance with at least two switches and at least two passive impedance elements in series between the isolated port and ground.

The one or more termination adjustable circuits can be configured to adjust the second termination impedance based at least partly on a control signal indicative of a frequency band of a radio frequency signal provided to the RF coupler. Alternatively or additionally, the one or more termination adjustable circuits can be configured to adjust the second termination impedance based at least partly on a control signal indicative of a power mode of the apparatus.

The apparatus can include an isolation switch disposed between the one or more adjustable termination impedance circuits and the isolated port, in which the isolation switch is configured to electrically connect the isolated port to at least one of the one or more adjustable impedance circuits when on and to electrically isolate the isolated port from the one or more adjustable impedance circuits when off. The apparatus can further include a second isolation switch disposed between the one or more adjustable termination impedance circuits and the coupled port, in which the second isolation switch is configured to electrically connect the coupled port to at least one of the one or more adjustable termination impedance circuits when on and to electrically isolate the coupled port from the one or more adjustable termination impedance circuits when off.

Another aspect of this disclosure is an apparatus that includes a bi-directional RF coupler, a termination impedance circuit, and a switch circuit. The bi-directional RF coupler has at least a power input port, a power output port, a coupled port, and an isolated port. The switch circuit has at least a first state and a second state. The switch circuit is configured to electrically connect the termination impedance circuit to the isolated port in the first state and to electrically connect the termination impedance circuit to the coupled port in the second state.

The termination impedance circuit can be configured to provide an adjustable termination impedance. The termination impedance circuit can include a plurality of switches and a plurality of passive impedance elements. At least one of the switches of the termination impedance circuit and at least one switch of the switch circuit are in series between the isolated port of the RF coupler and each of the passive impedance elements of the termination impedance circuit.

Another aspect of this disclosure is an apparatus that includes a bi-directional radio frequency (RF) coupler, a first adjustable termination impedance circuit, and a second adjustable termination impedance circuit that is separate from the first adjustable termination impedance circuit. The bi-directional RF coupler has at least a power input port, a power output port, a coupled port, and an isolated port. The first adjustable termination impedance circuit is configured to provide a first termination impedance to the isolated port when a portion of RF power traveling from the power input port to the power output port is being provided to the coupled port. The first adjustable impedance termination circuit is configured to change state to adjust the first termination impedance. The second adjustable termination impedance circuit is configured to provide a second termination impedance to the coupled port when a portion of RF power traveling from the power output port to the power input port is being provided to the isolated port. The second adjustable termination impedance circuit is configured to change state to adjust the second termination impedance.

The first adjustable termination impedance circuit can include a first switch network and a first termination impedance circuit to provide the first termination impedance. The first adjustable termination impedance circuit can include at least one of an adjustable resistance, an adjustable capacitance, or an adjustable inductance. The second adjustable termination impedance circuit can be configured to adjust the second termination impedance based at least partly on a control signal indicative of at least one of a frequency band of a radio frequency signal provided to the RF coupler or a power mode of the apparatus.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

In FIG. 4, the electronic system is configured to extract a portion of power of a radio frequency signal traveling in an opposite direction than in FIG. 3A.

FIG. 5 is a schematic diagram illustrating the electronic system of 3A configured in a different state than in FIG. 3A. In FIG. 5, the electronic system is configured in a decoupled state.

FIG. 6A is a schematic diagram illustrating that the termination impedance circuit of FIG. 3A can be implemented by an adjustable resistance circuit, an adjustable capacitance circuit, and/or an adjustable inductance circuit. FIG. 6B is a schematic diagram illustrating that the termination impedance circuit of FIG. 3A can include a plurality of resistors.

FIG. 26A is a block diagram of a packaged module that includes a radio frequency coupler. FIG. 26B is a block diagram of a packaged module that includes a radio frequency coupler and an antenna switch module. FIG. 26C is a block diagram of a packaged module that includes a radio frequency coupler, an antenna switch module, and a power amplifier.

DETAILED DESCRIPTION OF CERTAIN EMBODIMENTS

Figure 1:
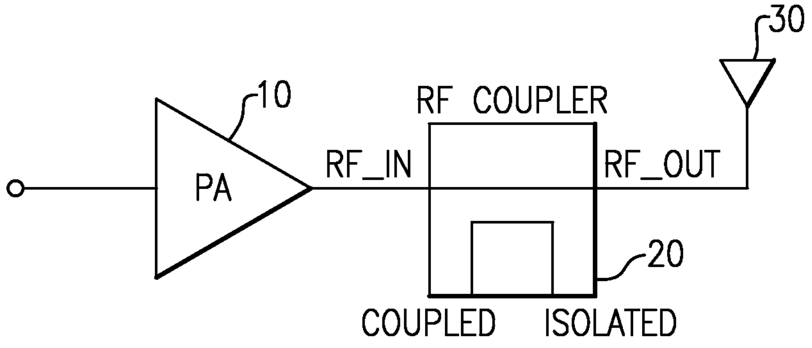
FIG. 1 is a schematic block diagram in which a radio frequency coupler is configured to extract a portion of power of a radio frequency signal traveling between a power amplifier and an antenna.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Conventional radio frequency (RF) couplers can have limitations related to a fixed coupling factor at a given frequency. The fixed coupling factor at frequency F can be represented by the coupling factor at frequency A plus 20 log (A/F). For smaller absolute coupling factors, greater coupling effects can be present. At higher frequencies, the coupling effects can be greater. Conventional RF couplers can also have a fixed insertion loss at a given frequency. Insertion loss can be a function of the coupling factor plus resistive loss of the main transmission line of the RF coupler that electrically connects a power input port to a power output port.

Directivity of an RF coupler can be dependent on termination impedance at the isolated port. In conventional RF couplers, termination impedance is typically at a fixed impedance value that provides a desired directivity for only a particular frequency bandwidth. However, with a fixed termination impedance, the radio frequency coupler will not have a desired directivity when an RF signal is outside of the particular frequency band. Thus, when operating in a different frequency band outside of the particular frequency band, directivity will not be optimized.

Flattening a coupling factor over frequency can be desirable. Flatting the coupling factor over frequency has been implemented by inserting a post-RF coupler RLC network to offset and/or compensate for an increased coupling slope of the RF coupler. This brute-force method can flatten coupling factor over a relatively wide frequency range. However, this method can adversely impact insertion loss in a main signal path since the RLC network can be lossy. As a result, for a desired coupling factor, it may be desirable for the RF coupler to have even more coupling to compensate for the loss of the RLC network. Thus, the insertion loss can be increased in the main signal path.

In addition, traditional RF couplers add insertion loss to a signal path even when unused. This can degrade an RF signal even when the RF coupler is not being used to detect power.

Performance of an RF coupler can be impacted by a variety of factors, such as process variations and/or variations in source impedance. As discussed above, typically a termination impedance used to terminate the isolated port of a conventional RF coupler is a fixed impedance that is not adjustable. Accordingly, a desired level of directivity may only be achieved for a selected frequency band and/or for a certain bandwidth with a fixed termination impedance. Process variations and/or variations in source impedance can be problematic with fixed termination impedances. Moreover, to avoid variation in semiconductor parameters, some termination impedance circuits have been implemented by external passive impedance elements formed by a non-semiconductor process. While such external passive impedance elements can lead to reduced variation in termination impedance values, these external passive impedance elements can be expensive and/or consume a larger area relative to semiconductor based passive impedance elements.

Process variations can impact performance of an RF coupler. For instance, the directivity of an RF coupler, such as a bi-directional RF coupler, can be dependent on the termination impedance at an isolated port of the coupler and a source impedance presented to a power input port of the coupler. Due to imperfections in semiconductor manufacturing processes, there can be process variations present in a termination impedance circuit for providing a termination impedance to a port of an RF coupler. Process variations can affect values of a resistance, a capacitance, an inductance, or any combination thereof in the termination impedance circuit. Such process variations in a termination impedance circuit can include, for example, variations in semiconductor field effect transistor (FET) on resistance and/or off capacitance, polysilicon resistor resistance, metal-insulator-metal (MIM) capacitor capacitance, inductor inductance, the like, or any combination thereof. Alternatively or additionally, process variations can affect a width of a coupled line and/or a spacing of the coupled line to the main line, which can change a characteristic of the RF coupler. Such variations in the coupled line can affect performance of the RF coupler and/or a termination impedance circuit. Typically, a distribution of process variations in the termination impedance circuit and/or coupled line can be approximated by a normal distribution with 3-sigma being about 10% to about 15%.

Variations in source impedance can impact performance of an RF coupler. For instance, the source impedance can deviate from a particular value for which a termination impedance circuit is configured to optimize directivity. When an RF coupler is in communication with another component (e.g., an RF power amplifier, an antenna switch, a diplexer, or a filter, etc.) configured to provide an RF signal to the RF coupler, the source impedance presented to the RF coupler may deviate from 50 Ohms. Such deviation can reduce directivity of the RF coupler relative to a 50 Ohm source impedance when the RF coupler is optimized for a 50 Ohm source impedance.

Aspects of this disclosure relate to adjusting a termination impedance electrically connected to a radio frequency coupler and/or adjusting an effective length of a coupled line electrically connected to a port of a radio frequency coupler. A variety of termination impedance circuits configured to provide adjustable termination impedances are disclosed. Such circuits can implement desired characteristics of an RF coupler, such as a desired directivity. Switches can adjust a coupling factor of an RF coupler by adjusting an effective length of a multi-section coupled line that is electrically connected to a coupled port of the RF coupler. RF couplers disclosed herein can be configured into a decoupled state to cause insertion loss associated with such RF couplers to be reduced when the RF couplers are not in use. In certain embodiments, an isolation switch is configured to selectively isolate an adjustable termination impedance circuit from a port of a radio frequency coupler, such as a coupled port or an isolated port. Alternatively or additionally, according to some embodiments, a switch circuit is configured to selectively electrically couple a termination impedance circuit to an isolated port of an RF coupler in one state and to selectively electrically couple the same termination impedance circuit to a coupled port of the RF coupler in another state. In various embodiments, a value indicative of a desired termination impedance can be stored in a memory and a state of a switch in a termination impedance circuit can be set based at least partly on the stored value. Any of the principles and advantages discussed herein can be applied to any suitable radio frequency coupler including, for example, a direction coupler, a bi-directional coupler, a dual-directional coupler, a multi-band coupler (e.g., a dual-band coupler), etc.

Adjusting the termination impedance electrically connected to a port of the radio frequency coupler can improve directivity of the radio frequency coupler by providing a desired termination impedance for certain operating conditions, such as a frequency band of a radio frequency signal provided to the radio frequency coupler or a power mode of an electronic system that includes the radio frequency coupler. In certain embodiments, a switch network can selectively electrically couple different termination impedances to the isolated port of the radio frequency coupler responsive to one or more control signals. The switch network can adjust the termination impedance of the radio frequency coupler to improve directivity across multiple frequency bands. The switch network can include switches between termination impedances and both the isolated port and the coupled port. Such an RF coupler can have a termination impedance provided to the isolated port for providing an indication of forward RF power in one state and have a termination impedance provided to the coupled port for providing an indication of reverse RF power in another state.

In certain embodiments, a termination impedance circuit including plurality of switches can adjust the termination impedance provided to an isolated port and/or a coupled port of an RF coupler by selectively providing resistance, capacitance, inductance, or any combination thereof in a termination path. The termination impedance circuit can provide any suitable termination impedance by selectively electrically coupling passive impedance elements in series and/or in parallel in the termination path. The termination impedance circuit can thereby provide a termination impedance having a desired impedance value. The termination impedance circuit can compensate for process variations and/or source impedance variations, for example. In some embodiments, data indicative of a desired termination impedance can be stored in memory and a state of at least one of the switches of the plurality of switches can be set based at least partly on the data stored in the memory. In some implementations, the memory can include persistent memory, such as fuse elements (e.g., fuses and/or antifuses), to store the data.

According to various embodiments, a switch can be disposed between a port of an RF coupler (e.g., a coupled port or an isolated port) and an adjustable termination impedance circuit. The switch can electrically isolate tuning elements (e.g., switches) of the adjustable termination impedance circuit from the port of the RF coupler when the adjustable termination impedance circuit is not providing a termination impedance to the port of the RF coupler. This can reduce loading effects, such as off capacitances of switches of the adjustable termination impedance circuit, on the port of the RF coupler. Accordingly, the switch can cause insertion loss on the port of the RF coupler to be decreased.

In accordance with some embodiments, a termination impedance circuit can be shared by an isolated port and a coupled port of a bi-directional coupler. This can reduce the area relative to having separate termination impedance circuits for the isolated port and the coupled port. Only one of the isolated port or the coupled port can be provided with a termination impedance at a time to provide an indication of RF power. Accordingly, a switch circuit can selectively electrically connect the termination impedance circuit to the isolated port and selectively electrically connect the termination impedance circuit to the coupled port such that no more than one of the isolated port or the coupled port is electrically connected to the termination impedance circuit at a time. To electrically isolate the coupled port and the isolated port, the switch circuit can include high isolation switches. Each of the high isolation switches can include a series-shunt-series circuitry topology, for example. The isolation between the coupled port and the isolated port provided by the high isolation switches can be greater than a target directivity.

An effective length of a coupled line can be a length of the coupled line that contributes to the coupling factor of the RF coupler. For instance, the effective length of the coupled line can be a length of the coupled line in an electrical path between a termination impedance and a port of an RF coupler configured to provide an indication of power traveling between a power input port and a power output port. Adjusting the effective length of the coupled line can adjust a coupling factor of the radio frequency coupler. Accordingly, a radio frequency coupler with an adjustable effective length of the coupled line can have a desired coupling factor. At the same time, the insertion loss of the main line should not be increased. In certain embodiments, the radio frequency coupler can have a coupled line that includes multiple sections and one or more switches to selectively electrically couple one section of the coupled line to a port, such as the coupled port, of the radio frequency coupler. For instance, a switch can be in series between two sections of the coupled line and the switch can either electrically couple or decouple two sections of the coupled line from each other. A switch network can selectively electrically couple a selected termination impedance to a particular section of the coupled line depending on the state of the radio frequency coupler. The switch network can optimize directivity of the radio frequency coupler. The switch network can present a termination impedance to the coupled port of the radio frequency coupler in one state and present a termination impedance to the isolated port of the radio frequency coupler in another state. Any of the principles and advantages of the termination impedance circuits discussed herein can be applied in connection with a coupled line having an effective length configured to be adjusted.

The radio frequency couplers discussed herein can have a decoupled state in which the coupled line is decoupled from a main line. The decoupled state can provide a minimal insertion loss in a main signal line when the radio frequency coupler is unused.

Embodiments discussed herein can advantageously provide an improved directivity for a radio frequency coupler by providing a termination impedance that is selected for particular operating conditions, such as a particular frequency band of a radio frequency signal provided to the radio frequency coupler. Alternatively or additionally, embodiments discussed herein can provide improved main line insertion loss by adjusting an effective length of the coupled line to adjust coupling factor. This can avoid over coupling and subsequent attenuation. By adjusting the effective length of the coupled line, a desired coupling factor of the radio frequency coupler can be set. In certain embodiments, the radio frequency couplers discussed herein have a decoupled state that can minimize loss due to coupling effects when the radio frequency coupler is unused.

FIG. 1 is a schematic block diagram in which a radio frequency coupler is configured to extract a portion of power of a radio frequency signal traveling between a power amplifier and an antenna. As illustrated, a power amplifier 10 receives an RF signal and provides an amplified RF signal to an antenna 30 by way of an RF coupler 20. It will be understood that additional elements (not illustrated) can be included in the electronic system of FIG. 1 and/or a subcombination of the illustrated elements can be implemented.

The power amplifier 10 can amplify an RF signal. The power amplifier 10 can be any suitable RF power amplifier. For instance, the power amplifier 10 can be one or more of a single stage power amplifier, a multi-stage power amplifier, a power amplifier implemented by one or more bipolar transistors, or a power amplifier implemented by one or more field effect transistors. The power amplifier 10 can be implemented on a GaAs die, CMOS die, or a SiGe die, for example.

The RF coupler 20 can extract a portion of the power of the amplified RF signal traveling between the power amplifier 10 and the antenna 30. The RF coupler 20 can generate an indication of forward RF power traveling from the power amplifier 10 to the antenna 30 and/or generate an indication of reflected RF power traveling from the antenna 30 to the power amplifier 10. An indication of power can be provided to an RF power detector (not illustrated). The RF coupler 20 can have four ports: a power input port, a power output port, a coupled port, and an isolated port. In the configuration of FIG. 1, the power input port can receive the amplifier RF signal from the power amplifier 10 and the power output port can provide the amplified RF signal to the antenna 30. A termination impedance can be provided to either the isolated port or to the coupled port. In a bi-directional RF coupler, a termination impedance can be provided to the isolated port in one state and a termination impedance can be provided to the coupled port in another state. When a termination impedance is provided to the isolated port, the coupled port can provide a portion of the power of RF signal traveling from the power input port to the power output port. Accordingly, the coupled port can provide an indication of forward RF power. When a termination impedance is provided to the coupled port, the isolated port can provide a portion of the power of RF signal traveling from the power output port to the power input port. Accordingly, the isolated port can provide an indication of reverse RF power. The reverse RF power can be RF power reflected from the antenna 30 back to the RF coupler 20.

The antenna 30 can transmit the amplified RF signal. For instance, when the electronic system illustrated in FIG. 1 is included in a cellular phone, the antenna 30 can transmit an RF signal from the cellular phone to a base station.

Figure 2:
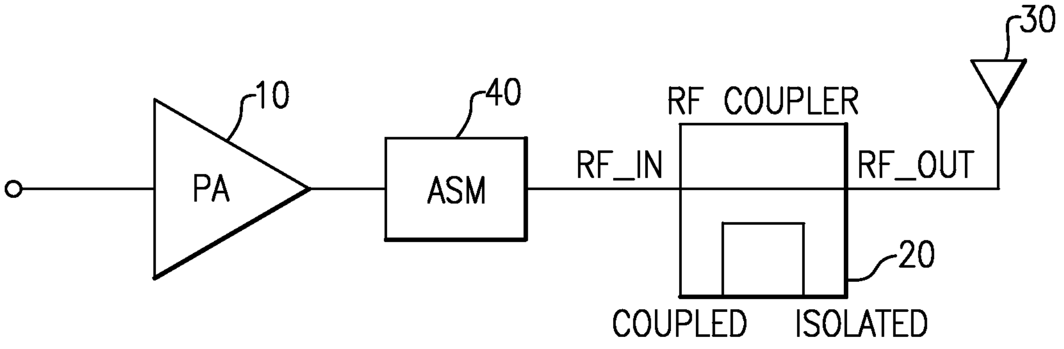
FIG. 2 is a schematic block diagram in which a radio frequency coupler is configured to extract a portion of power of a radio frequency signal traveling between an antenna switch module and an antenna.

FIG. 2 is a schematic block diagram in which a radio frequency coupler is configured to extract a portion of power of a radio frequency signal traveling between an antenna switch module and an antenna. The system of FIG. 2 is like the system of FIG. 1, except that an antenna switch module 40 is included in a signal path between the power amplifier 10 and the RF coupler 20. The antenna switch module 40 can selectively electrically connect the antenna 30 to a selected transmit path. The antenna switch module 40 can provide a number of switching functionalities. The antenna switch module 40 can include a multi-throw switch configured to provide functionalities associated with, for example, switching between transmission paths associated with different frequency bands, switching between transmission paths associated with different modes of operation, switching between transmission and/or receiving modes, or any combination thereof. It will be understood that additional elements (not illustrated) can be included in the electronic system of FIG. 2 and/or a subcombination of the illustrated elements can be implemented. In another implementation (not illustrated), an RF coupler can be included in a signal path between a power amplifier and an antenna switch module.

Figure 3B:
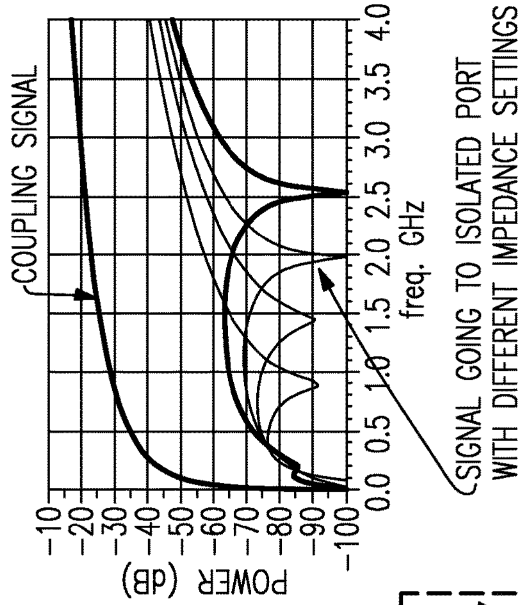
FIG. 3B is a graph illustrating a coupling signal at a coupled port and a signal at an isolated port for different termination impedance settings of the radio frequency coupler illustrated in FIG. 3A.
Figure 3C:
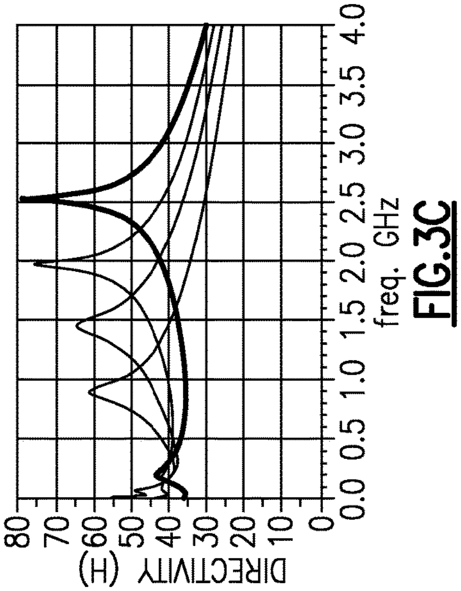
FIG. 3C is a graph illustrating a relationship of directivity over frequency for different termination impedance settings of the radio frequency coupler illustrated in FIG. 3A.
Figure 3A:
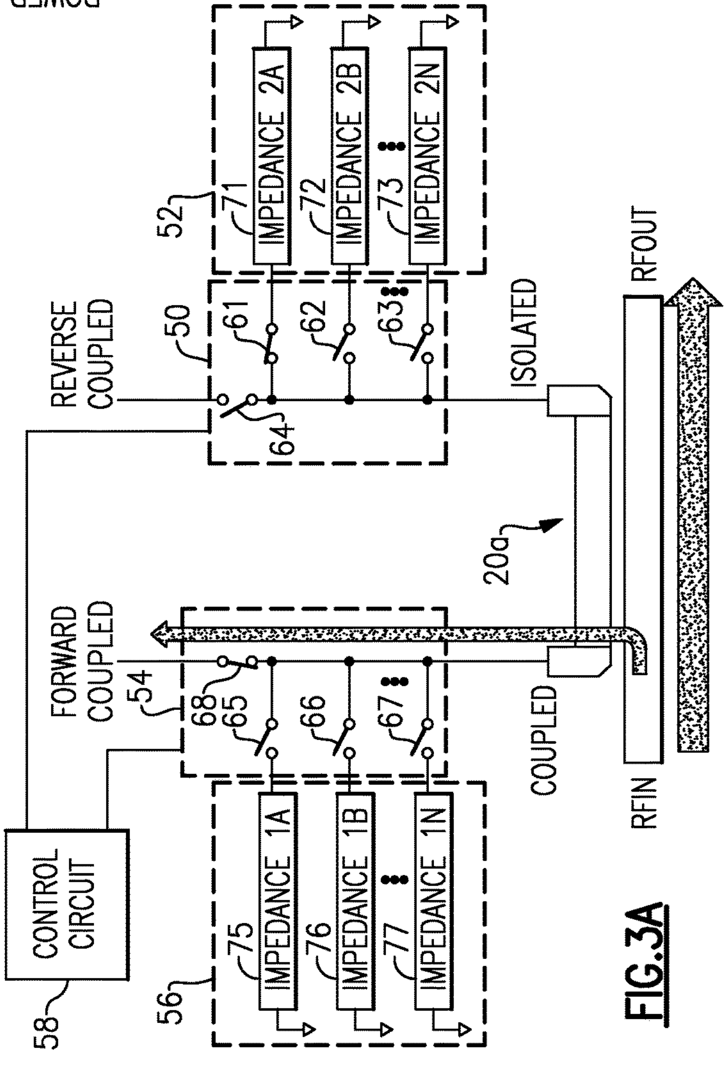
FIG. 3A is a schematic diagram of an electronic system that includes a radio frequency coupler and an adjustable termination impedance circuit according to an embodiment.

Referring to FIG. 3A, an electronic system that includes a radio frequency coupler 20*a* and an adjustable termination impedance circuit according to an embodiment will be described. When the electronic system is in the state illustrated in FIG. 3A, a portion of RF power traveling from the power input port to the power output port is being provided to the coupled port. The portion of RF power provided to the coupled port of the RF coupler 20*a* in FIG. 3A is representative of forward RF power. An indication of the forward RF power at the coupled port of the RF coupler 20*a* can be indicative of power of a signal generated by a power amplifier provided to an antenna, for example. FIG. 3A illustrates an electronic system that includes an RF coupler 20*a*, a first switch network 50, first termination impedance elements 52, a second switch network 54, second termination impedance elements 56, and a control circuit 58. The electronic system of FIG. 3A can include more elements than illustrated and/or a subcombination of the illustrated elements can be implemented.

The RF coupler 20*a* is an example of the RF coupler 20 of FIGS. 1 and 2. The RF coupler 20*a* can include two parallel or overlapped transmission lines, such as microstrips, strip lines, coplanar lines, etc. In some embodiments, the RF coupler 20*a* can include two inductors, such as two transformers, in place of the two transmission lines. The two transmission lines or inductors can implement a main line and a coupled line. The main line can provide the majority of the signal from the RF power input to the RF power output. The coupled line can be used to extract a portion of the power traveling between the RF power input and the RF power output.

In FIG. 3A, the first switch network 50 and the first termination impedance elements 52 can together implement a first adjustable termination impedance circuit. The first adjustable termination impedance circuit can provide a selected termination impedance to the isolated port of the RF coupler 20*a*. The second switch network 54 and the second termination impedance elements 56 can together implement a second adjustable termination impedance circuit. The second adjustable termination impedance circuit can provide a selected termination impedance to the coupled port of the RF coupler 20*a* as will be discussed in more detail with reference to FIG. 4. While the first adjustable termination impedance circuit and the second adjustable termination impedance circuit of FIG. 3A each includes switches and termination impedances electrically connected to respective switches, the first adjustable termination impedance circuit and/or the second adjustable termination impedance circuit can be implemented by any suitable adjustable termination impedance circuit.

The isolated port of the RF coupler 20*a* can be electrically connected to one or more switches to adjust the termination impedance provided to the isolated port. As illustrated, the first switch network 50 includes impedance select switches 61, 62, and 63 to selectively electrically couple termination impedances 71, 72, and 73, respectively, of the first termination impedance elements 52 to the isolated port of the RF coupler 20*a*. The illustrated first switch network 50 also includes a mode select switch 64 that can selectively provide a reverse coupled output from the RF coupler 20*a* when the RF coupler 20*a* is being used to provide an indication of reverse RF power.

Each of the switches of the first switch network 50 can electrically couple nodes when on and electrically isolate nodes when off. The first switch network 50 can include any suitable switches to implement the impedance select switches 61, 62, and 63 and the mode select switch 64. For example, each of the illustrated switches in the first switching network 50 can include a semiconductor field effect transistor (FET). Such a FET can be biased in the linear mode, for example. When the FET is on, the FET can be in a short circuit or low loss mode that electrically connects a source and a drain of the FET. When the FET is off, the FET can be in an open circuit or high loss mode that electrically isolates the source and the drain of the FET. Other suitable switches can alternatively or additionally be implemented. Moreover, while three impedance select switches 61, 62, and 63 are illustrated in FIG. 3A, any suitable number of impedance selected switches can be implemented. In some instances, only one impedance select switch may be implemented. In some other instances, two impedance selected switches can be implemented or more than three impedance select switches can be implemented.

The impedance select switches 61, 62, and 63 and the termination impedances 71, 72, and 73 can be used to achieve a desired directivity of the RF coupler 20*a*. For example, different termination impedances can be selectively electrically coupled to the isolated port when the RF signal to the RF coupler 20*a* is within corresponding different frequency bands. As an illustrative example, a first termination impedance 71 can be electrically coupled to the isolated port for a first frequency band, a second termination impedance 72 can be electrically coupled to the isolated port for a second frequency band, and a third termination impedance 73 can be electrically coupled to the isolated port for a third frequency band.

Table 1 below summarizes states of the impedance select switches 61, 62, and 63 and the corresponding termination impedance for various frequency bands according to an embodiment. As shown in FIG. 3A, the first impedance select switch 61 can electrically connect the first termination impedance 71 to the isolated port of the RF coupler 20*a*. This can optimize the directivity for a particular frequency band.

TABLE 1

Forward Power States

| Frequency Band | Termination Impedance | S 61 | S 62 | S 63 |
|---|---|---|---|---|
| A | 2A | On | Off | Off |
| B | 2B | Off | On | Off |
| C | 2C | Off | Off | On |

The impedance select switches 61, 62, and 63 can be controlled so as to provide any suitable combination of termination impedances 71, 72, and/or 73 to the isolated port of the RF coupler 20*a*. For example, the impedance select switches 61, 62, and 63 can be configured into any combination or subcombination of the states shown in Table 2 below. Moreover, the principles and advantages discussed herein can be applied to any suitable number of impedance select switches and corresponding termination impedances.

TABLE 2

| Forward Power States | | | | |
|---|---|---|---|---|
| Frequency Band | Termination Impedance | S 61 | S 62 | S 63 |
| A | 2A | On | Off | Off |
| B | 2B | Off | On | Off |
| C | 2C | Off | Off | On |
| D | 2A + 2B | On | On | Off |
| E | 2A + 2C | On | Off | On |
| F | 2B + 2C | Off | On | On |
| G | 2A + 2B + 2C | On | On | On |

Alternatively or additionally, a particular termination impedance or combination of termination impedances can be selected for a particular power mode of operation. Having a particular impedance for a particular power mode and/or frequency band can improve the directivity of the RF coupler 20*a*, which can aid in improving, for example, the accuracy of power measurements associated with the RF coupler 20*a*. A particular termination impedance or combination of termination impedances can be selected for any suitable application parameter(s) and/or any suitable indication of operating condition(s).

The first termination impedance elements 52 of FIG. 3A include a termination impedance electrically connected to each impedance select switch of the first switching network. The termination impedances 71, 72, and 73 can be, for example, resistive, capacitive, and/or inductive loads selected to achieve a desired termination impedance. Such a desired termination impedance can be selected for a particular frequency band and/or power mode. One or more of the termination impedances can be a passive impedance element electrically coupled between a mode select switch and a ground potential. For example, a termination impedance can be implemented by a resistor electrically coupled between an impedance select switch and ground. One or more termination impedances can include any suitable combination of series and/or parallel passive impedance elements. For instance, a termination impedance can be implemented by a capacitor and a resistor in series between an impedance select switch and a ground potential. More detail regarding example termination impedance elements will be provided in connection with FIGS. 6A and 6B.

The control circuit 58 can control the impedance select switches 61, 62, and 63 such that a desired terminating impedance is provided to the isolated port of the RF coupler 20*a* when the electronic system is in a state to provide an indication of forward RF power. The control circuitry 58 can include any suitable circuitry for selectively opening and closing one or more of the impedance select switches 61, 62, 63 to achieve the desired termination impedance at the isolated terminal. For example, the control circuit 58 can configure the impedance select switches 61, 62, and 63 into any of the states illustrated in Table 1 and/or Table 2.

The control circuit 58 can receive a first signal indicative of whether to measure forward power or reverse power and a second signal indicative of a mode of operation, such as a band select signal. From the received signals, the control circuit 58 can control the first switch network 50 to provide a selected termination impedance to isolated port of the RF coupler 20*a*. The selected termination impedance can be implemented by any suitable combination of the termination impedances 71, 72, 73. From the received signals, the control circuit 58 can control the second switch network 54 to provide a selected termination impedance to the coupled port of the RF coupler 20*a* for measuring reverse power. The control circuit 58 can control the mode select switches 64 and 68 based on the state of the first signal.

Figure 4:
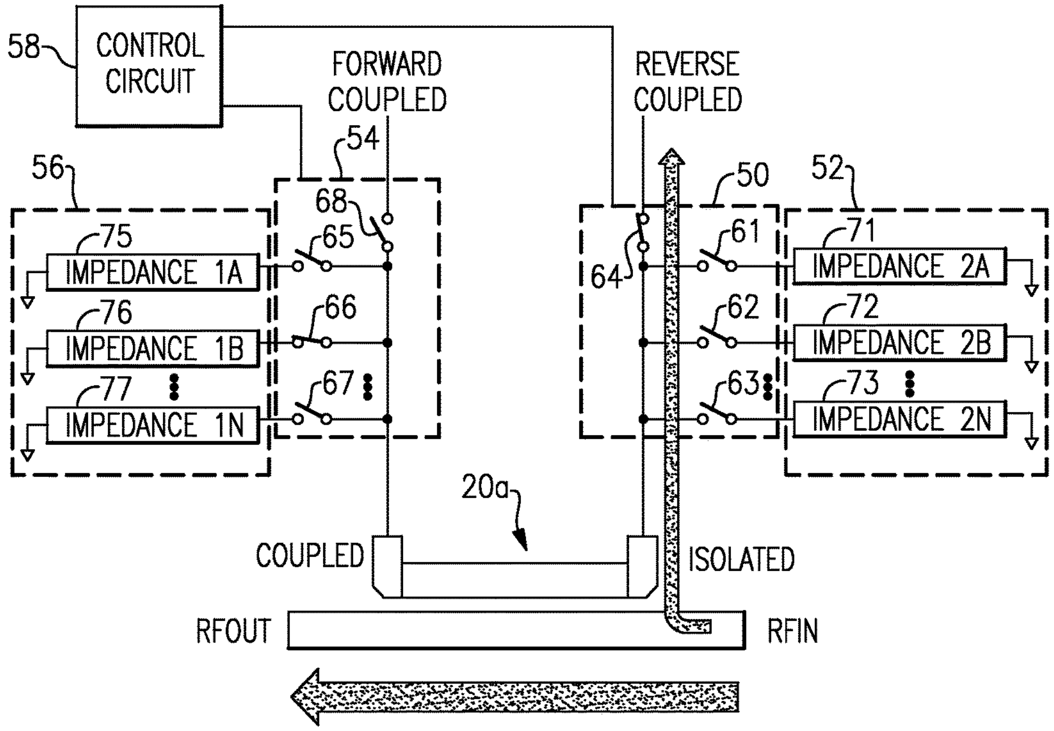
FIG. 4 is a schematic diagram illustrating the electronic system of FIG. 3A configured in a different state than in FIG. 3A.

In some states, such as the states illustrated in FIGS. 4 and 5, the control circuit 58 can decouple the isolated port from all termination impedances of the first termination impedance elements 52.

When the electronic system is in the state illustrated in FIG. 3A, the control circuit 58 controls the switch network 50 to electrically connect the first terminating impedance 71 to the isolated port of the RF coupler 20*a* by way of the first impedance select switch 61 while electrically isolating the other terminating impedances from the isolated port using the other impedance select switches 62 and 63. The control circuit 58 can include digital logic, such as a decoder, for operating the impedance select switches 61, 62, 63. The digital logic can operate on any suitable power supply, including, for example, an output voltage of a charge pump or a battery voltage. The control circuit 58 can also control the mode select switch 64 of the first switch network 50 such that the isolated port is decoupled from a reflected power output in the state illustrated in FIG. 3A. When operating in the state illustrated in FIG. 3A, the control circuit 58 provides input signals to the second switch network 54 such that the mode select switch 68 electrically connects the coupled port to a forward power output and the impedance select switches 65, 66, and 67 electrically isolate the coupled port from the terminating impedances 75, 76, and 77, respectively.

FIG. 3B is a graph illustrating a coupling signal at a coupled port and a signal at an isolated port for the RF coupler 20*a* arranged as illustrated in FIG. 3A. FIG. 3B shows that different termination impedances provided to the isolated port of the RF coupler 20*a* can optimize a minimum amount of signal at the isolated port at corresponding different frequencies.

FIG. 3C is a graph illustrating a relationship of directivity over frequency corresponding to the curves shown in FIG. 3B. Directivity can represent a measure of a power of the coupling signal minus a measure of a power of the signal at the isolated port. Higher directivities can be more desirable. As shown in FIG. 3C, directivity can be optimized at selected frequencies by providing particular termination impedances to the isolated port of the RF coupler 20*a*.

FIG. 4 is a schematic diagram illustrating the electronic system of FIG. 3A configured in a different state than in FIG. 3A in which a portion of power of a radio frequency signal traveling in an opposite direction is extracted. Instead of providing an indication of forward power at a forward coupled output as shown in FIG. 3A, the electronic system can provide an indication of reverse power at a reverse coupled output as shown in FIG. 4. Accordingly, the RF coupler 20*a* can be used to detect reverse power, such as power reflected back from the antenna 30 in FIG. 1 and/or FIG. 2. To provide an indication of reverse power, a termination impedance can be provided to the coupled port of the RF coupler 20*a*. Having switch networks coupled to the coupled port and the isolated port of the RF coupler 20*a* can enable the RF coupler 20*a* to be bi-directional.

The second switch network 54 can electrically couple a selected termination impedance of the second termination impedance elements 56 to the coupled port of the RF coupler 20*a*. The second switch network 54 can also selectively couple/decouple the coupled port to/from the forward coupled output. Any combination of features of the first switch network 50 described with reference to the isolated port of the RF coupler 20*a* can be implemented by the second switch network 54 in connection with the coupled port of the RF coupler 20*a*.

The impedance select switches 65, 66, and 67 can be controlled to be in a selected state corresponding to a respective operating mode. In the state shown in FIG. 4, the impedance select switch 66 electrically connects the termination impedance 76 to the coupled port of the RF coupler 20*a* and the other impedance select switches 65 and 67 of the second switch network 54 electrically isolate respective termination impedances 75 and 77 from the coupled port of the RF coupler 20*a*. Table 3 below summarizes states of the impedance select switches 65, 66, and 67 for various frequency bands according to an embodiment.

TABLE 3

| Reverse Power States | | | |
|---|---|---|---|
| Frequency Band | S 65 | S 66 | S 67 |
| A | On | Off | Off |
| B | Off | On | Off |
| C | Off | Off | On |

The impedance select switches 65, 66, and 67 can be controlled so as to provide any suitable combination of termination impedances 75, 76, and/or 77 to the coupled port of the RF coupler 20*a*. For example, the impedance select switches 65, 66, and 67 can be configured into any combination or subcombination of the states shown in Table 4 below. Moreover, the principles and advantages discussed herein can be applied to any suitable number of impedance select switches and corresponding termination impedances.

TABLE 4

| Reverse Power States | | | |
|---|---|---|---|
| Frequency Band | S 65 | S 66 | S 67 |
| A | On | Off | Off |
| B | Off | On | Off |
| C | Off | Off | On |
| D | On | On | Off |
| E | On | Off | On |
| F | Off | On | On |
| G | On | On | On |

Any combination of features of the first termination impedance elements 52 described in connection with the isolated port can be implemented by the second termination impedance elements 56 in connection to the coupled port. In some embodiments, the second termination impedance elements 56 include different termination impedances than the first termination impedance elements 52. According to some other embodiments, the second termination impedance elements 56 include substantially the same termination impedances as the first termination impedance elements 52. In certain embodiments, such as the embodiment of FIG. 19A discussed below, one or more termination impedances can be electrically coupleable to the isolated port and also electrically coupleable to the coupled port.

As illustrated in FIG. 4, an impedance select switch 66 electrically connects a termination impedance 76 to the coupled port of the RF coupler 20*a*. This can set a desired directivity for providing an indication of reverse power for a particular frequency band. As also illustrated in FIG. 4, a mode select switch 68 of the second switch network 54 can electrically isolate the coupled port from the forward coupled output and the mode select switch 64 of the first switch network 50 can electrically connect the isolated port to the reverse coupled output. The control circuit 58 can change states of the switches in the first switch network 50 and the second switch network 54 to adjust the state of the electronic system from the state shown in FIG. 3A to the state shown in FIG. 4.

FIG. 5 is a schematic diagram illustrating the electronic system of 3A configured in a different state than in FIG. 3A. In FIG. 5, the coupled line of the RF coupler 20*a* is decoupled from the main line of the RF coupler 20*a*. Instead of providing an indication of forward power at a forward coupled output as shown in FIG. 3A or providing an indication of reverse power at a reverse coupled output as shown in FIG. 4, the electronic system can be configured in a decoupled state as shown in FIG. 5. The decoupled state is a low insertion loss mode. In the decoupled state, the coupled line of the RF coupler 20*a* is decoupled from the main line of the RF coupler 20*a* in FIG. 5. Accordingly, coupling loss from the RF coupler 20*a* can be significantly reduced or eliminated in the decoupled state. The insertion loss from the main line of the RF coupler 20*a* should still be present, however.

The coupled port and the isolated port of the RF coupler can both be electrically isolated from termination impedance elements in the decoupled state. As illustrated in FIG. 5, the impedance select switches 61, 62, 63 of the first switch network 50 can decouple the isolated port from the first termination impedance elements 52 and the impedance select switches 65, 66, 67 of the second switch network 54 can decouple the coupled port from the second termination impedance elements 56 in the decoupled state. As also illustrated in FIG. 5, the mode select switch 64 in the first switch network 50 can decouple the isolated port from the reverse coupled output and the mode select switch 68 of the second switch network 54 can decouple the coupled port from the forward coupled output in the decoupled state. The control circuit 58 can change states of the switches in the first switch network 50 and the second switch network 54 to decouple the coupled line from the main line in the decoupled state shown in FIG. 5.

FIGS. 6A and 6B are schematic diagrams of example termination impedance elements that can implement the functionality of the first termination impedance elements 52 and/or the second termination impedance elements 56 of FIGS. 3A, 4, and 5. A termination impedance can provide an impedance matching function in the RF coupler to increase power transfer and reduce signal reflection. The termination impedance can be provided between a port of the RF coupler, such as one of a coupled port or an isolated port, and a reference potential, such as ground. The termination impedance can be implemented by any suitable passive impedance element or any suitable series and/or parallel combination of passive impedance elements.

As shown in FIG. 6A, termination impedance elements can be implemented by an adjustable resistance circuit, an adjustable capacitance circuit, and an adjustable inductance circuit. Switches of a switch network can selectively electrically couple these elements to the coupled terminal and/or the isolated terminal of an RF coupler. Adjusting the impedance of one or more of the adjustable resistance circuit, the adjustable capacitance circuit, or the adjustable inductance circuit can achieve a desired directivity of an RF coupler. In some other embodiments, one or two of the adjustable resistance circuit, the adjustable capacitance circuit, or the adjustable inductance circuit can be implemented instead of all three.

FIG. 6B is a schematic diagram illustrating that the first termination impedance elements 52 and/or the second termination impedance elements 56 of FIGS. 3A, 4, and 5 can include a plurality of resistors that are electrically coupled to switches of a switch network. Each of the resistors can have a resistance selected to optimize a directivity of an RF coupler for a particular frequency band. Alternatively or additionally, a combination of resistances of these resistors can optimize directivity of an RF coupler for a particular frequency band.

As discussed above, traditional RF couplers have had a varied coupling factor due to a frequency dependency of the coupled line/main line (e.g., transmission line or inductor) of the RF coupler. To adjust coupling factor of an RF coupler over frequency to compensate for the frequency dependency of the coupled line/main line, an RF coupler with a multi-section coupled line is disclosed herein. Such an RF coupler can provide an adjustable coupling factor that can be adjusted as desired. For instance, such an RF coupler can implement a relatively flat coupling factor over frequency.

Referring to FIGS. 7A to 10C, different states of an electronic system including an RF coupler 20*b* having a multi-section coupled line according to an embodiment and associated graphs will be described. The RF coupler 20*b* is another example implementation of the RF coupler 20 of FIGS. 1 and/or 2. A control circuit, similar to the control circuit 58 of FIGS. 3A, 4, and 5, can control the RF coupler 20*b* and a switch network to bring the electronic system into the states illustrated in FIG. 7A, 8A, 9A, or 10A.

Figure 7A:
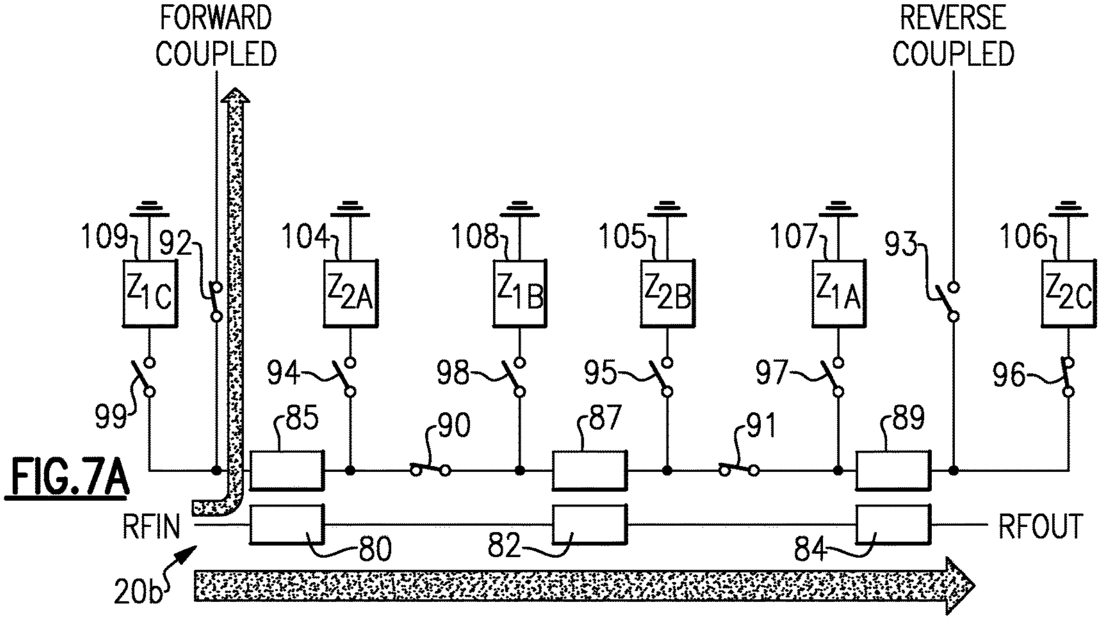
FIG. 7A is a schematic diagram of a radio frequency coupler having a coupled line with an adjustable length electrically connected to a coupled port according to an embodiment.

FIG. 7A is a schematic diagram of an RF coupler 20*b* having a coupled line with an adjustable length electrically connected to a coupled port according to an embodiment. The RF coupler 20*b* can be implemented in the electronic systems of FIG. 1 and/or FIG. 2, for example. The electronic system of FIG. 7A includes the RF coupler 20*b*, a switch network including switches 92 to 99, and a termination impedance circuit including termination impedances 104 to 109. In one embodiment, each of the termination impedances 104 to 109 can be implemented by a terminating resistor.

As illustrated in FIG. 7A, the RF coupler 20*b* has a multi-section main line and a multi-section coupled line. Sections of the main line and the coupled line can be implemented by conductive lines (e.g., microstrips, strip lines, coplanar lines, etc.) and/or inductors. As illustrated, the main line includes sections 80, 82, and 84 and the coupled line includes sections 85, 87, and 89. Although the embodiment of FIG. 7A with a three section coupled line is described for illustrative purposes, the principles and advantages discussed herein can be applied to a two section coupled line and/or to a coupled line with more than three sections. The RF coupler 20*b* shown in FIG. 7A also includes coupling factor switches 90 and 91 disposed between sections of the coupled line.

The coupling factor of the RF coupler 20*b* can be adjusted by adjusting the number of sections of the coupled line that are electrically connected to a port of the RF coupler 20*b* that provides an indication of RF power of a signal traveling between the power input port and the power output port of the RF coupler 20*b*. For example, the coupling factor can be adjusted by electrically connecting a different number of sections 85, 87, 89 of the multi-section coupled line to the coupled port. This can adjust the length of the coupled line electrically connected to the coupled port. Accordingly, the RF coupler 20*b* can provide multiple coupling factors for forward power measurements depending on how many sections 85, 87, 89 of the coupled line are electrically connected to the coupled port. With a longer length of the coupled line electrically connected between a port of the RF coupler 20*b* and a termination impedance, a higher coupling factor and higher insertion loss can be provided.

With the multi-section RF coupler 20*b*, the coupling factor can be controlled so as to achieve a relatively flat coupling factor over frequency. The RF coupler 20*b* can avoid over coupling and thereby prevent excess insertion loss on the main line. Preventing excess insertion loss can be particularly advantageous at relatively higher frequencies when coupling effects can be higher than desired, which can result in a relatively high insertion loss.

The coupling factor switches 90 and 91 can adjust the length of the coupled line between a termination impedance and a port of the RF coupler 20*b* configured to provide an indication of power traveling between a power input port and a power output port. An effective length of the coupled line electrically connected to the coupled port of the RF coupler 20*b* can be a length of the coupled line that contributes to the coupling factor of the RF coupler 20*b*. For instance, the effective length of the coupled line between the termination impedance and the coupled port of the RF coupler 20*b* can be the length of the section(s) of the coupled line that are electrically connected to the coupled port of the RF coupler 20*b*. A first coupling factor switch 90 is disposed between a first section 85 and a second section 87 of the coupled line in FIG. 7A. When the first coupling factor switch 90 is on, both the first section 85 and the second section 87 are electrically connected to the coupled port of the RF coupler 20*b*. When the first coupling factor switch 90 is off, the first coupling factor switch 90 provides electrical isolation between the first section 85 and the second section 87. A second coupling factor switch 91 is disposed between the second section 87 and a third section 89 of the coupled line in FIG. 7A. When the second coupling factor switch 91 is on, the second section 87 and the third section 89 are electrically connected to each other. When the second coupling factor switch 91 is off, the second coupling factor switch 91 provides electrical isolation between the second section 87 and the third section 89.

In the state illustrated in FIG. 7A, the first coupling factor switch 90 and the second coupling factor switch 91 are both on. In this state, the sections 85, 87, and 89 are all electrically connected to the coupled port of the RF coupler 20*b*. When all sections of the coupled line are electrically connected to the coupled port, the RF coupler 20*b* can provide a higher coupling effect and a higher insertion loss than when fewer than all of the sections of the coupled line are electrically coupled to the coupled port.

A termination impedance switch is electrically connected to each section of the coupled line in FIG. 7A. The termination impedance switch can selectively electrically connect a respective section of the coupled line to a corresponding termination impedance. The termination impedance switch electrically connected to the section of the coupled line farthest away from and electrically connected to a port of the RF coupler 20*b* configured to provide an indication of power can be turned on. As illustrated in FIG. 7A, a termination impedance switch 96 is turned on to electrically connect termination impedance 106 to the coupled line.

A first mode select switch 92 can selectively electrically couple the coupled port of the RF coupler 20*b* to the forward coupled output. In the state shown in FIG. 7A, the mode select switch 92 is on and the coupled port is electrically connected to the forward coupled output. A second mode select switch 93 can selectively electrically couple an isolated port of the RF coupler 20*b* to the reverse coupled output. In the state shown in FIG. 7A, the mode select switch 93 is off and the isolated port is electrically isolated from the reverse coupled output.

Figure 7B:
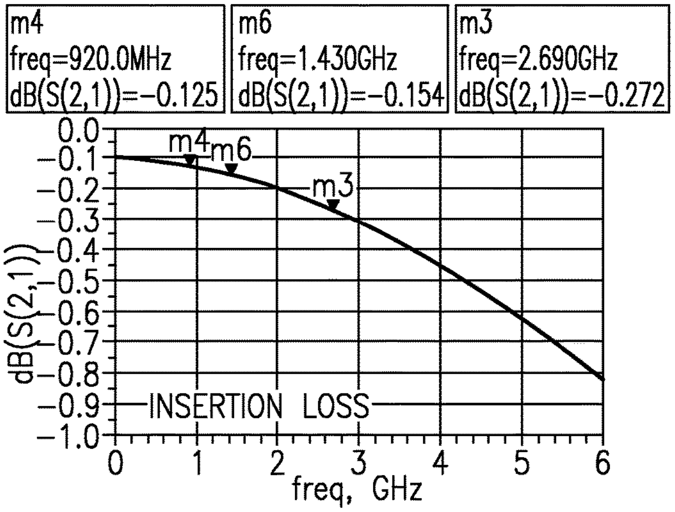
FIG. 7B is a graph illustrating an insertion loss curve for the radio frequency coupler shown in FIG. 7A.
Figure 7C:
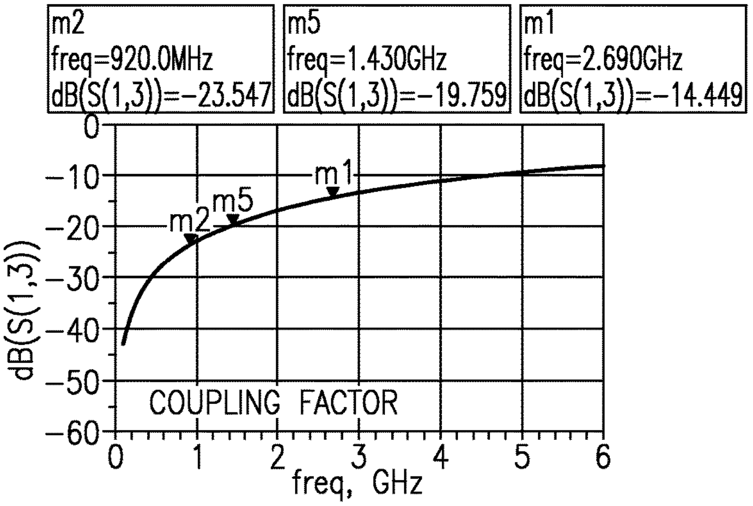
FIG. 7C is a graph illustrating a coupling factor curve for the radio frequency coupler shown in FIG. 7A.

FIG. 7B is a graph illustrating an insertion loss curve for the radio frequency coupler 20*b* in the state shown in FIG. 7A. FIG. 7C is a graph illustrating a coupling factor curve for the radio frequency coupler 20*b* in the state shown in FIG. 7A.

Figure 8A:
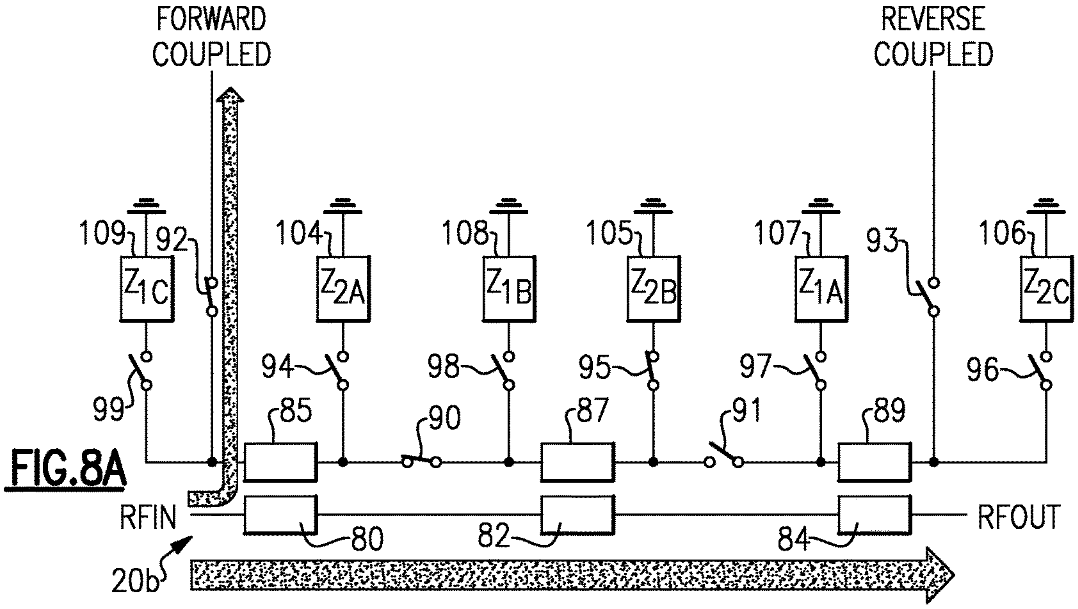
FIG. 8A is a schematic diagram of the radio frequency coupler of FIG. 7A configured in a second state in which two of three sections of the coupled line are electrically connected to the coupled port.

FIG. 8A is a schematic diagram of the system of FIG. 7A in which the radio frequency coupler 20*b* is configured in a second state. In the second state, two of three sections of the coupled line are electrically connected to the coupled port. The second state provides a lower coupling factor and a lower insertion loss than the first state. In the second state, the second coupling factor switch 91 is opened and the third section 89 is electrically isolated from the coupled port of the RF coupler 20*b*. This reduces the effective length of the coupled line that contributes to coupling with the main line relative to the first state shown in FIG. 7A. A different termination impedance switch is turned on in the second state shown in FIG. 8A relative to the first state shown in FIG. 7A. As illustrated in FIG. 8A, the termination impedance switch 95 is turned on and electrically connects the termination impedance 105 to the second section 87 of the coupled line.

Figure 8B:
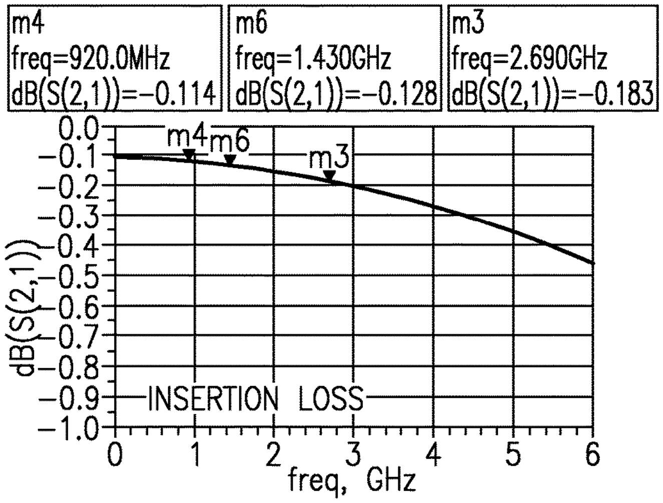
FIG. 8B is a graph illustrating an insertion loss curve for a radio frequency coupler in the state shown in FIG. 8A.
Figure 8C:
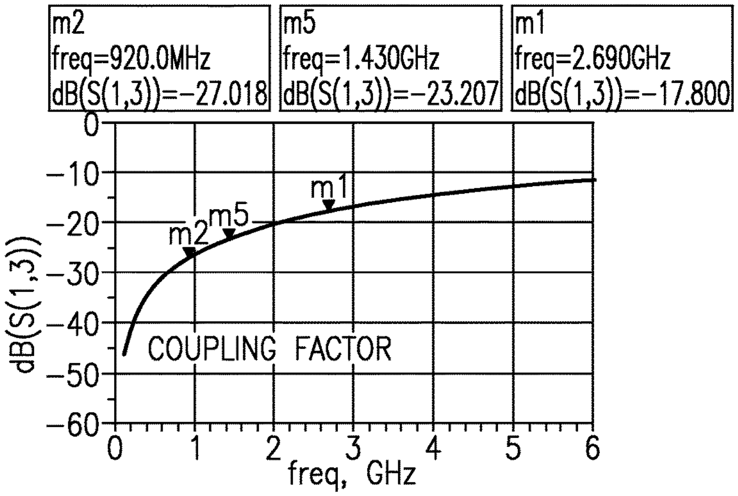
FIG. 8C is a graph illustrating a coupling factor curve for the radio frequency coupler in the state shown in FIG. 8A.

FIG. 8B is a graph illustrating an insertion loss curve for the radio frequency coupler 20*b* in the state shown in FIG. 8A. FIG. 8C is a graph illustrating a coupling factor curve for the radio frequency coupler 20*b* in the state shown in FIG. 8A. These graphs show that insertion loss and coupling factor are different than for the state shown in FIG. 7A.

Figure 9A:
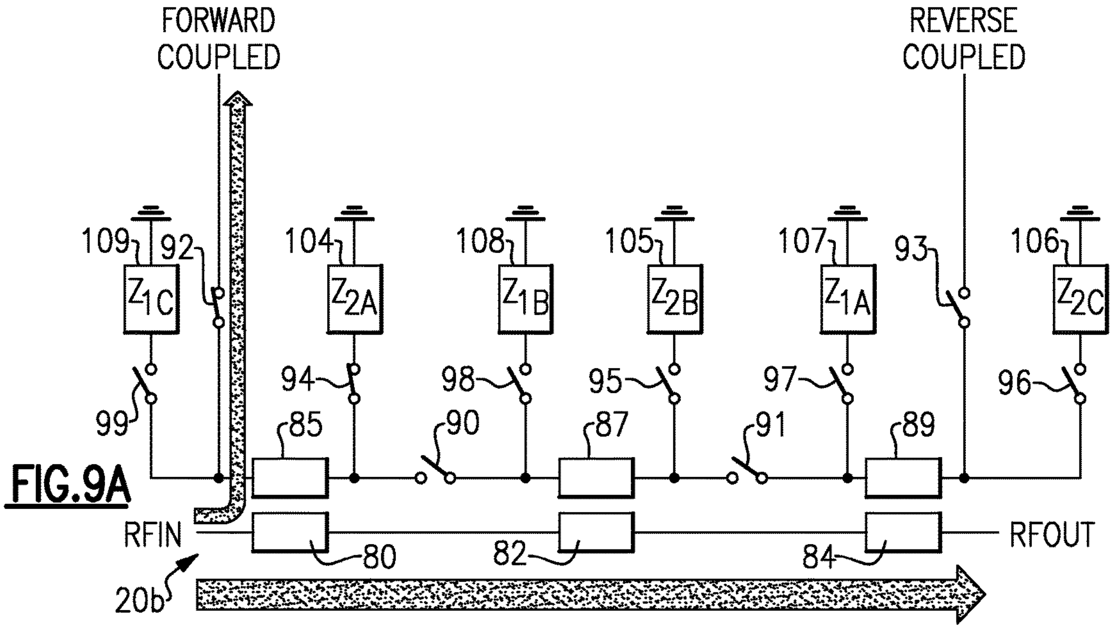
FIG. 9A is a schematic diagram of the radio frequency coupler of FIG. 7A configured in a third state in which one of three sections of the coupled line is electrically connected to the coupled port.

FIG. 9A is a schematic diagram of the electronic system of FIG. 7A in which the radio frequency coupler 20*b* is configured in a third state. In the third state, one of three sections of the coupled line is electrically connected to the coupled port. The third state provides a lower coupling factor and a lower insertion loss than the first state or the second state. In the third state, the first coupling factor switch 90 and the second coupling factor switch 91 are off and the second section 87 and the third section 89 of the coupled line are electrically isolated from the coupled port of the RF coupler 20*b*. A different termination impedance switch is turned on in the third state shown in FIG. 9A relative to the first state shown in FIG. 7A and the second state shown in FIG. 8A. As illustrated in FIG. 9A, the termination impedance switch 94 is on and electrically couples the termination impedance 104 to the first section 85 of the coupled line.

Figure 9B:
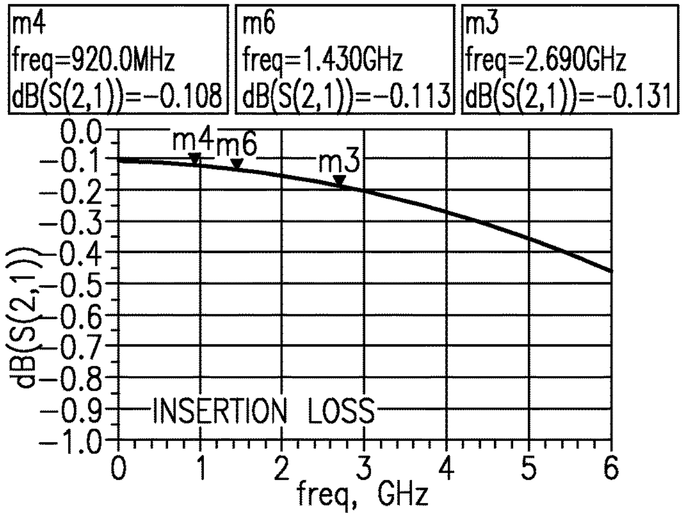
FIG. 9B is a graph illustrating an insertion loss curve for a radio frequency coupler in the state shown in FIG. 9A.
Figure 9C:
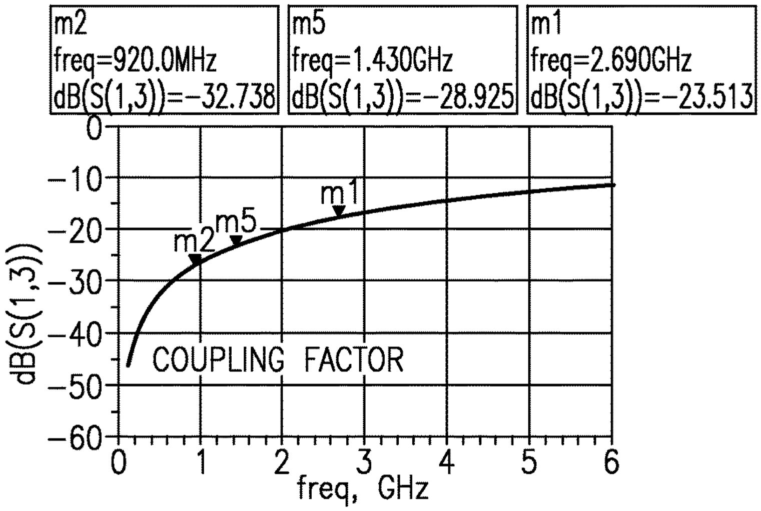
FIG. 9C is a graph illustrating a coupling factor curve for the radio frequency coupler in the state shown in FIG. 9A.

FIG. 9B is a graph illustrating an insertion loss curve for the radio frequency coupler in the state shown in FIG. 9A. FIG. 9C is a graph illustrating a coupling factor curve for the radio frequency coupler in the state shown in FIG. 9A. These graphs show that insertion loss and coupling factor are different than for the states shown in FIG. 7A and FIG. 8A.

Figure 10A:
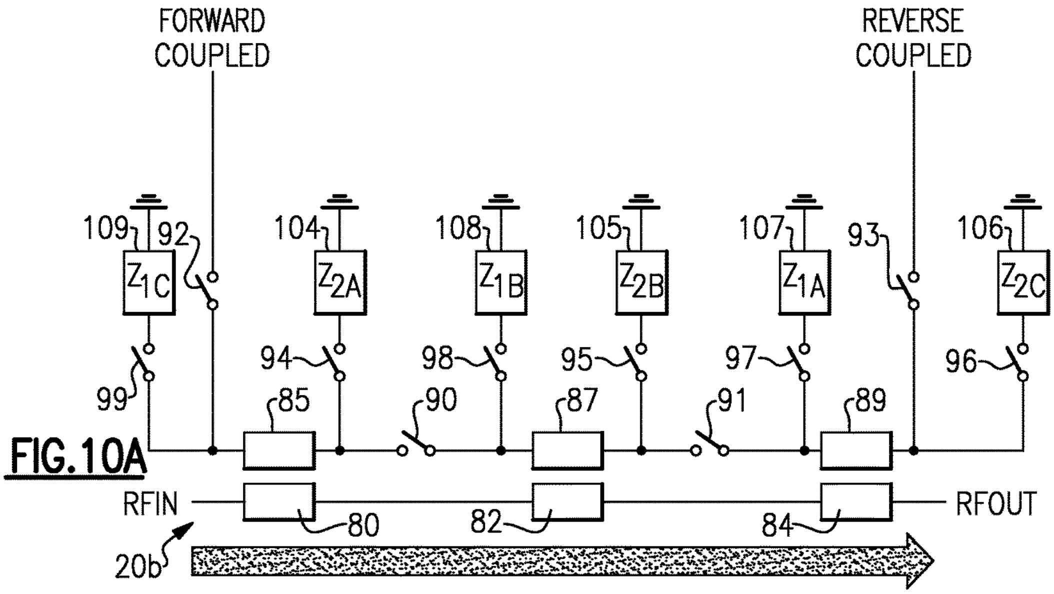
FIG. 10A is a schematic diagram of the radio frequency coupler of FIG. 7A configured in a fourth state in which the coupled line is decoupled from a main line.

FIG. 10A is a schematic diagram of the radio frequency coupler 20*b* of FIG. 7A configured in a fourth state in which the coupled line is decoupled from a main line. In the fourth state, coupling effects and insertion loss due to coupling can be removed from the main line. When the RF coupler 20*b* is not being used to measure forward RF power or reverse RF power, the system can be configured in the fourth state. The coupled line can be decoupled from the main line when the coupling factor switches 90 and 91 and the termination impedance switches 94, 95, 96, 97, 98, and 99 are off. In addition, the mode select switches 92 and 93 can be off in the fourth state.

Figure 10B:
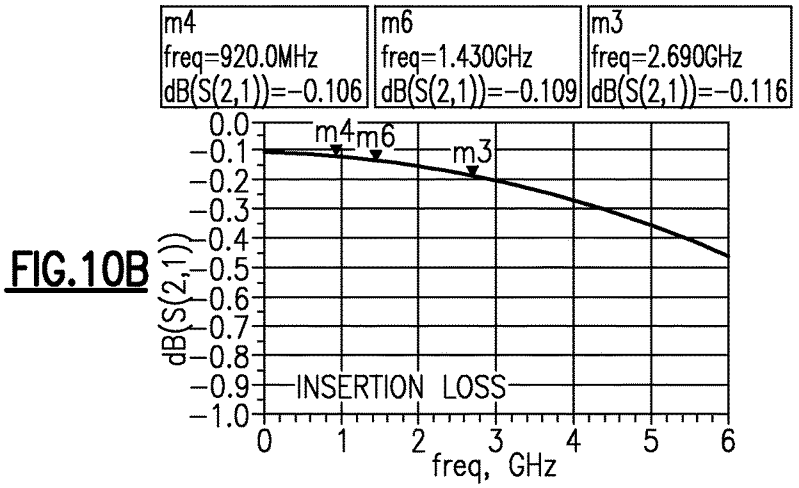
FIG. 10B is a graph illustrating an insertion loss curve for a radio frequency coupler in the state shown in FIG. 10A.
Figure 10C:
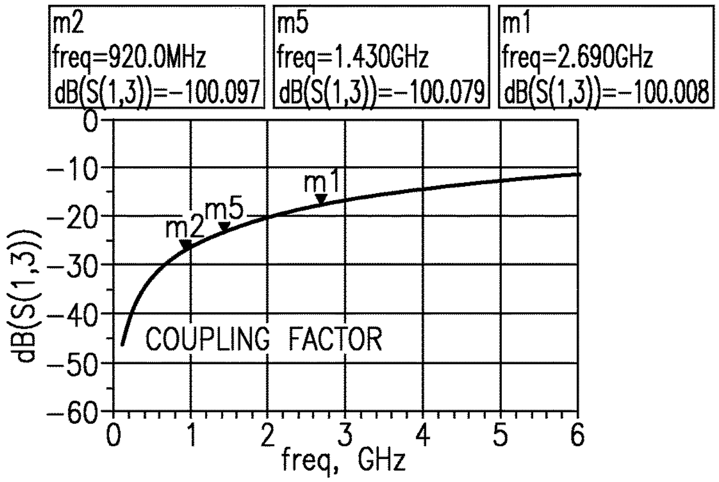
FIG. 10C is a graph illustrating a coupling factor curve for the radio frequency coupler in the state shown in FIG. 10A.

FIG. 10B is a graph illustrating an insertion loss curve for the radio frequency coupler 20*b* in the state shown in FIG. 10A. FIG. 10C is a graph illustrating a coupling factor curve for the radio frequency coupler 20*b* in the state shown in FIG. 10A. These graphs show that there is reduced insertion loss and coupling factor in the fourth state relative to the first, second, and third states.

The electronic system shown in FIGS. 7A, 8A, 9A, and 10A can be configured in states for providing an indication of reflected power. Accordingly, the RF coupler 20*b* can be bi-directional. Any suitable control circuit, such as a decoder, can turn switches on and/or off to implement such states. Table 5 below summarizes which of the illustrated switches are on and which of the illustrated switches are off in various states according to an embodiment. Table 6 below provides a brief description of these states. In some embodiments, additional states and/or a subcombination of these states can be implemented.

TABLE 5

States of Switches for States of 3-Section Coupler of FIG. 7A, 8A, 9A, 10A

| State | S 90 | S 91 | S 92 | S 93 | S 94 | S 95 | S 96 | S 97 | S 98 | S 99 |
|---|---|---|---|---|---|---|---|---|---|---|
| 1 | On | On | On | Off | Off | Off | On | Off | Off | Off |
| 2 | On | Off | On | Off | Off | On | Off | Off | Off | Off |
| 3 | Off | Off | On | Off | On | Off | Off | Off | Off | Off |
| 4 | Off | Off | Off | Off | Off | Off | Off | Off | Off | Off |
| 5 | On | On | Off | On | Off | Off | Off | Off | Off | On |
| 6 | Off | On | Off | On | Off | Off | Off | Off | On | Off |
| 7 | Off | Off | Off | On | Off | Off | Off | On | Off | Off |

TABLE 6

States and Descriptions for 3-Section Coupler of FIG. 7A, 8A, 9A, 10A

| State | Description |
|---|---|
| 1 | Forward Power, High Coupling Factor |
| 2 | Forward Power, Medium Coupling Factor |
| 3 | Forward Power, Low Coupling Factor |
| 4 | Decoupled |
| 5 | Reverse Power, High Coupling Factor |
| 6 | Reverse Power, Medium Coupling Factor |
| 7 | Reverse Power, Low Coupling Factor |

The multi-section coupler illustrated in FIGS. 7A, 8A, 9A, and 10A can adjust a coupling factor of the RF coupler (e.g., flatten coupling factor over frequency bands). This can improve insertion loss in certain states.

Figure 11A:
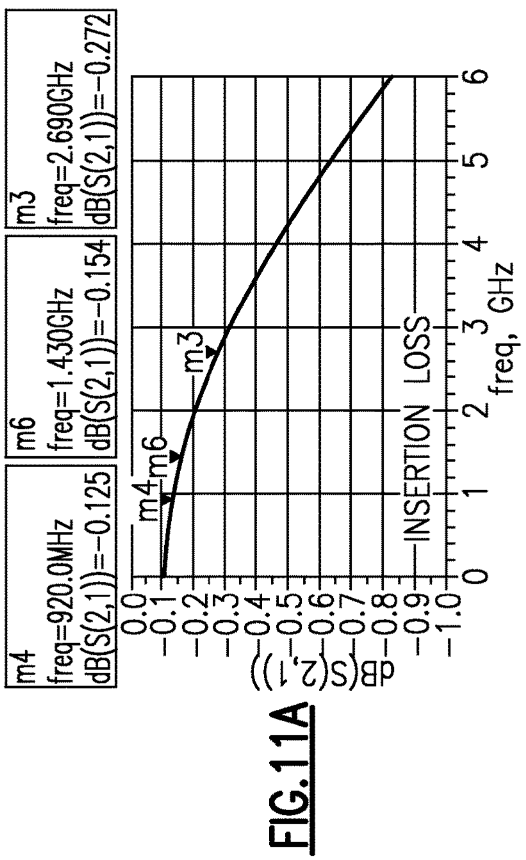
FIG. 11A is graph with a curve of insertion loss over frequency for an RF coupler having a continuous coupled line.
Figure 11B:
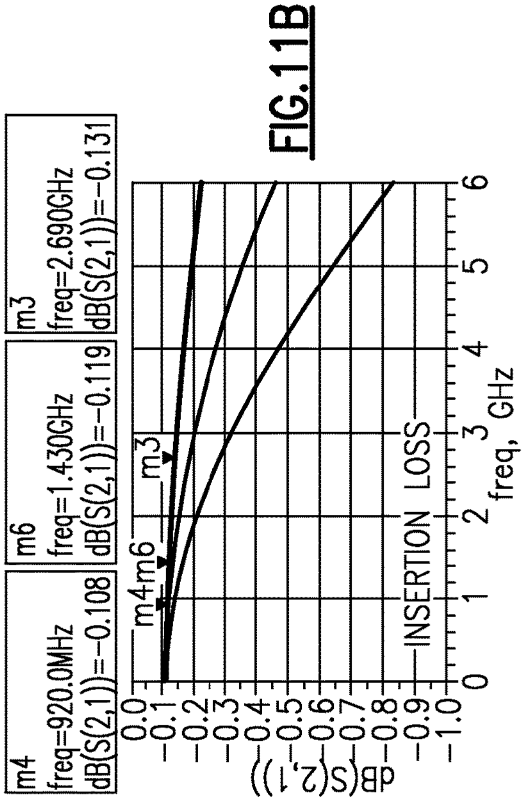
FIG. 11B is a graph with curves of insertion loss over frequency for an RF coupler having a multi-section coupled line.
Figure 12A:
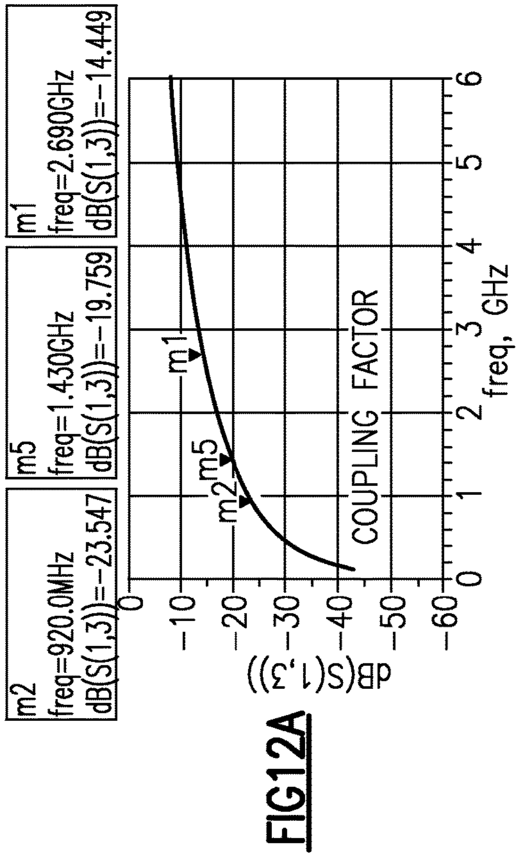
FIG. 12A is graph with a curve of coupling factor over frequency for an RF coupler having a continuous coupled line.
Figure 12B:
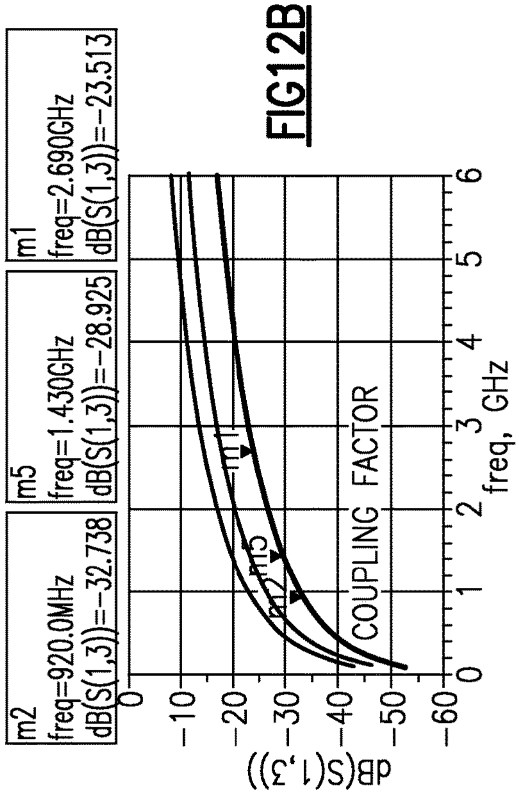
FIG. 12B is a graph with curves of coupling factor over frequency for an RF coupler having a multi-section coupled line.

FIG. 11A is graph with a curve of insertion loss over frequency for a single section coupler. FIG. 11B is a graph with curves of insertion loss over frequency for a multiple section coupler. FIG. 12A is graph with a curve of coupling factor over frequency for a single section coupler. FIG. 12B is a graph with curves of coupling factor over frequency for a multiple section coupler. Among other things, these graphs illustrate that coupling effects increase as frequency increases in a typical RF coupler, a multi-section RF coupler can effectively compensate for increased coupling effect, and insertion loss improves with reduced coupling effects.

To implement a relatively flat coupling factor over frequency, a multi-section coupler can be configured such that points along the 3 curves illustrated in FIG. 12B that align for a coupling factor value can be implemented for corresponding frequencies for 3 different frequencies of interest.

Figure 13A:
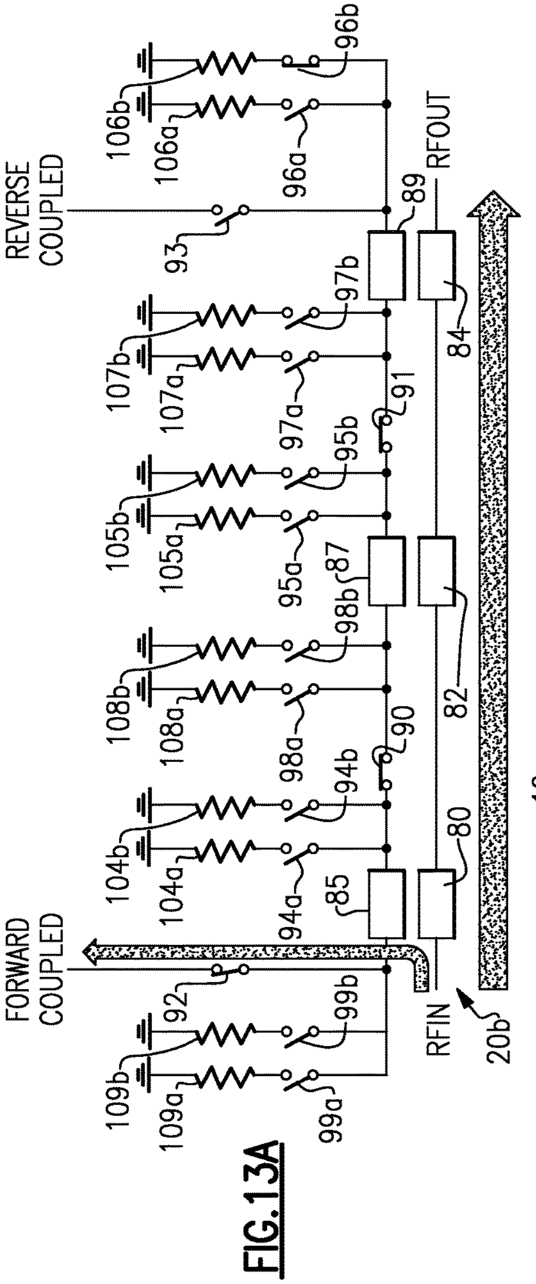
FIG. 13A is a schematic diagram of a radio frequency coupler with a multi-section coupled line having a plurality of termination impedances coupleable to each section, according to an embodiment.

FIG. 13A is a schematic diagram of an electronic system that includes multi-section radio frequency coupler 20*b* having a plurality of termination impedances coupleable to each section, according to an embodiment. The electronic system of FIG. 13A is like the electronic system illustrated in FIGS. 7A, 8A, 9A, and 10A, except that multiple termination impedances are coupleable to each of the sections of the multi-section coupled line. Although an embodiment with a three section coupled line is described in connection with FIG. 13A for illustrative purposes, the principles and advantages discussed herein can be applied to a two section coupled line and/or to a coupled line with more than three sections.

As shown in FIG. 13A, multiple impedance select switches of the switch network are electrically connected to each section of the coupled line. Each of these impedance select switches has a corresponding termination impedance electrically connected thereto. A selected termination impedance can be provided to a respective section of the coupled line. This can achieve a desired directivity. For instance, for a particular frequency band and/or a particular power mode, a selected termination impedance can be provided to a section of the coupled line.

The electronic system illustrated in FIG. 13A can be configured in various states. In some states, the electronic system can be configured for providing an indication of forward power. According to some other states, the electronic system can be configured for providing an indication of reflected power. The electronic system can also be configured in a decoupled state in which the coupled line is decoupled from the main line. Any suitable control circuit, such as a decoder, can turn switches on and/or off to implement such states. Table 7 below summarizes which of the illustrated switches are on and which of the illustrated switches are off in various states according to an embodiment. Table 8 below provides a brief description of these states. In some embodiments, additional states and/or a subcombination of these states can be implemented.

TABLE 7

States of Switches for States of 3-Section Coupler of FIG. 13A

| St | 90 | 91 | 92 | 93 | 94a | 94b | 95a | 95b | 96a | 96b | 97a | 97b | 98a | 98b | 99a | 99b |
|---|---|---|---|---|---|---|---|---|---|---|---|---|---|---|---|---|
| 1 | On | On | On | Off | Off | Off | Off | Off | On | Off | Off | Off | Off | Off | Off | Off |
| 2 | On | On | On | Off | Off | Off | Off | Off | Off | On | Off | Off | Off | Off | Off | Off |
| 3 | On | On | On | Off | Off | Off | Off | Off | On | On | Off | Off | Off | Off | Off | Off |
| 4 | On | Off | On | Off | Off | Off | On | Off | Off | Off | Off | Off | Off | Off | Off | Off |
| 5 | On | Off | On | Off | Off | Off | Off | On | Off | Off | Off | Off | Off | Off | Off | Off |
| 6 | On | Off | On | Off | Off | Off | On | On | Off | Off | Off | Off | Off | Off | Off | Off |
| 7 | Off | Off | On | Off | Off | Off | Off | Off | Off | Off | Off | Off | Off | Off | Off | Off |
| 8 | Off | Off | On | Off | On | Off | Off | Off | Off | Off | Off | Off | Off | Off | Off | Off |
| 9 | Off | Off | On | Off | On | On | Off | Off | Off | Off | Off | Off | Off | Off | Off | Off |
| 10 | Off | Off | Off | Off | Off | On | Off | Off | Off | Off | Off | Off | Off | Off | Off | Off |
| 11 | On | On | Off | On | Off | Off | Off | Off | Off | Off | Off | Off | Off | Off | On | Off |
| 12 | On | On | Off | On | Off | Off | Off | Off | Off | Off | Off | Off | Off | Off | Off | On |
| 13 | On | On | Off | On | Off | Off | Off | Off | Off | Off | Off | Off | Off | Off | On | On |
| 14 | On | Off | Off | On | Off | Off | Off | Off | Off | Off | Off | Off | On | Off | Off | Off |
| 15 | On | Off | Off | On | Off | Off | Off | Off | Off | Off | Off | Off | Off | On | Off | Off |
| 16 | On | Off | Off | On | Off | Off | Off | Off | Off | Off | Off | Off | On | On | Off | Off |
| 17 | Off | Off | Off | On | Off | Off | Off | Off | Off | Off | On | Off | Off | Off | Off | Off |
| 18 | Off | Off | Off | On | Off | Off | Off | Off | Off | Off | Off | On | Off | Off | Off | Off |
| 19 | Off | Off | Off | On | Off | Off | Off | Off | Off | Off | On | On | Off | Off | Off | Off |

TABLE 8

States and Descriptions for 3-Section Coupler of FIG. 13A

| State | Description |
|---|---|
| 1 | Forward Power, High Coupling Factor, Frequency $A_1$ |
| 2 | Forward Power, High Coupling Factor, Frequency $B_1$ |
| 3 | Forward Power, High Coupling Factor, Frequency $C_1$ |
| 4 | Forward Power, Medium Coupling Factor, Frequency $A_2$ |
| 5 | Forward Power, Medium Coupling Factor, Frequency $B_2$ |
| 6 | Forward Power, Medium Coupling Factor, Frequency $C_2$ |
| 7 | Forward Power, Low Coupling Factor, Frequency $A_3$ |
| 8 | Forward Power, Low Coupling Factor, Frequency $B_3$ |
| 9 | Forward Power, Low Coupling Factor, Frequency $C_3$ |
| 10 | Decoupled |
| 11 | Reverse Power, High Coupling Factor, Frequency $A_4$ |
| 12 | Reverse Power, High Coupling Factor, Frequency $B_4$ |
| 13 | Reverse Power, High Coupling Factor, Frequency $C_4$ |
| 14 | Reverse Power, Medium Coupling Factor, Frequency $A_5$ |
| 15 | Reverse Power, Medium Coupling Factor, Frequency $B_5$ |
| 16 | Reverse Power, Medium Coupling Factor, Frequency $C_5$ |
| 17 | Reverse Power, Low Coupling Factor, Frequency $A_6$ |
| 18 | Reverse Power, Low Coupling Factor, Frequency $B_6$ |
| 19 | Reverse Power, Low Coupling Factor, Frequency $C_6$ |

Figure 13B:
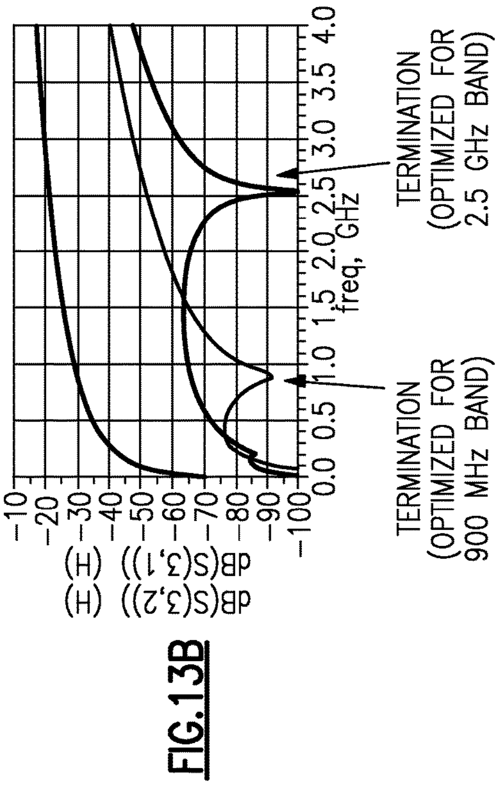
FIG. 13B is a graph illustrating curves associated with the radio frequency coupler of FIG. 13A corresponding to two different termination impedances.

FIG. 13B is a graph illustrating curves for states of the radio frequency coupler in FIG. 13A with termination impedances. The electronic system of FIG. 13A can be optimized for different frequencies by electrically connecting different termination impedance to a section of the multi-section coupled line. For instance, the bottom two curves in FIG. 13B correspond to the termination impedances 106*a* and 106*b*, respectively, being electrically connected to the multi-section coupled line. One termination impedance is optimized for a frequency band around 900 MHz and the other termination impedance is optimized for a frequency band around 2.5 GHz. The top curves in FIG. 13B, which substantially overlap each other, correspond to a signal at the coupled port.

Figure 13C:
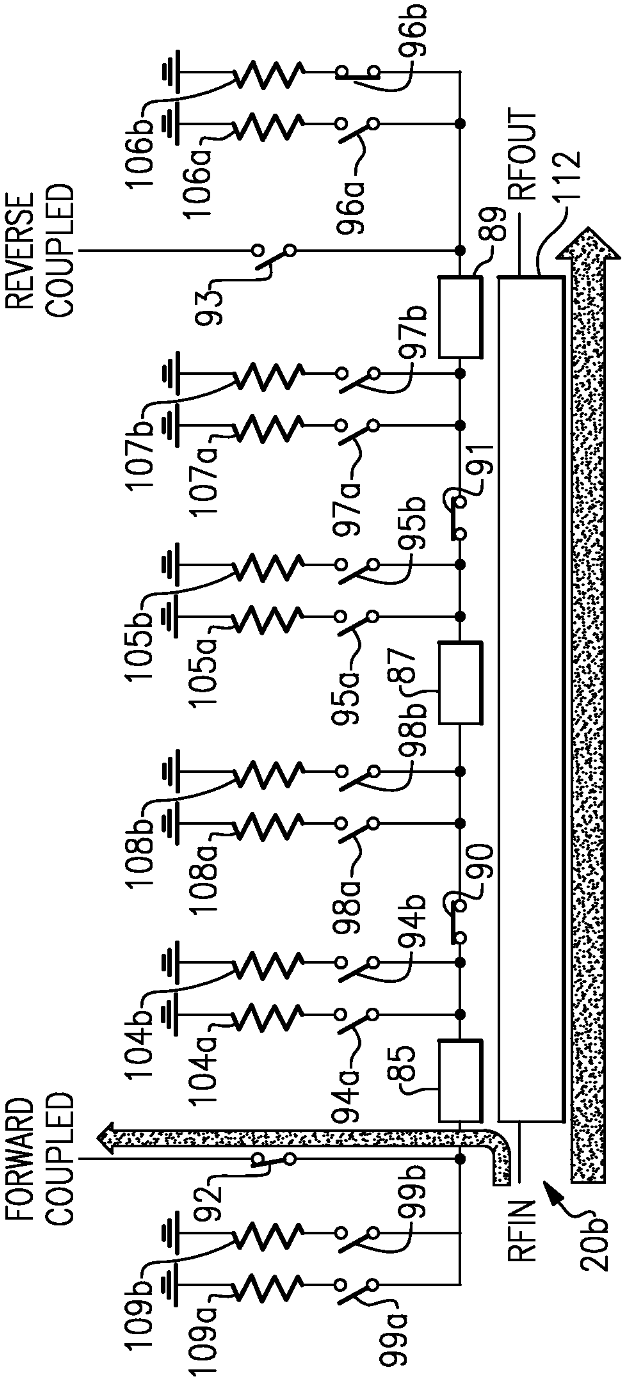
FIG. 13C is a schematic diagram of a radio frequency coupler with a multi-section coupled line having a plurality of termination impedances coupleable to each section, according to another embodiment.

FIG. 13C is a schematic diagram of a radio frequency coupler with a multi-section coupled line having a plurality of termination impedances coupleable to each section, according to another embodiment. As illustrated in FIG. 13C, the main line of the RF coupler can be implemented by a single continuous conductive line 112. The electronic system of FIG. 13C can implement any suitable combination of features discussed with reference to FIGS. 13A and 13B. The conductive line 112 can be a continuous conductive structure extending from the power input port of the RF coupler to the power output port of the RF coupler. The conductive line 112 can be implemented by, for example, a microstrip, a strip line, inductor, or the like. The conductive line 112 can be implemented in place of a multi-section main line in any of the disclosed embodiments that include a multi-section main line.

Figure 14:
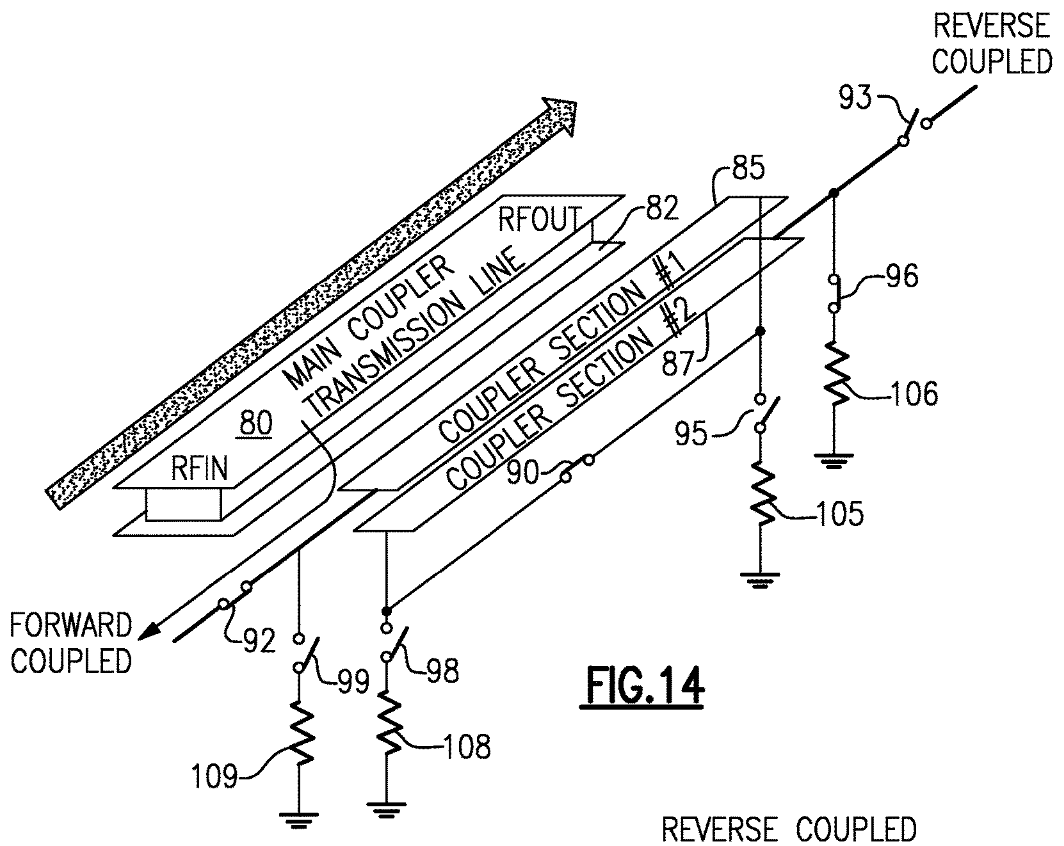
FIG. 14 is a schematic diagram of a radio frequency coupler having cascaded sections in a coupled line, according to an embodiment.

FIG. 14 is a schematic diagram of a radio frequency coupler having cascaded sections in a coupled line, according to an embodiment. The RF coupler illustrated in FIG. 14 has a two section coupled line. As illustrated, sections of the main line of the RF coupler can be implemented by transmission lines in multiple stacked layers. In FIG. 14, sections of the coupled line can also be implemented by transmission lines in multiple stacked layers 80 and 82. Coupling factor switch 90 can have a first end electrically connected to the first section 85 of the coupled line and a second end electrically connected to the second section 87 of the coupled line. The coupling factor switch 90 can be implemented in an active layer. Termination impedance switches can selectively electrically connect respective termination impedances to a section of the coupled line in accordance with the principles and advantages discussed herein. Any of the principles and advantages of FIG. 14 can be implemented in combination with any of the disclosed embodiments as appropriate.

Figure 15:
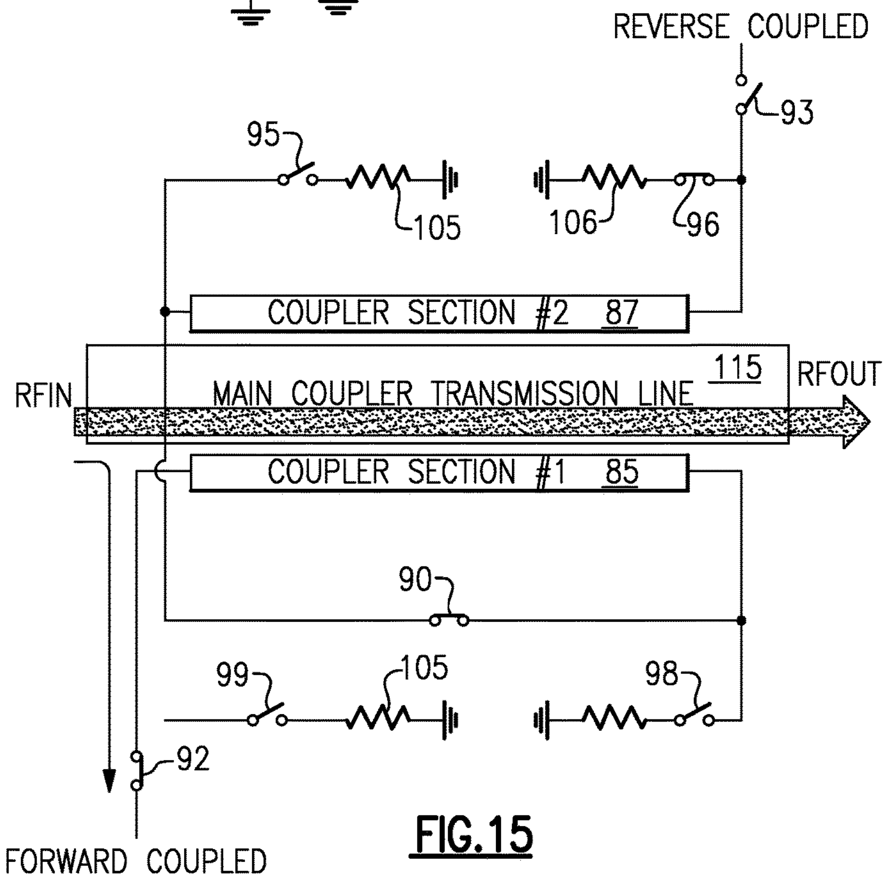
FIG. 15 is a schematic diagram of a radio frequency coupler having multiple layers in which multiple coupled line sections can share the same main line, according to an embodiment.

FIG. 15 is a schematic diagram of a radio frequency coupler having multiple layers in which multiple coupled line sections can share the same main coupler line, according to an embodiment. The RF coupler illustrated in FIG. 15 includes a coupled line with two sections. As illustrated, sections 85 and 87 are disposed adjacent to a common section 115 of the main line. In FIG. 15, sections 85 and 87 of the coupled line can be implemented by transmission lines in multiple stacked layers. The coupling factor switch 90 can be implemented in an active layer. Any of the principles and advantages of FIG. 15 can be implemented in combination with any of the disclosed embodiments as appropriate.

Figure 16A:
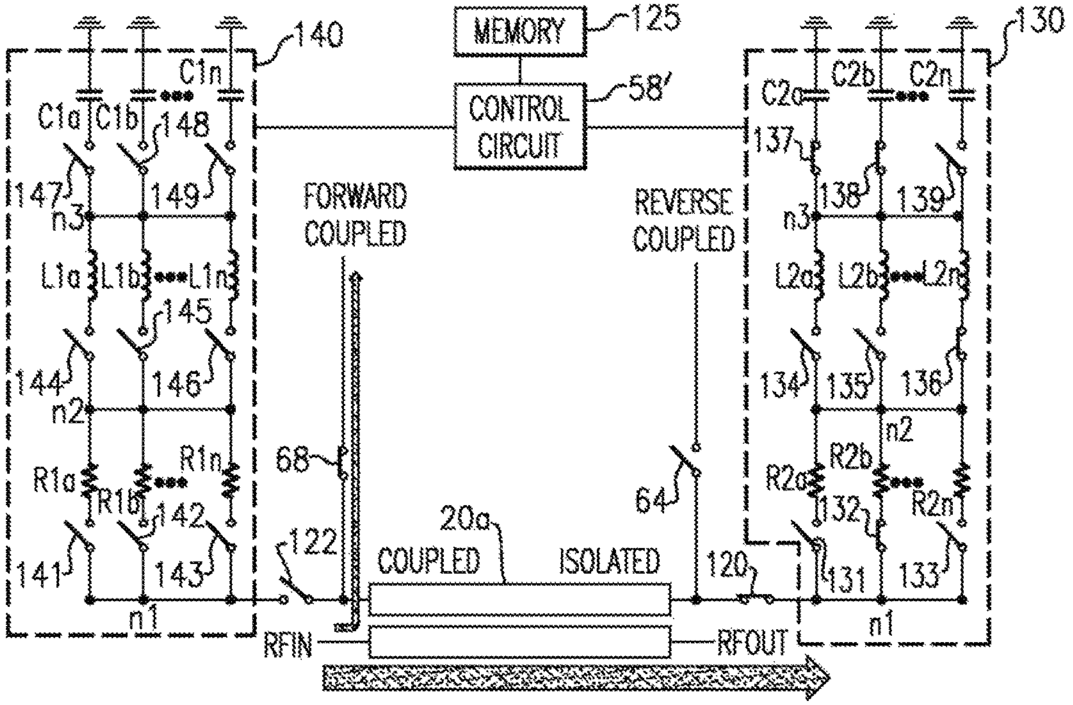
FIG. 16A is a schematic diagram of a radio frequency coupler, a termination impedance circuit configured to provide an adjustable termination impedance, and an isolation switch coupled between the radio frequency coupler and the termination impedance circuit, according to an embodiment.

FIG. 16A is a schematic diagram of a radio frequency coupler, a termination impedance circuit configured to provide an adjustable termination impedance, and an isolation switch coupled between the radio frequency coupler and the termination impedance circuit, according to an embodiment. The RF coupler 20*a* can be implemented in the electronic systems of FIG. 1 and/or FIG. 2, for example. The electronic system of FIG. 16A includes an RF coupler 20*a*, isolation switches 120 and 122, a memory 125, a control circuit 58', termination impedance circuits 130 and 140, and mode select switches 64 and 68. The RF coupler 20*a* illustrated in FIG. 16A is a bi-directional coupler. The electronic system of FIG. 16A can include more elements than illustrated and/or a subcombination of the illustrated elements can be implemented. Moreover, the electronic system of FIG. 16A can be implemented in accordance with any suitable combination of the principles and advantages discussed herein.

The termination impedance circuits 130 and 140 of FIG. 16A are tunable to provide a desired termination impedance to a port of the RF coupler 20*a*. Termination impedance circuit 130 can be tuned to provide a desired termination impedance to the isolated port of the RF coupler 20*a*. The termination impedance circuit 130 can tune resistance, capacitance, and/or inductance provided to the isolated port of the RF coupler 20*a*. Such tunability can be advantages for post-design configuration and/or compensation and/or optimization.

The termination impedance circuit 130 can tune the termination impedance provided to the isolated port by providing series and/or parallel combinations of passive impedance elements. As illustrated in FIG. 16A, the termination impedance circuit 130 includes switches 131 to 139 and passive impedance elements R2*a* to R2*n*, L2*a* to L2*n*, and C2*a* to C2*n*. Each of the switches 131 to 139 can selectively switch in a respective passive impedance element to the termination impedance provided to the isolated port. In the termination impedance circuit 130 illustrated in FIG. 16A, at least three switches should be on in order to provide a termination path between a connection node n1 and ground.

The switches of the termination impedance circuit 130 illustrated in FIG. 16A include three banks of parallel switches 131 to 133, 134 to 136, and 137-139 in series with each other. A first bank of switches 131 to 133 is coupled between connection node n1 and a first intermediate node n2. The second bank of switches 134 to 136 is coupled between the first intermediate node n2 and a second intermediate node n3. The third bank of switches 137 to 139 is coupled between the second intermediate node n3 and a reference potential, such as ground. Having banks of switches in parallel with other banks of parallel switches can increase the number of possible termination impedance values provided by the termination impedance circuit 130. For example, when the termination impedance circuit 130 includes 3 banks of 3 parallel switches in series with each other, the termination impedance circuit can provide 343 different termination impedance values by having one or more of the switches in each bank of switches on while the other switches are off.

The illustrated termination impedance circuit 130 includes series circuits that include a passive impedance element and a switch in parallel with other series circuits that include other passive impedance elements and other switches. For instance, a first series circuit that includes the switch 131 and the resistor R2*a* is in parallel with a second series circuit that includes switch 132 and the resistor R2*b*. The termination impedance circuit 130 includes switches 134 to 136 to switch inductors L2*a* to L2*n*, respectively, in series with one or more resistors R2*a* to R2*n*. The switches 134 to 136 can also switch two or more of the inductors L2*a* to L2*n* in parallel with each other. The termination impedance circuit 130 also includes switches 137 to 139 to switch capacitors C2*a* to C2*n*, respectively, in series with one or more resistor-inductor (RL) circuits. The switches 137 to 139 can also switch two or more of the capacitors C2*a* to C2*n* in parallel with each other.

As illustrated in FIG. 16A, the switches 132, 136, 137, and 138 can be on while the other switches in the termination impedance circuit 130 are off. This can provide a termination impedance to the isolated port of the RF coupler 20*a* that includes the resistor R2*b* in series with inductor L2*n* in series with the parallel combination of capacitors C2*a* and C2*b*.

The termination impedance circuit 130 can include passive impedance elements having arbitrary values, binary weighted values, values to compensate for variations, values for a particular application, the like, or any combination thereof. While the termination impedance circuit 130 can provide RLC circuits, the principles and advantages discussed herein can be applied to a termination impedance circuit that can provide any suitable combination of circuit elements such as one or more resistors, one or more inductors, one or more capacitors, one or more RL circuits, one or more RC circuits, one or more LC circuits, or one or more RLC circuits to provide a desired termination impedance. Such combinations of circuit elements can be arranged in any suitable series and/or parallel combination.

The switches 131 to 139 can be implemented by field effect transistors. Alternatively, or additionally, one or more switches of the termination impedance circuit 130 can be implemented by MEMS switches, fuse elements (e.g., fuses or antifuses), or any other suitable switch element.

While the termination impedance circuit 130 illustrated in FIG. 16A includes switches, a tunable termination impedance can alternatively or additionally be provided by other variable impedance circuits. For instance, the termination impedance circuit can implement a tunable termination impedance using an impedance element having an impedance that varies as a function of a signal provided to impedance element. As one example, a field effect transistor operating in the linear mode of operation can provide an impedance dependent on a voltage provided to its gate. As another example, a varactor diode can provide a variable capacitance as a function of voltage provided to the varactor diode.

The illustrated termination impedance circuit 140 can function substantially the same as the illustrated termination impedance circuit 130 except that the termination impedance circuit 140 can provide a termination impedance to the coupled port instead of the isolated port. The impedances of the passive impedance elements of the termination impedance circuit 130 can be substantially the same as corresponding passive impedance elements of the termination impedance circuit 140. One or more of the passive impedance elements of the termination impedance circuit 130 can have a different impedance value than a corresponding passive impedance element of the termination impedance circuit 140. In certain embodiments (not illustrated), the termination impedance circuit 130 and the termination impedance circuit 140 can have circuit topologies that are different from each other.

The illustrated isolation switches 120 and 122 can serve to provide isolation between ports of the RF coupler 20*a* and the termination impedance circuits 130 and 140, respectively. Each of the isolation switches 120 and 122 can selectively electrically connect a port of the RF coupler 20*a* to a termination impedance circuit 130 or 140, respectively, responsive to a control signal received at a control termination of the respective isolation switch. As illustrated, the isolation switch 122 is electrically connected between the coupled port of the RF coupler 20*a* and the termination impedance circuit 140. The isolation switch 122 can be off when the coupled port is providing indication of forward RF power as illustrated in FIG. 16A. When isolation switch 122 is off, the isolation switch 122 can separate the loading of the termination impedance circuit 140 from the coupled port. In particular, the isolation switch 122 can isolate switches 141 to 143 of the first bank of switches of the termination impedance circuit 140 from the coupled port when the isolation switch 122 is off. This can improve insertion loss by removing loading of switch bank switches on the coupled port of the RF coupler 20*a*. With the isolation switch 122, there are two switches in series between any passive impedance element of the termination impedance circuit 140 and the coupled port of the RF coupler 20*a* in the illustrated embodiment.

When the electronic system of FIG. 16A is in another state (not illustrated) where the isolated port is providing an indication of reverse RF power, the isolation switch 122 can be on to electrically connect the termination impedance circuit 140 to the coupled port.

The isolation switch 122 can be implemented by a field effect transistor, for example. In certain implementations, the isolation switch 122 can be implemented by a switch in series between the connection node n1 and the coupled port of the RF coupler and a shunt switch connected to the connection node n1. According to some implementations, the isolation switch 122 can be implemented by a series-shunt-series switch topology, for example, as illustrated in FIGS. 19B and 19C. The isolation switch 122 can be implemented by a single throw switch. The isolation switch 122 can be implemented by a single pole switch. The isolation switch 122 can be implemented by a single pole, single throw switch as illustrated.

The isolation switch 120 of FIG. 16A is electrically connected between the isolated port of the RF coupler 20*a* and the termination impedance circuit 130. The isolation switch 120 can be off when the isolated port is providing an indication of reverse RF power (not illustrated) and on when the coupled port is providing an indication of forward RF power as illustrated. Aside from the different connections and different timing when the switches are activated and deactivated, the isolation switches 120 and 122 can be substantially the same. Both of the isolation switches 120 and 122 can be off in a decoupled state. The isolation switches 120 and 122 can implement a switch circuit that can selectively electrically couple the termination impedance circuit 130 to the isolated port and that can selectively electrically couple the termination impedance circuit 140 to the coupled port.

The memory 125 can store data to set the state of one or more switches in the termination impedance circuit 130 and/or the termination impedance circuit 140. The memory 125 can be implemented by persistent memory elements, such as fuse elements. In some other implementations, the memory 125 can include volatile memory elements. The memory 125 can store data indicative of process variations. Alternatively or additionally, the memory 125 can store data indicative of application parameters. The memory 125 can be embodied on same die as control circuit 58' and/or termination impedance circuits 130 and 140. The memory 125 can be included in the same package as the RF coupler 20*a*.

The illustrated control circuit 58' is in communication with the memory 125. The control circuit 58' is configured to provide one or more control signals to set the state of the one or more switches of the termination impedance circuits 130 and 140 based at least partly on the data stored in the memory 125. The control circuit 58' can implement any combination of features of the control circuit 58 discussed herein. The control circuit 58' can be a decoder, for example.

The memory 125 and the control circuit 58' can together configure the termination impedance circuits 130 and/or 140 after the electronic system of FIG. 16A has been manufactured. This can configure a termination impedance provided to the RF coupler 20*a* to compensate for process variations. For instance, the memory 125 can include fuse elements and the control circuit 58' can include a decoder. In this example, after a process variation has been detected, a fuse element of the memory 125 can be blown and this can cause the control circuit 58' to set one or more switches of the termination impedance circuits 130 and/or 140 to the on position such that a particular passive impedance element is included in the termination path provided to a port of the RF coupler 20*a* to compensate for the process variation. As another example, a termination impedance provided to the RF coupler 20*a* can be configured to a particular application parameter, such as operating in a particular frequency band.

Figure 16B:
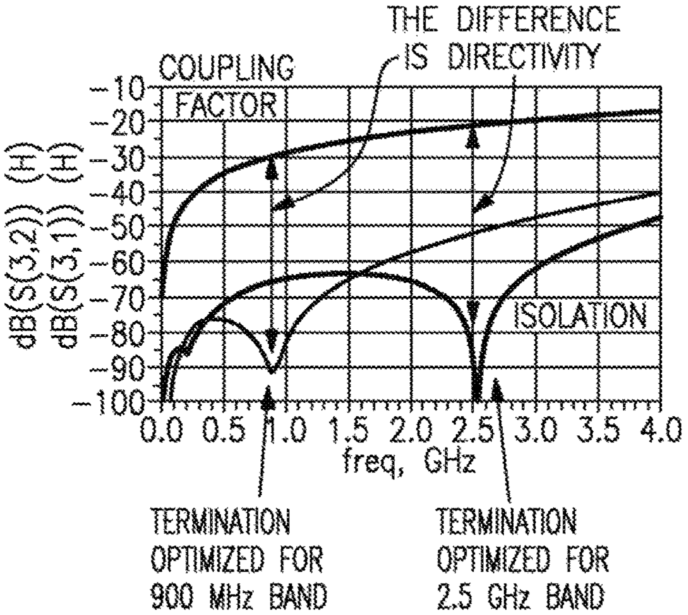
FIG. 16B is a graph illustrating a coupling signal at a coupled port and a signal at an isolated port optimized for two different frequencies for the radio frequency coupler illustrated in FIG. 16A.

FIG. 16B is a graph illustrating a coupling signal at a coupled port and signals at an isolated port optimized for two different frequencies for the radio frequency coupler illustrated in FIG. 16A. FIG. 16B shows that termination impedance can be optimized for a particular frequency using the termination impedance circuit 130 and/or the termination impedance circuit 140. Termination impedance can be adjusted for other parameters as desired.

Figure 17A:
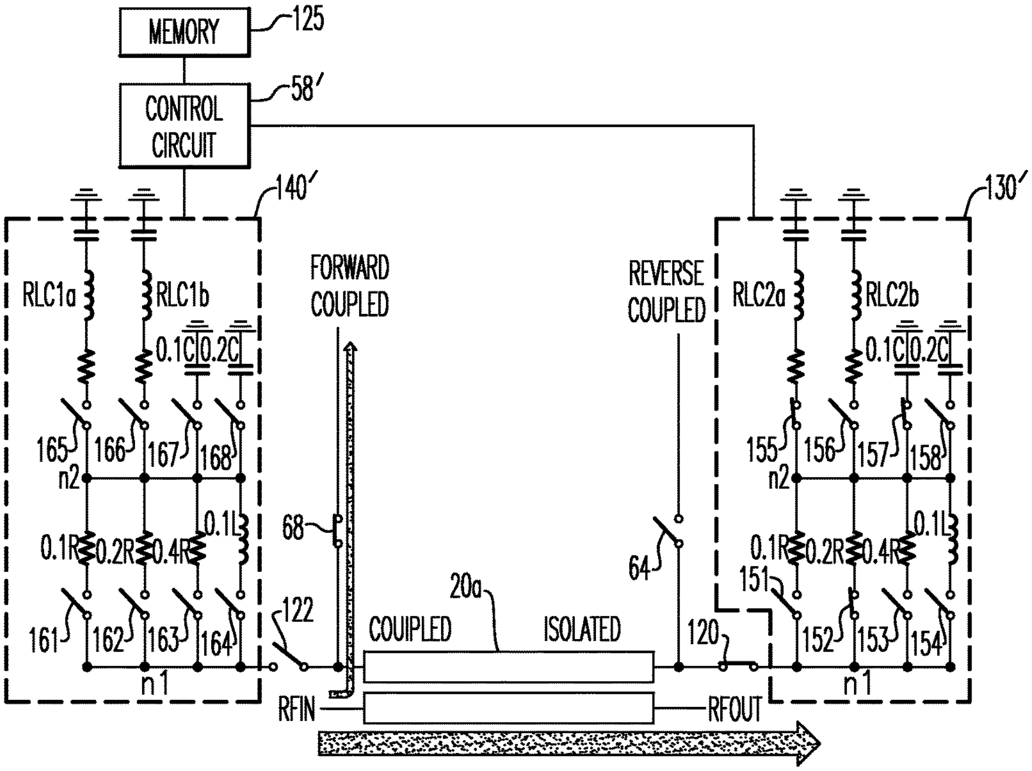
FIG. 17A is a schematic diagram of a radio frequency coupler, a termination impedance circuit configured to provide an adjustable termination impedance, and an isolation switch coupled between the radio frequency coupler and the termination impedance circuit, according to another embodiment.

FIG. 17A is a schematic diagram of a radio frequency coupler, a termination impedance circuit configured to provide an adjustable termination impedance, and an isolation switch between the radio frequency coupler and the termination impedance circuit, according to another embodiment. The electronic system of FIG. 17A can include more elements than illustrated and/or a subcombination of the illustrated elements can be implemented. Moreover, the electronic system of FIG. 17A can be implemented in accordance with any suitable combination of the principles and advantages discussed herein.

The electronic system of FIG. 17A includes different termination impedance circuits than FIG. 16A. The termination impedance circuits 130' and 140' of FIG. 17A can adjust termination impedance provided to the isolated port and the coupled port, respectively, of the RF coupler 20*a*, with different circuit topologies than the termination impedance circuits 130 and 140 of FIG. 16A. For example, the termination impedance circuit 130' illustrated in FIG. 17A includes switches 155 and 156 that can selectively provide an electrical connection between RLC circuits and a port of the RF coupler. The illustrated termination impedance circuit 130' can also provide an RC termination (e.g., when switches 152 and/or 153 are on and switches 157 and/or 158 are on) or an LC termination (e.g., when switch 154 is on and switches 157 and/or 158 are on) to the isolated port of the RF coupler 20*a*. In the illustrated termination impedance circuit 130', different passive impedance elements that are ratioed to each other (e.g., capacitors 0.1C and 0.2C; resistors 0.1R, 0.2R, and 0.4R; or ratioed inductors [not illustrated in FIG. 17A]) can be selectively switched in individually or in parallel with each other. Such impedance elements can be used to compensate for process variations or to configure an electronic system for certain applications. For instance, data indicative of a process variation can be stored in the memory 125 and the control circuit 58' can set the state of a switch to switch in or switch out a particular impedance to thereby compensate for a process variation.

The illustrated termination impedance circuit 140' can function substantially the same as the illustrated termination impedance circuit 130' except that the termination impedance circuit 140' can provide a termination impedance to the coupled port instead of the isolated port. The impedances of the passive impedance elements of the termination impedance circuits 130' and 140' can be substantially the same or one or more of the passive impedance values can have a different impedance value. In certain embodiments (not illustrated), the termination impedance circuit 130' and the termination impedance circuit 140' can have different circuit topologies.

Figure 17B:
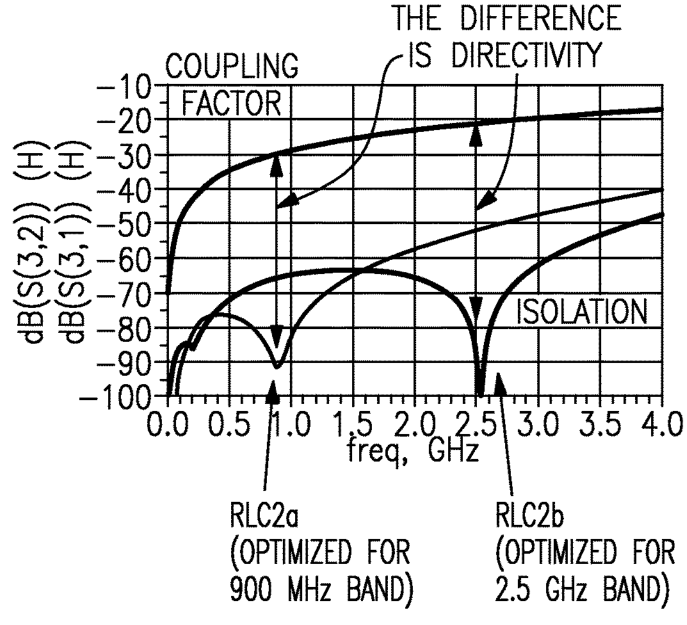
FIG. 17B is a graph illustrating a coupling signal at a coupled port and a signal at an isolated port optimized for two different frequencies for the radio frequency coupler illustrated in FIG. 17A.

FIG. 17B is a graph illustrating a coupling signal at a coupled port and signals at an isolated port optimized for two different frequencies for the radio frequency coupler illustrated in FIG. 17A. FIG. 17B shows that termination impedance provided by the termination impedance circuit 130' can be optimized for particular frequencies. In particular, RLC circuit RLC2*a* can be optimized for a frequency band centered around 900 MHz and RLC circuit RLC2*b* can be optimized for a frequency band centered around 2.5 GHz. Adjusting the state of switches 155 and 156 can provide different termination impedances to the isolated port for these frequency bands. Termination impedance can be adjusted for other parameters as desired.

Figure 18:
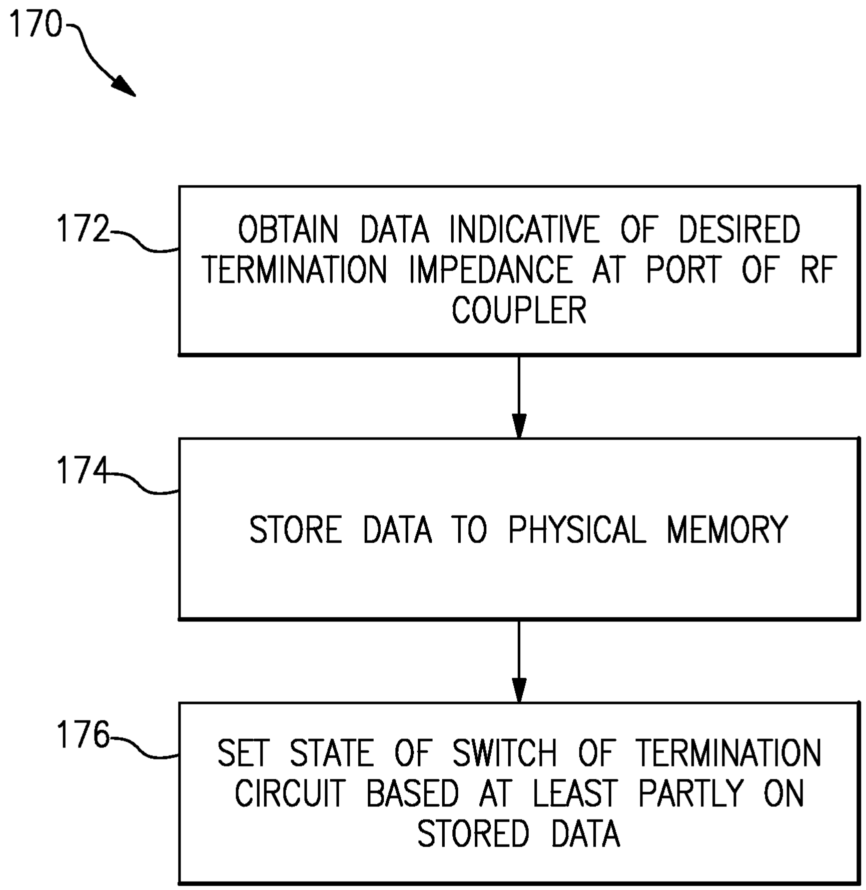
FIG. 18 is a flow diagram of an illustrative process of setting a state of a switch in a termination impedance circuit, according to an embodiment.

FIG. 18 is a flow diagram of an illustrative process 170 of setting a state of a switch in a termination impedance circuit, according to an embodiment. The process 170 can be applied in combination with any of the principles and advantages discussed herein with reference to an adjustable termination impedance circuit and/or an RF coupler.

At block 172, data indicative of a desired termination impedance at a port of a radio frequency (RF) coupler can be obtained. The obtained data can be indicative of a process variation, temperature dependence, and/or an application parameter, for example. The port of the RF coupler can be an isolated port or a coupled port.

The data can be stored to physical memory at block 174. This can make the stored data are accessible to at least partly configure a termination impedance circuit electrically connected to the port of the RF coupler based at least partly on the data stored to the memory. For instance, the data can be accessible to set a state of one or more switches of the termination impedance circuit. As another example, the data can be accessible to configure a variable impedance element at a selected impedance value. As yet another example, the data can be accessible to blow a fuse element of a termination impedance circuit. The data can be stored to the memory 125 of FIGS. 16A and/or 17A, for example. The memory can be persistent memory, such as a fuse element. In other embodiments, the memory can be volatile memory. The memory can be on the same die as a control circuit and/or the termination impedance circuit in some implementations. The memory can be within the same package as the RF coupler. The one or more switches can include a field effect transistor, a MEMS switch, and/or any other suitable switch element.

At block 176, the termination impedance circuit can be configured based at least partly on the data stored to the memory. For instance, a state of the one or more switches of termination impedance circuit can be set based at least partly on the data stored to memory at block 174. The state can be set to an on state or an off state. Setting the state of the switch to an on state can electrically couple a particular passive impedance element to the port of the RF coupler. This can compensate for a process variation, compensate for temperature dependence, configure a termination impedance circuit for a specific application, etc.

Figure 19A:
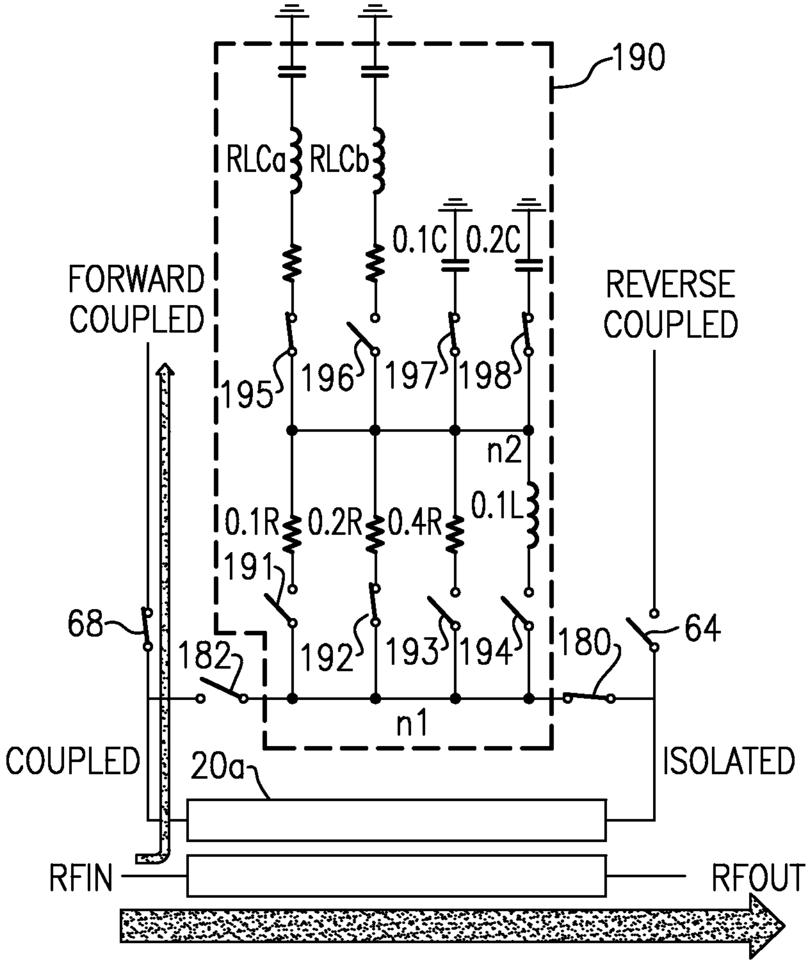
FIG. 19A is a schematic diagram of a radio frequency coupler and a termination impedance circuit electrically coupleable to an isolated port or a coupled port of the radio frequency coupler by way of switches, according to an embodiment.
Figure 19B:
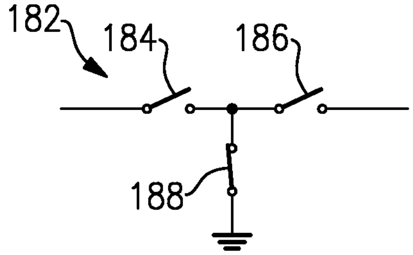
FIGS. 19B and 19C are schematic diagrams of switches of FIG. 19A according to certain embodiments.
Figure 19C:
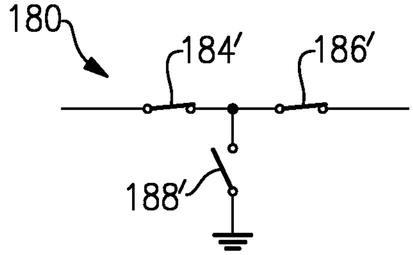

FIG. 19A is a schematic diagram of a radio frequency coupler and a termination impedance circuit coupleable to an isolated port or a coupled port of the radio frequency coupler by way of switches, according to an embodiment. The RF coupler 20*a* of FIG. 19A can be implemented in the electronic systems of FIG. 1 and/or FIG. 2, for example. The electronic system of FIG. 19A includes an RF coupler 20*a*, isolation switches 180 and 182, and a shared termination impedance circuit 190. The RF coupler 20*a* illustrated in FIG. 19A is a bi-directional coupler that can provide an indication of forward RF power or reverse RF power. The electronic system of FIG. 19A can include more elements than illustrated and/or a subcombination of the illustrated elements can be implemented. Moreover, the electronic system of FIG. 19A can be implemented in accordance with any suitable combination of the principles and advantages discussed herein.

In the electronic system illustrated in FIG. 19A, the shared impedance circuit 190 can be electrically coupled to the isolated port of the RF coupler 20*a* in a first state and electrically coupled to the coupled port of the RF coupler 20*a* in a second state. In the first state, the RF coupler 20*a* can provide an indication of forward RF power to the coupled port. In the second state, the RF coupler 20*a* can provide an indication of reverse RF power to the isolated port. Having a common termination impedance circuit 190 can reduce physical layout compared to having separate termination impedance circuits for different ports of an RF coupler.

A switch circuit including the isolation switches 180 and 182 can selectively electrically connect different ports of the RF coupler 20*a* to the shared termination impedance circuit 190 in different states. The isolation switches 180 and 182 can selectively electrically connect the shared termination impedance circuit 190 of FIG. 19A to the coupled port of the RF coupler 20*a* or the isolated port of the RF coupler 20*a*. As illustrated, the isolation switches 180 and 182 are both electrically connected to the same node (i.e., connection node n1) of the shared termination impedance circuit 190. In other implementations (not illustrated), switches can selectively electrically couple a termination impedance circuit to any two ports of an RF coupler or selectively electrically couple a termination impedance circuit to any three or more ports of an RF coupler.

The isolation switches 180 and 182 can provide higher isolation in an off state than a desired directivity (e.g., 10 dB or better in certain implementations). This can provide sufficient isolation between the coupled port and the isolated port of the RF coupler 20*a* to achieve the desired directivity with the shared termination impedance circuit 190. The isolation switches can each include a series-shunt-series circuit topology implemented by field effect transistors, a MEMS switch, or any other suitable switch element to provide sufficient isolation for a desired directivity.

FIGS. 19B and 19C are schematic diagrams of the isolation switches 182 and 180, respectively, of FIG. 19A according to an embodiment. FIG. 19B shows an isolation switch in an off state and FIG. 19C shows an isolation switch in an on state. As shown in FIG. 19B, the isolation switch 182 can include switches 184, 186, and 188 in a series-shunt-series circuit topology. When the switch 182 is in an off state as illustrated in FIG. 19B, the shunt switch 188 can be on to provide a ground potential to a node between series switches 184 and 186 that are both in an off state. As shown in FIG. 19C, the isolation switch 180 can include switches 184', 186', and 188' in a series-shunt-series circuit topology. When the switch 180 is in an on state as illustrated in FIG. 19C, the shunt switch 188' can be off and the series switches 184' and 186' can both be in an on state. The isolation switches 180 and 182 can both be off in a decoupled state.

The shared termination impedance circuit 190 can provide the same or different termination impedance to different ports of the RF coupler 20*a*. As illustrated, any termination impedance value that can be provided to the isolated port of the RF coupler 20*a* in a first state can be provided to the coupled port of the RF coupler 20*a* in a second state. The illustrated shared termination impedance circuit 190 is tunable to provide an adjustable impedance. While the shared termination impedance circuit 190 illustrated in FIG. 19A has the same circuitry topology as the termination impedance circuits 130' and 140' of FIG. 17A, shared termination impedance circuits can implement any combination of features of the adjustable termination impedance circuits discussed herein such as the termination impedance circuits of FIGS. 3A, 4, 5, 13A, and/or 16A. Moreover, the principles and advantages of sharing a termination impedance circuit discussed with reference to FIG. 19A can be applied to fixed termination impedance (e.g., fixed termination resistor).

RF couplers with multi-section coupled lines can be implemented in connection with any of the adjustable termination impedance circuits discussed herein. A switch network can selective electrically connect an adjustable termination impedance circuit to a selected section of a multi-section coupled line. With such a switch network, one adjustable termination impedance circuit can be shared among a plurality of sections of the multi-section coupled line. Alternatively or additionally, a switch network can selectively electrically couple separate adjustable termination impedance circuits to different sections of a multi-section coupled line. In some embodiments, a switch network can selectively electrically connect one of a coupled port or an isolated port to a single power output port.

Illustrative embodiments of electronic systems with RF couplers having a multi-section coupled line, a switch network, and one or more adjustable termination impedance circuits will be discussed with reference to FIGS. 20 to 25B. Any suitable combination of features of one switch network of the switch networks of FIGS. 20 to 25A can be implemented in connection with features of one or more of the other switch networks of FIGS. 20 to 25A. Other logically and/or functionally equivalent switch networks can alternatively or additionally be implemented. Any suitable termination impedance circuit discussed herein and/or suitable combination of features of a termination impedance circuit discussed herein can be implemented in connection with any of the embodiments discussed herein, such as any of the embodiments of FIGS. 20 to 25B. Similarly, any of the principles and advantages of the control circuits and/or the memories discussed herein can be implemented in combination with the principles and advantages discussed with reference to FIGS. 20 to 25B.

Figure 20:
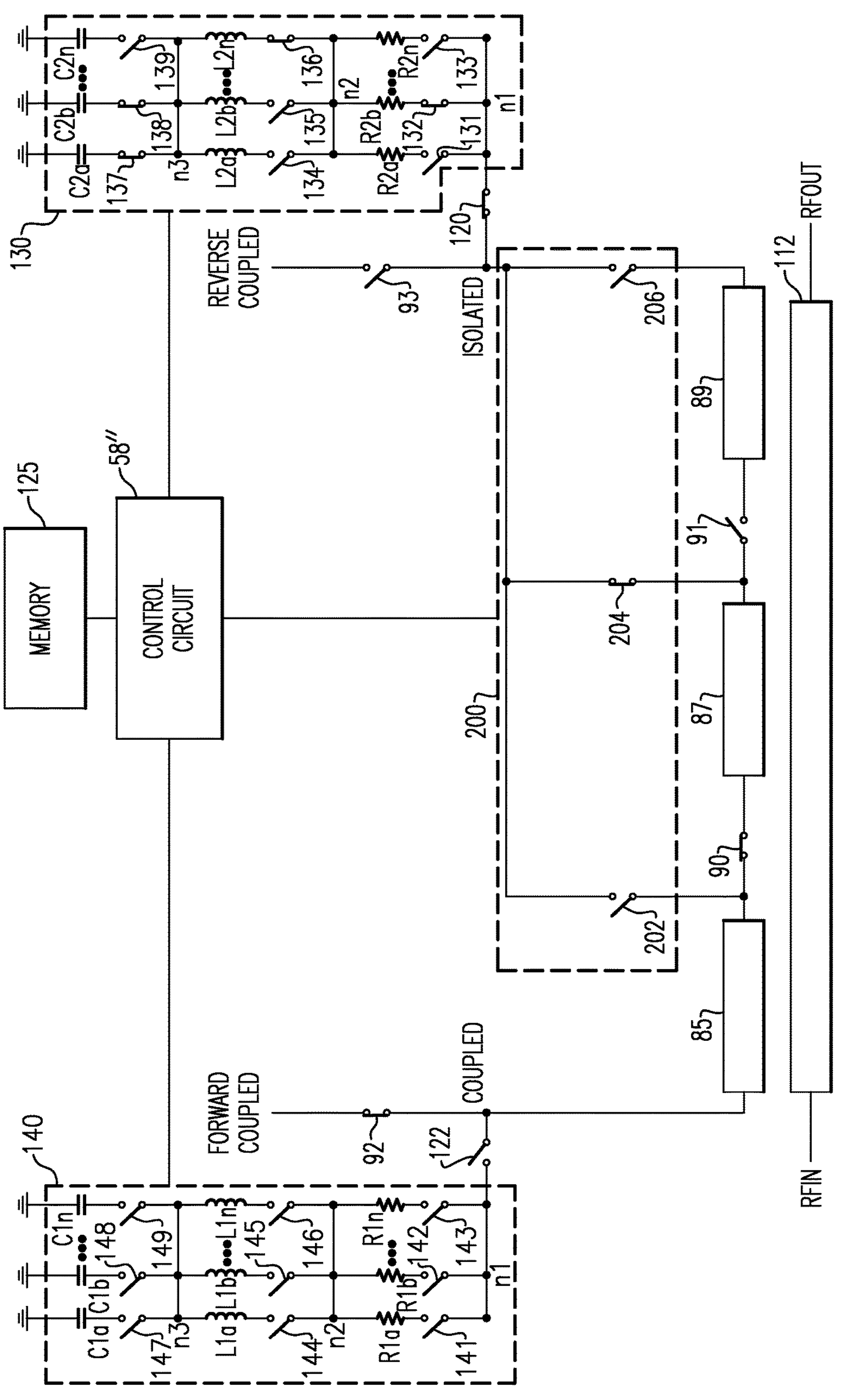
FIG. 20 is a schematic diagram of an electronic system that includes a radio frequency coupler having a multi-section coupled line, termination impedance circuits, and switches configured to selectively electrically connect one of the termination impedance circuits to a selected section of the multi-section coupled line, according to an embodiment.

FIG. 20 is a schematic diagram of an electronic system that includes a radio frequency coupler having a multi-section coupled line, termination impedance circuits 130 and 140, and a switch network 200 configured to selectively electrically connect the termination impedance circuit 130 to a selected section of the multi-section coupled line, according to an embodiment. In FIG. 20, the RF coupler includes a multi-section coupled line that includes sections 85, 87, and 89. Coupling factor switches 90 and 91 can selectively electrically connect sections of the multi-section coupled line to each other, as illustrated. While the RF coupler illustrated in FIG. 20 includes a coupled line having 3 sections, the principles and advantages discussed with FIG. 20 can be applied to two section coupled lines and/or coupled lines having four or more sections. The main line of the RF coupler of FIG. 20 includes a single conductive line 112, like in FIG. 13C.

The electronic system of FIG. 20 includes the termination impedance circuit 130, the termination impedance circuit 140, and the isolation switches 120 and 122, which can each be as described with reference to FIG. 16A. In certain embodiments, the termination impedance circuit 130' of FIG. 17A can be implemented in place of the termination impedance circuit 130 in the electronic system of FIG. 20. According to some other embodiments, other suitable termination impedance circuits can be implemented in place of the termination impedance circuit 130 in the electronic system of FIG. 20, such as the termination impedance circuit illustrated in FIG. 25B. In certain embodiments, the termination impedance circuit 140' of FIG. 17A can be implemented in place of the termination impedance circuit 140 in the electronic system of FIG. 20. According to some other embodiments, other suitable termination impedance circuits can be implemented in place of the termination impedance circuit 140 in the electronic system of FIG. 20, such as the termination impedance circuit illustrated in FIG. 25B.

The electronic system of FIG. 20 also includes a control circuit 58" and a memory 125. The memory 125 can be as described with reference to FIG. 16A. The memory can implement any combination of features discussed with reference to FIG. 18. The control circuit 58" can implement any combination of features of the control circuits 58 and 58' discussed herein. The control circuit 58" can also provide control signals for the switch network 200.

The switch network 200 can selectively electrically connect the termination impedance circuit 130 to a selected section of the multi-section coupled line. As illustrated, the switch network 200 includes switches 202, 204, and 206. Each of these switches can be turned on and turned off responsive to a respective control signal provided by the control circuit 58". As illustrated in FIG. 20, the switch 204 electrically connects the termination impedance circuit 130 to the second section 87 of the multi-section coupled line.

Table 9 below summarizes which of the illustrated switches are on and which of the illustrated switches are off in various states. FIG. 20 corresponds to state 2, in which the RF coupler is configured to provide an indication of forward power with a medium coupling factor. Table 10 below provides a brief description of these states. In some embodiments, additional states and/or a subcombination of these states can be implemented. Any suitable control circuit 58", such as a decoder, can turn switches on and/or off to implement such states. The termination impedance circuit 130 can be configured into any suitable configuration in any of states 1 to 3 in Table 9 below to provide a desired termination impedance. The termination impedance circuit 140 can be configured into any suitable configuration in any of states 5 to 7 in Table 9 below to provide a desired termination impedance.

TABLE 9

States of Switches for RF Coupler of FIG. 20

| State | 90 | 91 | 92 | 93 | 120 | 122 | 202 | 204 | 206 |
|---|---|---|---|---|---|---|---|---|---|
| 1 | Off | Off | On | Off | On | Off | On | Off | Off |
| 2 | On | Off | On | Off | On | Off | Off | On | Off |
| 3 | On | On | On | Off | On | Off | Off | Off | On |
| 4 | Off | Off | Off | Off | Off | Off | Off | Off | Off |
| 5 | Off | Off | Off | On | Off | On | On | Off | Off |
| 6 | On | Off | Off | On | Off | On | Off | On | Off |
| 7 | On | On | Off | On | Off | On | Off | Off | On |

TABLE 10

States and Descriptions for RF Coupler of FIG. 20

| State | Description |
|---|---|
| 1 | Forward Power, Low Coupling Factor |
| 2 | Forward Power, Medium Coupling Factor |
| 3 | Forward Power, High Coupling Factor |
| 4 | Decoupled |
| 5 | Reverse Power, Low Coupling Factor |
| 6 | Reverse Power, Medium Coupling Factor |
| 7 | Reverse Power, High Coupling Factor |

Figure 21:
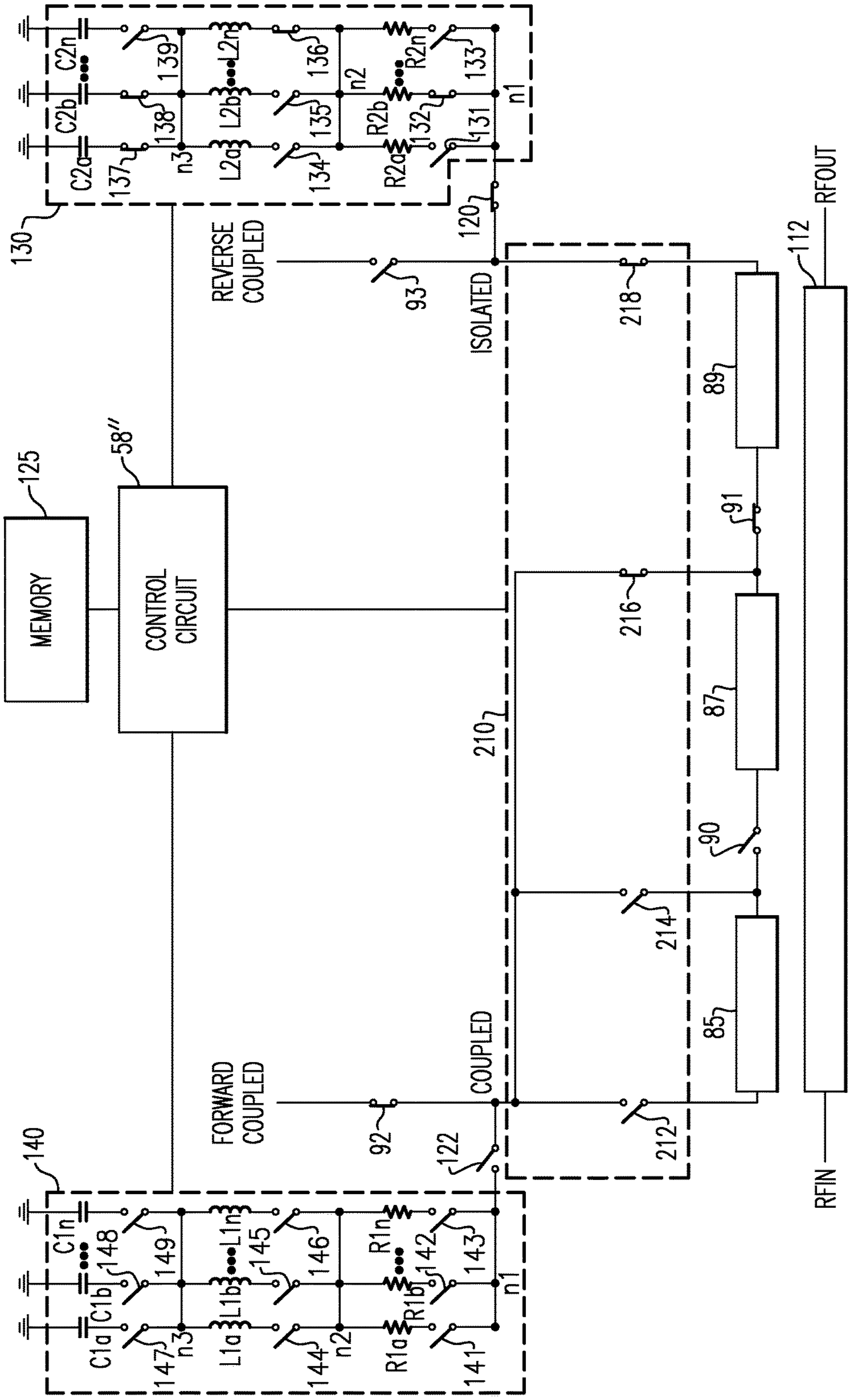
FIG. 21 is a schematic diagram of an electronic system that includes a radio frequency coupler having a multi-section coupled line, termination impedance circuits, and switches configured to selectively electrically connect one of the termination impedance circuits to a selected section of the multi-section coupled line, according to another embodiment.

FIG. 21 is a schematic diagram of an electronic system that includes a radio frequency coupler having a multi-section coupled line, termination impedance circuits 130 and 140, and a switch network configured to selectively electrically connect the termination impedance circuit 140 to a selected section of the multi-section coupled line, according to another embodiment. The electronic system of FIG. 21 is similar to the electronic system of FIG. 20 except that the switch network 200 of FIG. 20 is replaced by the switch network 210.

The illustrated switch network 210 includes switches 212, 214, 216, and 218. The switch network 210 can selectively electrically connect the termination impedance circuit 140 to a selected section 85, 87, or 89 of the multi-section coupled line. The switch network 210 is also configured to electrically decouple each of the sections of the multi-section coupled line from the termination impedance circuits 130 and 140. For instance, the switch network 210 includes switch 218 that can be turned off to electrically isolate the section 89 from the termination impedance circuit 130.

Figure 22A:
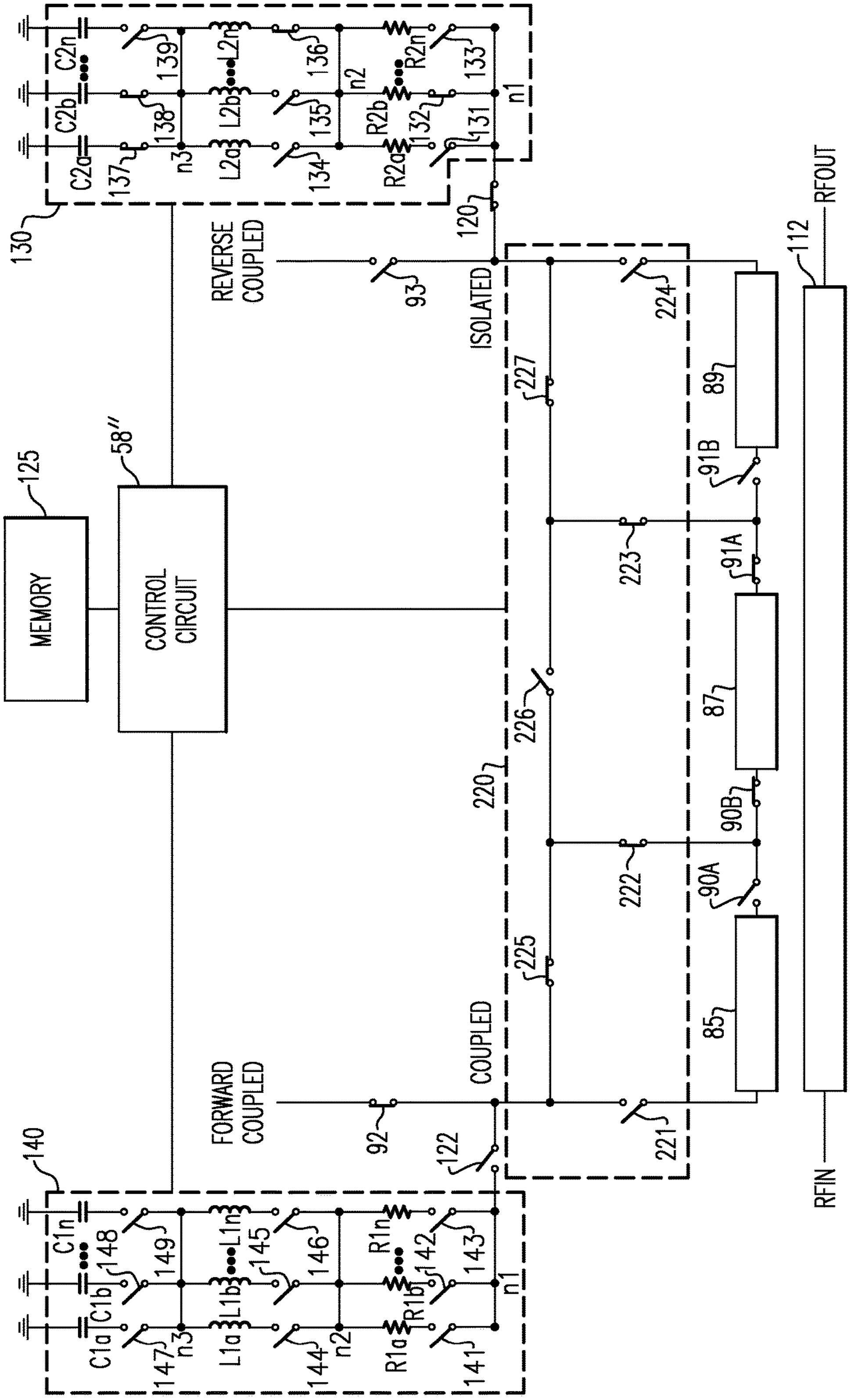
FIG. 22A is a schematic diagram of an electronic system that includes a radio frequency coupler having a multi-section coupled line, termination impedance circuits, and switches configured to selectively electrically connect a selected termination impedance circuit of the termination impedance circuits to a selected section of the multi-section coupled line, according to another embodiment.

FIG. 22A is a schematic diagram of an electronic system that includes a radio frequency coupler having a multi-section coupled line, termination impedance circuits 130 and 140, and switches configured to selectively electrically connect a selected termination impedance circuit of the termination impedance circuits to a selected section of the multi-section coupled line, according to another embodiment. The electronic system of FIG. 22A is similar to the electronic systems of FIGS. 20 and 21 except that the switch network 220 is implemented in place of the switch networks 200/210 and there are additional switches in series between adjacent sections of the multi-section coupled line. Instead of switches 90 and 91 in FIGS. 20 and 21, switches 90A, 90B, 91A, and 91B are included in the electronic system of FIG. 22A.

The illustrated switch network 220 includes switches 221, 222, 223, 224, 225, 226, and 227. The switch network 220 can selectively electrically connect the termination impedance circuit 130 to a selected section 85, 87, or 89 of the multi-section coupled line. The switch network 220 can also selectively electrically connect the termination impedance circuit 140 to a selected section 85, 87, or 89 of the multi-section coupled line. The switch network 220 provides more options to selectively electrically connect termination impedance circuits 130 and 140 to a selected section of the multi-section coupled line of the RF coupler relative to the switch networks 200 and 210. The switch network 200 together with the coupling factor switches 90A, 90B, 91A, and 91B can also provide additional options for electrically connecting sections of the multi-section coupled line to the coupled port of the RF coupler.

As illustrated in FIG. 22A, the RF coupler is configured to provide an indication of forward power and the second section 87 of the coupled line is switched in while the first section 85 and the third section 89 are switched out. The switch network 220, along with other illustrated switches, electrically connects one end of the second section 87 to the forward coupled output and electrically connects the other end of section 87 to the termination impedance circuit 130 as illustrated in FIG. 22A.

Table 11 below summarizes which of the illustrated switches are on and which of the illustrated switches are off in various states. FIG. 22A corresponds to state 2 in this table. Table 12 below provides a brief description of these states. In some embodiments, additional states and/or a subcombination of these states can be implemented. Any suitable control circuit 58", such as a decoder, can turn switches on and/or off to implement such states. The termination impedance circuit 130 can be configured into any suitable state in any of states 1 to 7 in Table 11 below to provide a desired termination impedance. The termination impedance circuit 140 can be configured into any suitable state in any of States 9 to 15 in Table 11 below to provide a desired termination impedance.

TABLE 11

States of Switches for RF Coupler of FIG. 22A

| Stat | 90a | 90b | 91a | 91b | 92 | 93 | 120 | 122 | 221 | 222 | 223 | 224 | 225 | 226 | 227 |
|---|---|---|---|---|---|---|---|---|---|---|---|---|---|---|---|
| 1 | On | Off | Off | Off | On | Off | On | Off | On | On | Off | Off | Off | On | On |
| 2 | Off | On | On | Off | On | Off | On | Off | Off | On | On | Off | On | Off | On |
| 3 | Off | Off | Off | On | On | Off | On | Off | Off | Off | On | On | On | On | Off |
| 4 | On | On | On | Off | On | Off | On | Off | On | Off | On | Off | Off | Off | On |
| 5 | On | Off | Off | On | On | Off | On | Off | On | On | On | On | Off | On | Off |
| 6 | Off | On | On | On | On | Off | On | Off | Off | On | Off | On | On | Off | Off |
| 7 | On | On | On | On | On | Off | On | Off | On | Off | Off | On | Off | Off | Off |
| 8 | Off | Off | Off | Off | Off | Off | Off | Off | Off | Off | Off | Off | Off | Off | Off |
| 9 | On | Off | Off | Off | Off | On | Off | On | On | On | Off | Off | Off | On | On |
| 10 | Off | On | On | Off | Off | On | Off | On | Off | On | On | Off | On | Off | On |
| 11 | Off | Off | Off | On | Off | On | Off | On | Off | Off | On | On | On | On | Off |
| 12 | On | On | On | Off | Off | On | Off | On | On | Off | On | Off | Off | Off | On |
| 13 | On | Off | Off | On | Off | On | Off | On | On | On | On | On | Off | On | Off |
| 14 | Off | On | On | On | Off | On | Off | On | Off | On | Off | On | On | Off | Off |
| 15 | On | On | On | On | Off | On | Off | On | On | Off | Off | On | Off | Off | Off |

TABLE 12

States and Descriptions for RF Coupler of FIG. 22A

| State | Description |
|---|---|
| 1 | Forward Power, Section 85 Electrically Connected to Coupled Port |
| 2 | Forward Power, Section 87 Electrically Connected to Coupled Port |
| 3 | Forward Power, Section 89 Electrically Connected to Coupled Port |
| 4 | Forward Power, Sections 85 & 87 Electrically Connected to Coupled Port |
| 5 | Forward Power, Sections 85 & 89 Electrically Connected to Coupled Port |
| 6 | Forward Power, Sections 87 & 89 Electrically Connected to Coupled Port |
| 7 | Forward Power, Sections 85, 87 & 89 Electrically Connected to Coupled Port |
| 8 | Decoupled |
| 9 | Reverse Power, Section 85 Electrically Connected to Coupled Port |
| 10 | Reverse Power, Section 87 Electrically Connected to Coupled Port |
| 11 | Reverse Power, Section 89 Electrically Connected to Coupled Port |
| 12 | Reverse Power, Sections 85 & 87 Electrically Connected to Coupled Port |
| 13 | Reverse Power, Sections 85 & 89 Electrically Connected to Coupled Port |
| 14 | Reverse Power, Sections 87 & 89 Electrically Connected to Coupled Port |
| 15 | Reverse Power, Sections 85, 87 & 89 Electrically Connected to Coupled Port |

Figure 22B:
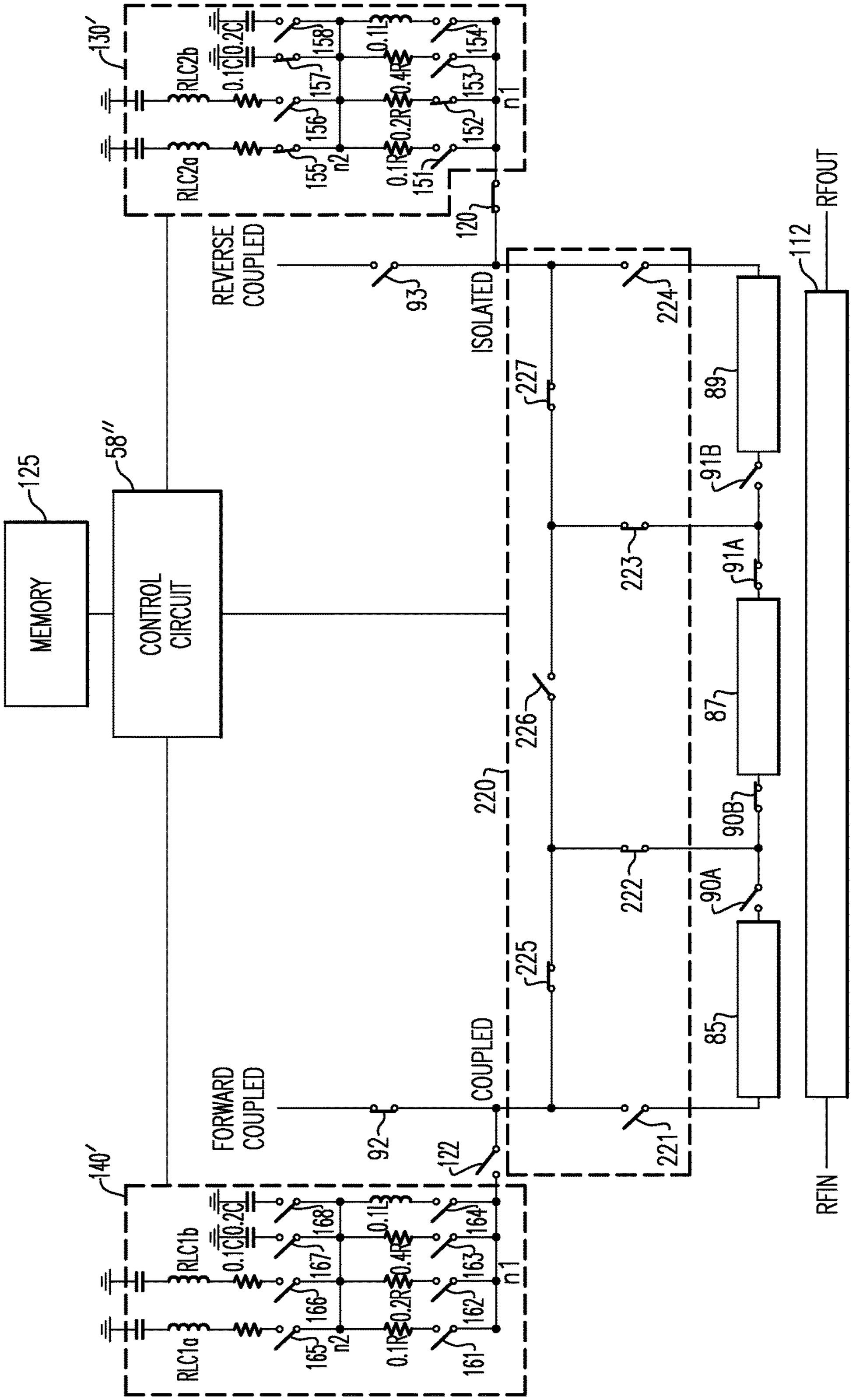
FIG. 22B is a schematic diagram of an electronic system that includes a radio frequency coupler having a multi-section coupled line, termination impedance circuits, and switches configured to selectively electrically connect a selected termination impedance circuit of the termination impedance circuits to a selected section of the multi-section coupled line, according to another embodiment.

FIG. 22B is a schematic diagram of an electronic system that includes a radio frequency coupler having a multi-section coupled line, termination impedance circuits 130' and 140', and switches configured to selectively electrically connect a selected termination impedance circuit of the termination impedance circuits to a selected section of the multi-section coupled line, according to another embodiment. The electronic system of FIG. 22B is similar to the electronic system of FIG. 22A except that the termination impedance circuits 130' and 140' are implemented in place of the termination impedance circuits 130 and 140. In an embodiment, one termination impedance circuit from FIG. 22A (e.g., the termination impedance circuit 130) can be implemented and one termination impedance circuit from FIG. 22B (e.g., the termination impedance circuit 140') can be implemented. Other suitable termination impedance circuits can be implemented in various embodiments.

Figure 22C:
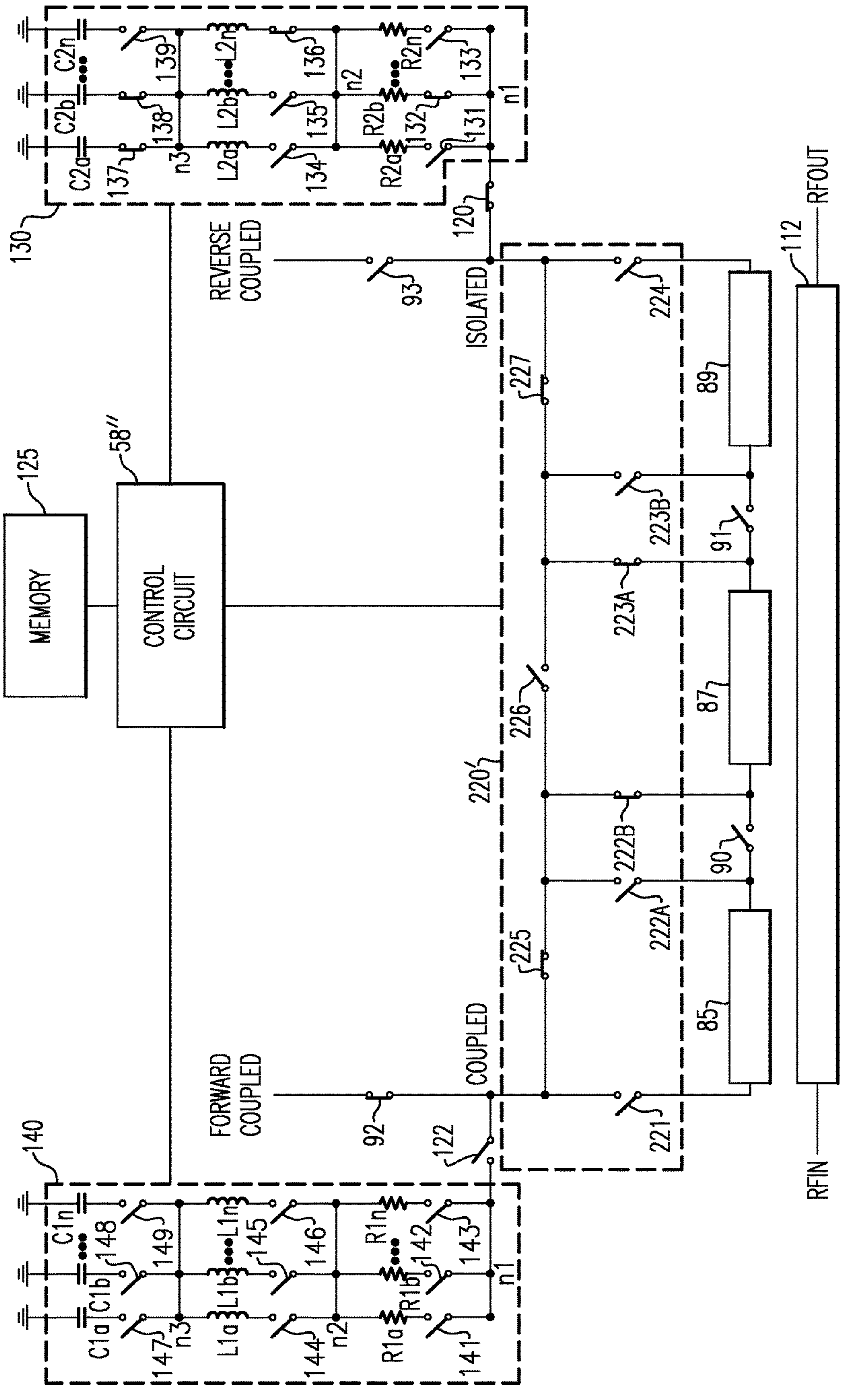
FIG. 22C is a schematic diagram of an electronic system that includes a radio frequency coupler having a multi-section coupled line, termination impedance circuits, and switches configured to selectively electrically connect a termination impedance circuit to a selected section of the multi-section coupled line, according to another embodiment.

FIG. 22C is a schematic diagram of an electronic system that includes a radio frequency coupler having a multi-section coupled line, termination impedance circuits 130 and 140, and switches configured to selectively electrically connect a termination impedance circuit to a selected section of the multi-section coupled line, according to another embodiment. The electronic system of FIG. 22C is similar to the electronic system of FIG. 22A except that the switch network 220' is implemented in place of the switch network 220 and there are fewer switches in series between adjacent sections of the multi-section coupled line. In particular, in the electronic system of FIG. 22C, switches 90, 91, 222A, 222B, 223A, and 223B are implemented instead of switches 90A, 90B, 91A, 91B, 222, and 223 of FIG. 22A. Other suitable switch networks can be implemented in various embodiments.

Figure 23A:
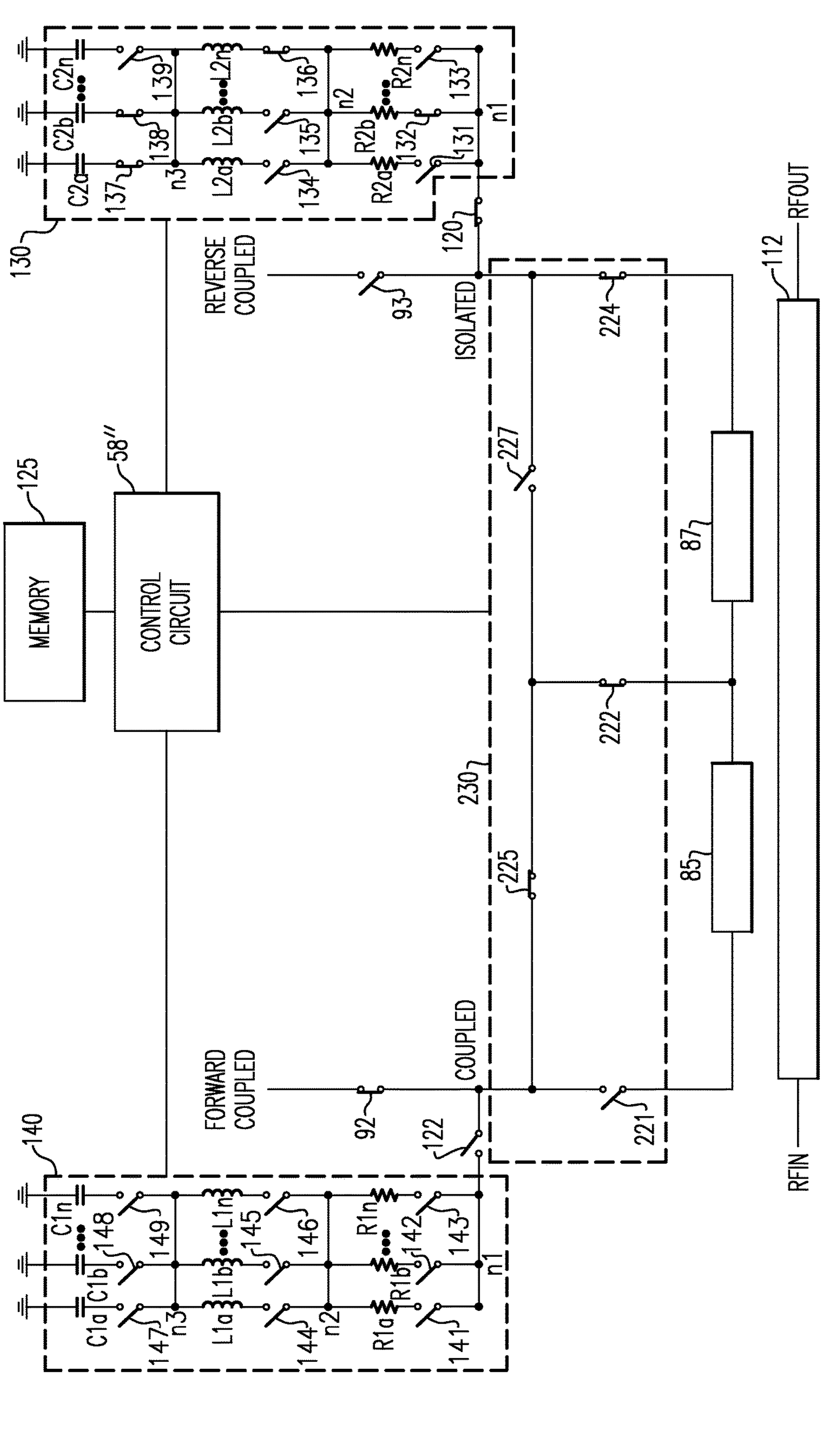
FIG. 23A is a schematic diagram of an electronic system that includes a radio frequency coupler having a multi-section coupled line, termination impedance circuits, and switches configured to selectively electrically connect a selected termination impedance circuit of the termination impedance circuits to a selected section of the multi-section coupled line, according to another embodiment.

FIG. 23A is a schematic diagram of an electronic system that includes a radio frequency coupler having a two section coupled line, termination impedance circuits 130 and 140, and a switch network 230 configured to selectively electrically connect a selected termination impedance circuit of the termination impedance circuits to a selected section of the multi-section coupled line, according to another embodiment. As illustrated, the switch network 230 includes switches 221, 222, 224, 225, and 227. The switch network 230 can switch in section 85, section 87, or both sections 85 and 87. The switch network 230 can selectively electrically connect one of the termination impedance circuits 130 or 140 to either section 85 or section 87. The switch network 230 can also decouple sections 85 and 87 from both of the termination impedance circuits 130 and 140. Other suitable termination impedance circuits can be implemented in connection with the switch network 230. As illustrated in FIG. 23A, the switch network 230 electrically connects a first end of the second section 87 to the forward coupled output and electrically connects a second end of the second section 87 to the termination impedance circuit 130. In the state illustrated in FIG. 23A, the first section 85 should not significantly contribute to the coupling factor of the illustrated RF coupler. Accordingly, the length of the first section 85 is not considered part of the effective length of the coupled line electrically connected to the coupled port in the state illustrated in FIG. 23A.

Figure 23B:
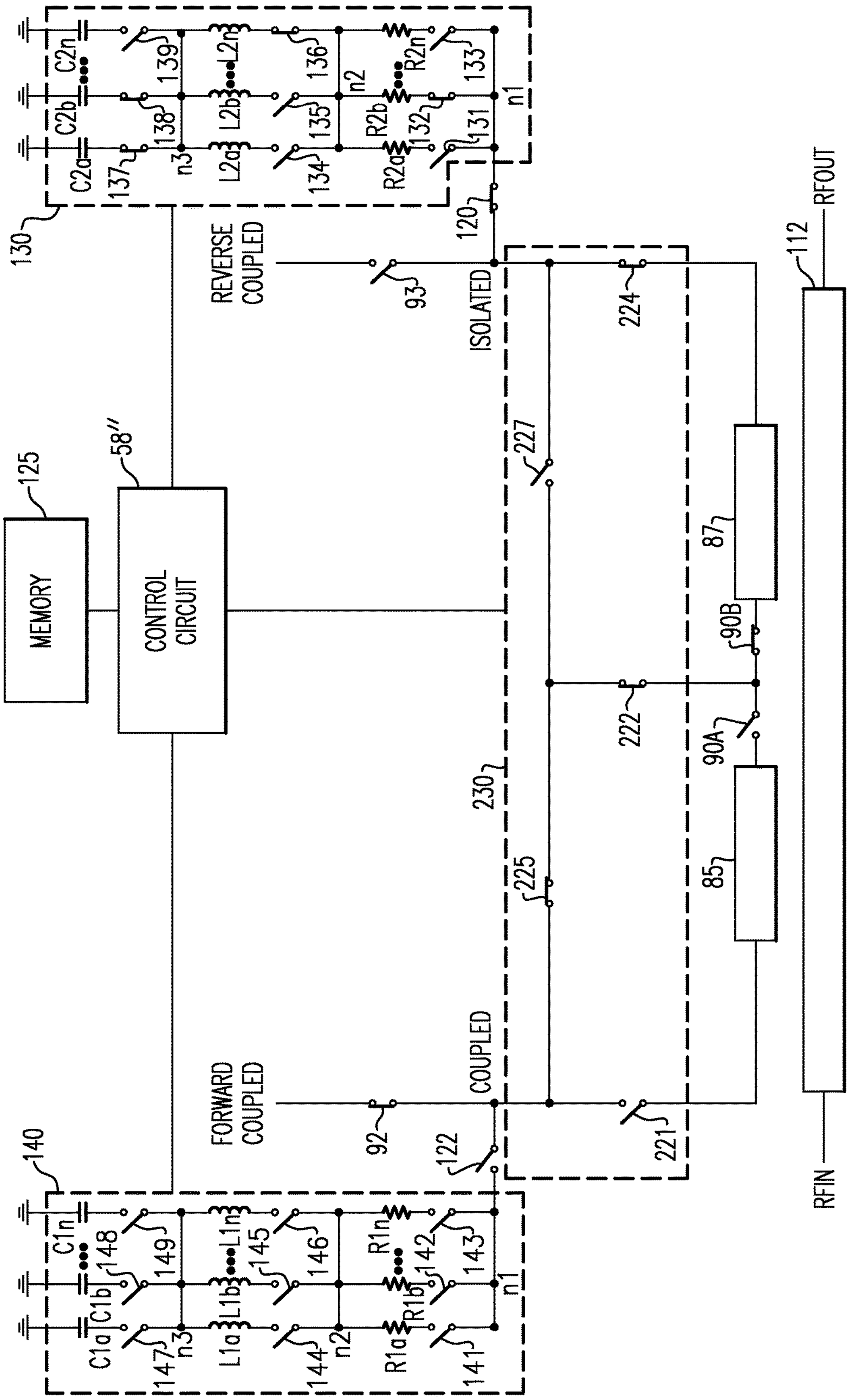
FIG. 23B is a schematic diagram of an electronic system that includes a radio frequency coupler having a multi-section coupled line, termination impedance circuits, and switches configured to selectively electrically connect a selected termination impedance circuit of the termination impedance circuits to a selected section of the multi-section coupled line, according to another embodiment.

FIG. 23B is a schematic diagram of an electronic system that includes a radio frequency coupler having a two section coupled line, termination impedance circuits 130 and 140, and a switch network 230 configured to selectively electrically connect a selected termination impedance circuit of the termination impedance circuits to a selected section of the multi-section coupled line, according to another embodiment. The electronic system of FIG. 23B is similar to the electronic system of FIG. 23A except that the electronic system of FIG. 23B also includes switches 90A and 90B in series between sections 85 and 87.

Figure 24:
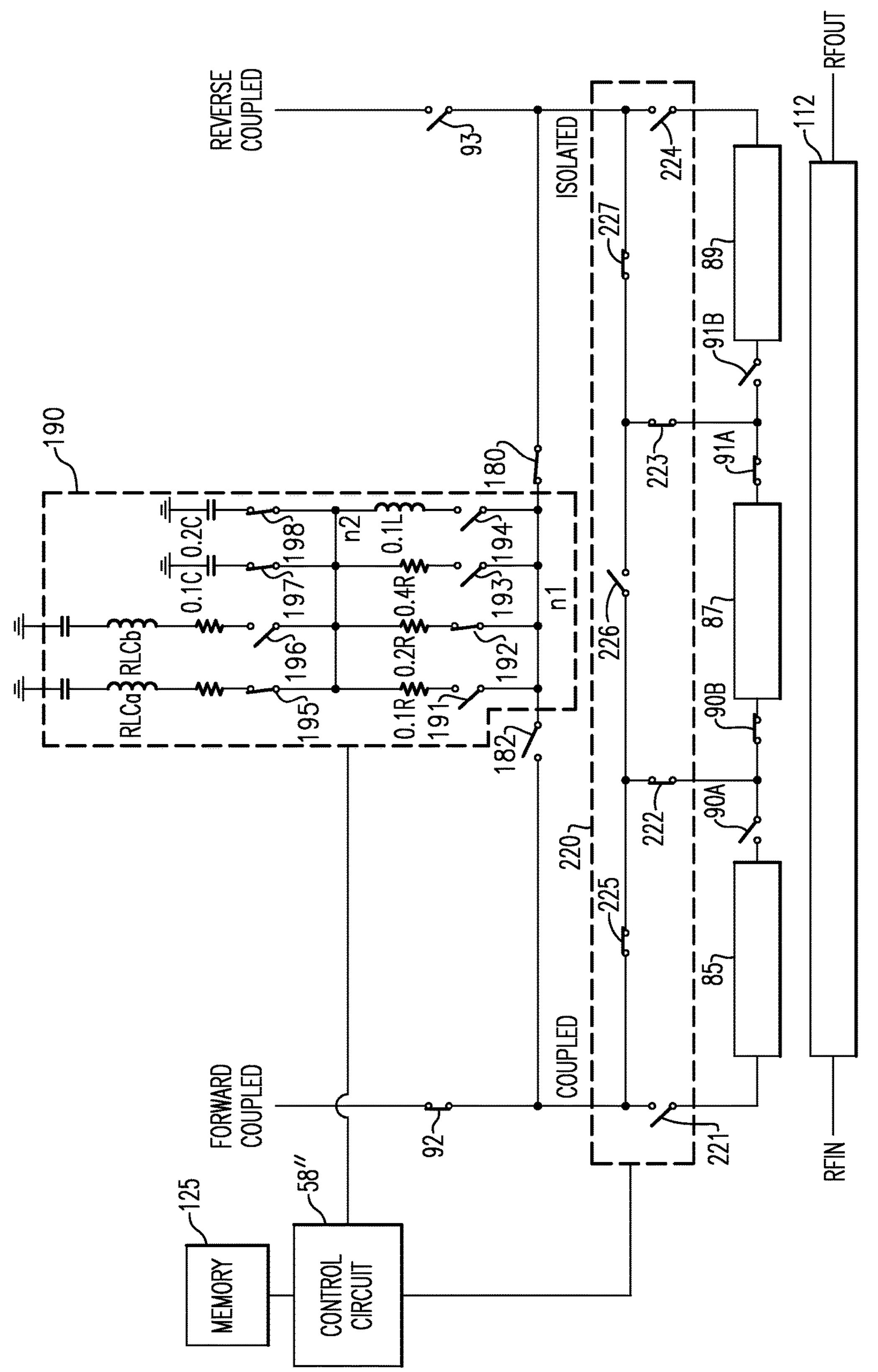
FIG. 24 is a schematic diagram of an electronic system that includes a radio frequency coupler having a multi-section coupled line, a shared termination impedance circuit, and switches configured to selectively electrically connect the shared termination impedance circuit to a selected section of the multi-section coupled line, according to another embodiment.

FIG. 24 is a schematic diagram of an electronic system that includes a radio frequency coupler having a multi-section coupled line, a shared termination impedance circuit 190, and a switch network 220, according to another embodiment. The switch network 220 and the isolation switches 180 and 182 are together configured to selectively electrically connect the shared termination impedance circuit 190 to a selected section of the multi-section coupled line. The electronic system illustrated in FIG. 24 is similar to the electronic system illustrated in FIG. 19A except that the electronic system in FIG. 24 includes a multi-section coupled line and the switch network 220. As illustrated, the switch network 220 can selectively electrically connect the shared termination impedance circuit 190 to a selected section of the multi-section coupled line. The switch network 220 can selectively electrically connect the shared termination impedance circuit 190 to either end of the selected section. While a three section coupled line is illustrated in FIG. 24, the principles and advantages of the embodiment of FIG. 24 can be applied in connection with a two section coupled line or a coupled line having four or more sections. While the shared termination impedance circuit 190 is shown for illustrative purposes, a shared termination impedance circuit having one or more features of any of the termination circuits discussed herein can alternatively be implemented.

Figures 25A, 25B:
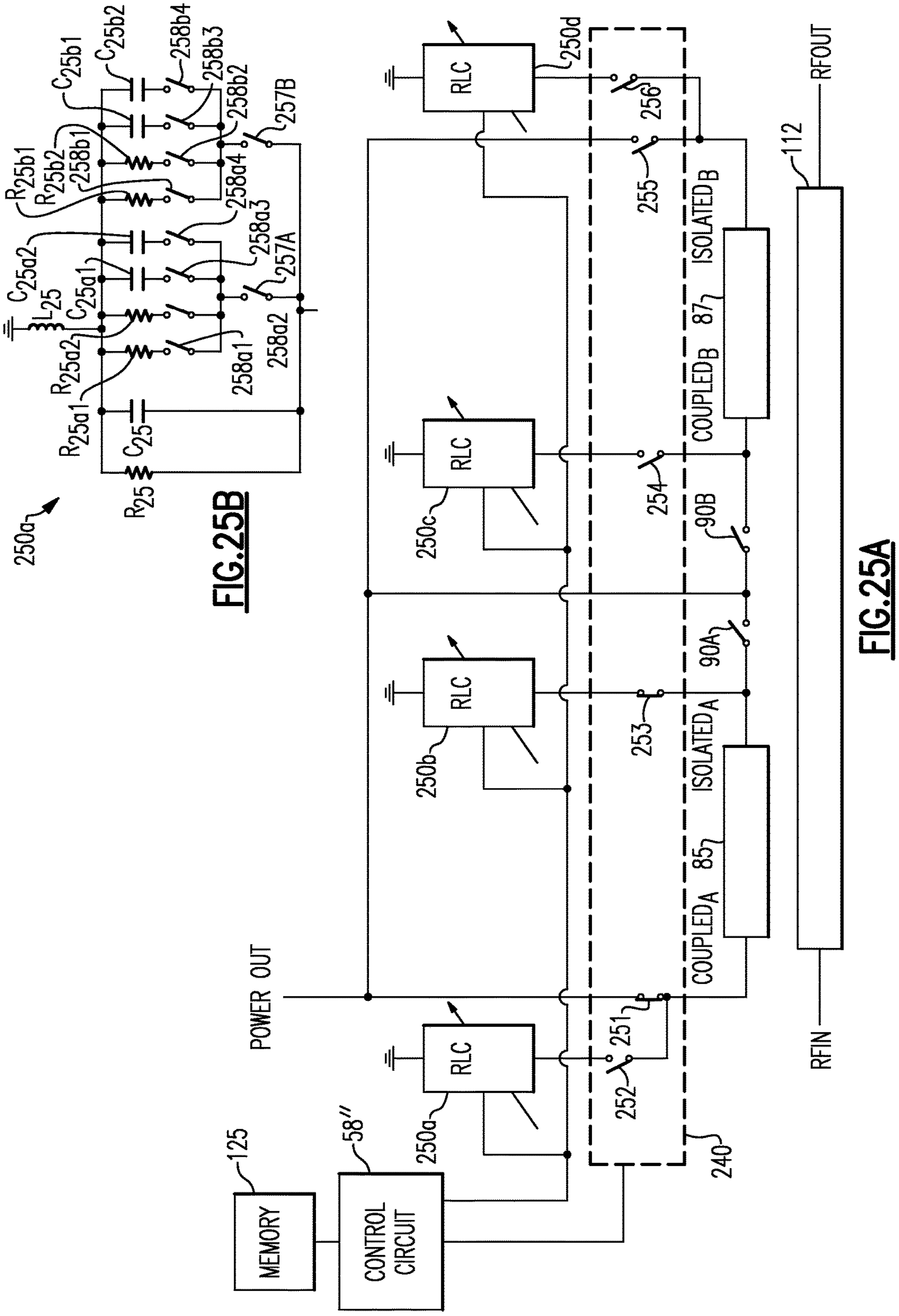
FIG. 25A is a schematic diagram of an electronic system that includes a radio frequency coupler having a multi-section coupled line, a plurality of termination impedance circuits, and a switch network, according to an embodiment.
FIG. 25B illustrates an example termination impedance circuit of FIG. 25A, according to an embodiment.

FIG. 25A is a schematic diagram of an electronic system that includes a radio frequency coupler having a multi-section coupled line, a plurality of termination impedance circuits 250*a* to 250*d*, and a switch network 240, according to an embodiment.

In FIG. 25A, the switch network 240 includes switches 251, 252, 253, 254, 255, and 256. The switch network 240 can receive one or more control signals from control circuit 58" and can selectively electrically connect a selected termination impedance circuit 250*a*, 250*b*, 250*c*, or 250*d* to a selected end of a section 85 or 87 of the multi-section coupled line. For instance, the switch 252 can selectively electrically connect a first termination impedance circuit 250*a* to a first end of the first section 85 responsive to a control signal provided by the control circuit 58". As another example, the switch 253 can selectively electrically connect a second termination impedance circuit 250*b* to a second end of the first section 85 responsive to a control signal provided by the control circuit 58". The switch network 240 can electrically decouple all of the termination impedance circuits 250*a*, 250*b*, 250*c*, and 250*d* from the first section 85 and the second section 87 in a decoupled state.

The switches 251 and 255 of the switch network 240 and the coupling factor switches 90A and 90B can electrically connect a selected end of a section 85 or 87 to a power output port Power Out. The coupling factor switches 90A and 90B can be considered part of a switch network that also includes the switch network 240. In FIG. 25A, a single power output port Power Out is provided to provide either an indication of forward power or an indication of reverse power. A single output port can be implemented in connection with any of the other embodiments discussed herein by including additional switches and/or modifying the switch networks of the other embodiments.

In certain embodiments, a separate termination impedance circuit having an adjustable termination impedance can be implemented for each of two or more sections of a multi-section coupled line. According to some embodiments, separate termination impedance circuits can be implemented for each end of a section of a multi-section coupled line. As illustrated in FIG. 25A, a first termination impedance circuit 250*a* is electrically collected to a first end of a first section 85 of the coupled line, a second termination impedance circuit 250*b* is electrically connected to a second end of the first section 85 of the coupled line, a third termination impedance circuit 250*c* is electrically collected to a first end of the second section 87 of the coupled line, and a fourth termination impedance circuit 250*b* is electrically collected to a second end of the second section 87 of the coupled line.

In FIG. 25A, each of the termination impedance circuits 250*a*, 250*b*, 250*c*, and 250*d* includes an RLC circuit having an adjustable termination impedance. The control circuit 58" can provide one or more control signals to adjust the termination impedance of the termination impedance circuits 250*a*, 250*b*, 250*c*, and/or 250*d*. While an example termination impedance circuit 250*a* will be discussed with reference to FIG. 25B for illustrative purposes, it will be understood that any of the principles and advantages discussed herein related to termination impedance circuits can alternatively be implemented. Moreover, one or more of the termination impedance circuits 250*b*, 250*c*, or 250*d* can be substantially the same as the termination impedance circuit 250*a* in certain embodiments. According to some embodiments, one or more of the termination impedance circuits 250*b*, 250*c*, or 250*d* can be different than the termination impedance circuit 250*a*.

FIG. 25B illustrates an example termination impedance circuit 250*a* of FIG. 25A, according to an embodiment. Any of the principles and advantages of the termination impedance circuit 250*a* can be implemented in connection with any of the other embodiments discussed herein, including embodiments with multi-section coupled lines and embodiments with a continuous coupled line. As illustrated, the termination impedance circuit 250*a* is an adjustable RLC circuit. The termination impedance circuit 250*a* can include a fixed impedance portion and an adjustable impedance portion.

The fixed impedance portion can include one or more resistors, one or more capacitors, one or more inductors, or any suitable series and/or parallel combination thereof. For instance, the fixed impedance portion can include a parallel RC circuit. The fixed impedance portion can include a series RL circuit. The fixed impedance portion can include a series LC circuit. As illustrated in FIG. 25B, the fixed impedance portion of the termination impedance circuit 250*a* includes a parallel RC circuit, which includes resistor $R_{25}$ in parallel with capacitor $C_{25}$, in series with an inductor $L_{25}$.

The adjustable impedance portion can include a plurality of passive impedance elements and a plurality of switches. Alternatively or additionally, the adjustable impedance portion can include varactor(s) and/or other variable impedance element(s). For example, the adjustable impedance portion can include one or more capacitors and one or more corresponding switches configured to selectively switch in and selectively switch out the impedance of a respective capacitor. As another example, the adjustable impedance portion can include one or more resistors and one or more corresponding switches configured to selectively switch in and selectively switch out the impedance of a respective resistor. As illustrated in FIG. 25B, the termination impedance circuit 250*a* includes switches 257A, 257B, 258*a*1, 258*a*2, 258*a*3, 258*a*4, 258*b*1, 258*b*2, 258*b*3, and 258*b*4, capacitors $C_{25a1}$, $C_{25a2}$, $C_{25b1}$, and $C_{25b2}$, and resistors $R_{25a1}$, $R_{25a2}$, $R_{25b1}$, and $R_{25b2}$. The illustrated switches can receive signals from a control circuit, such as the control circuit 58" of FIG. 25A, and selectively electrically couple a respective passive impedance element between ground and a section of a multi-section coupled line. Zero, one, or more of the illustrated switches can be on at the same time. To avoid having more switches than desired coupled to a particular node, the switches can branch such that no more than a certain number of switches (e.g., 4 as illustrated) are directly connected to a particular node. As illustrated, switches 257A and 257B can selectively electrically connect respective switch banks to a port of an RF coupler. Switches **258*a*1, 258*a*2, 258*a*3, 258*a*4, 258*b*1, 258*b*2, 258*b*3, and 258*b*4** of the switch banks can selectively switch in and selectively switch out impedances of respective passive impedance elements in parallel with the parallel RC circuit that includes the resistor $R_{25}$ in parallel with the capacitor $C_{25}$. The illustrated resistors and capacitors of the adjustable impedance portion can have any suitable impedance values for a particular application.

The termination impedance circuit 250 includes passive impedance elements coupled in series between a switch and ground, in which the switch is coupled between a port of an RF coupler and the series passive impedance elements. The passive impedance elements in series can include an inductor and a resistor and an inductor and a capacitor, as illustrated. More generally, the passive impedance elements in series can include a resistor and another type of passive impedance element, a capacitor and another type of passive impedance element, or an inductor and another type of passive impedance element.

Figure 26A:
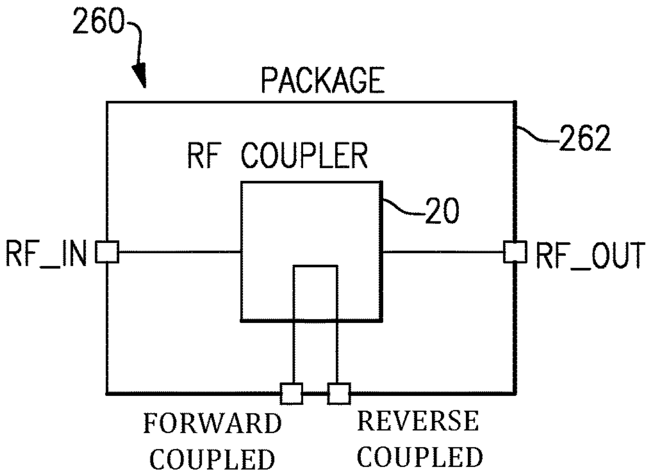
FIGS. 26A to 26C illustrate example modules that can include any of the radio frequency couplers discussed herein.
Figure 26B:
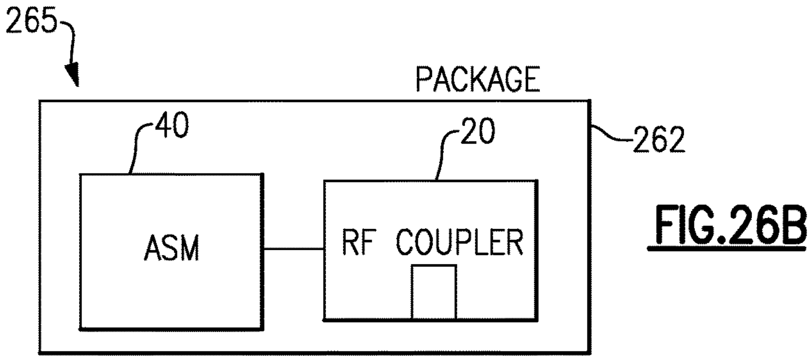
Figure 26C:
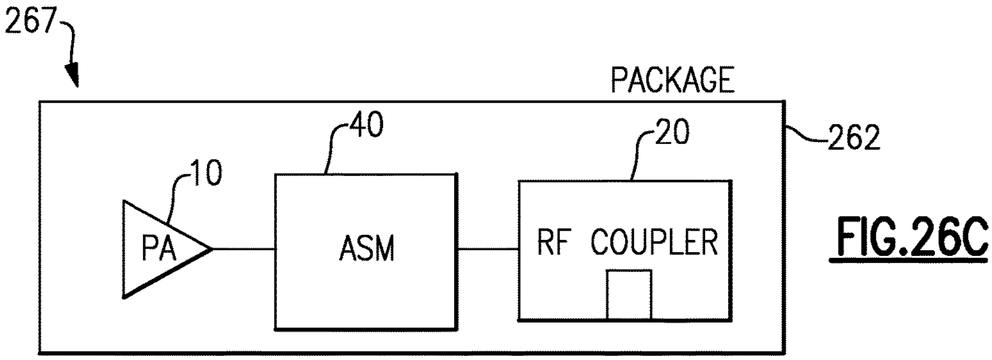

The radio frequency couplers described herein can be implemented in a variety of different modules including, for example, a stand-alone radio frequency coupler, an antenna switch module, a module combining a radio frequency coupler and an antenna switch module, an impedance matching module, an antenna tuning module, or the like. FIGS. 26A to 26C illustrate example modules that can include any of the radio frequency couplers discussed herein. These example modules can include any combination of features associated with radio frequency couplers, termination impedance circuits, switch networks and/or switch circuits, or the like.

FIG. 26A is a block diagram of a packaged module 260 that includes a radio frequency coupler. The packaged module 260 includes a package 262 that encases an RF coupler 20. The packaged module 260 can include contacts, such as pins, sockets, ball, lands, etc., corresponding to each port of the RF coupler 20. In some embodiments, the packaged module 260 can include a first contact corresponding to a power input port, a second contact corresponding to a power output port, a third contact corresponding to a forward coupled output, and a fourth contact corresponding to a reverse coupled output. According to another embodiment, the packaged module 260 can include a single contact for output power corresponding to either forward power or reverse power depending on the state of switches in the packaged module 260. Termination impedance circuits and/or switches in accordance with any of the principles and advantages discussed herein can be included within the package 262 of any of the example modules illustrated in FIGS. 26A to 26C.

FIG. 26B is a block diagram of a packaged module 265 that includes a radio frequency coupler 20 and an antenna switch module 40. In FIG. 26B, a package 262 encases both the RF coupler 20 and the antenna switch module 40. FIG. 26C is a block diagram of a packaged module 267 that includes a radio frequency coupler 20, an antenna switch module 40, and a power amplifier 10. The packaged module 267 includes these elements within a common package 262.

Figure 27:
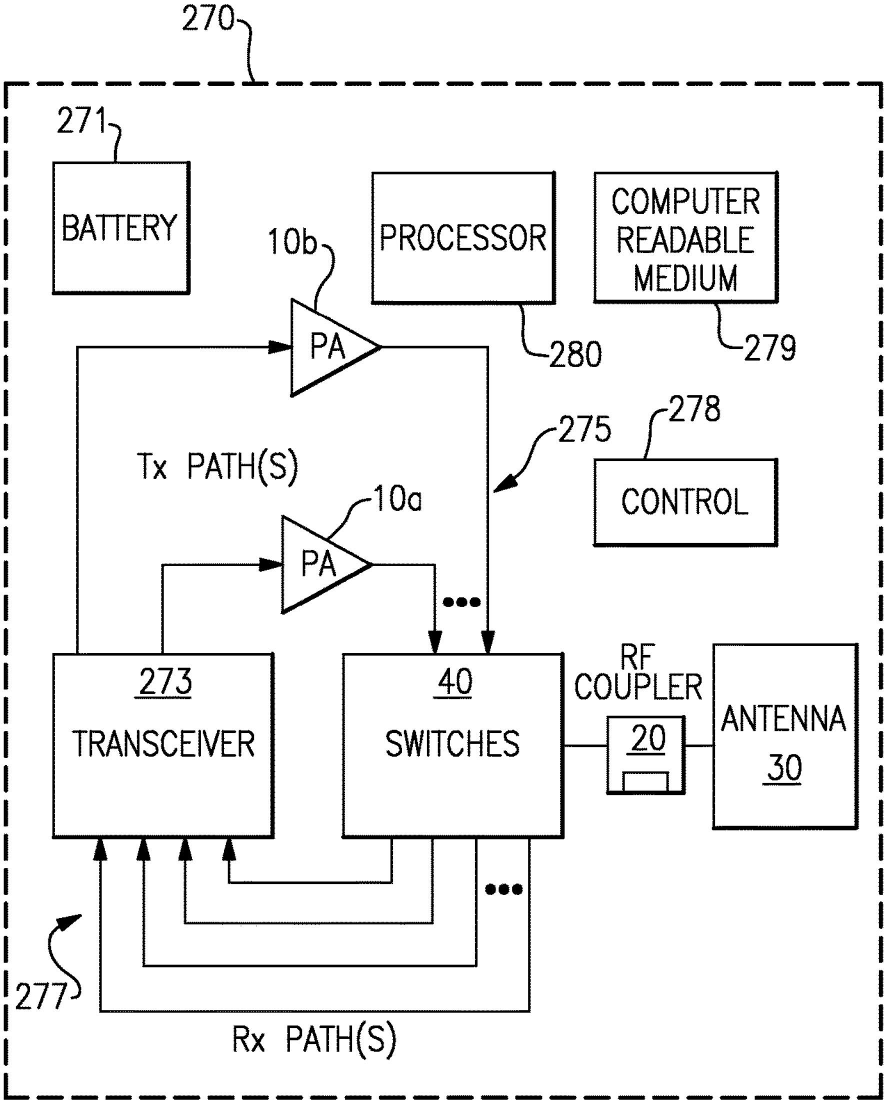
FIG. 27 is a schematic block diagram of an example wireless device that can include any of the radio frequency couplers discussed herein.

FIG. 27 illustrates an example wireless device 270 that can include one or more radio frequency couplers having one or more features discussed herein. For instance, the example wireless device 270 can include an RF coupler in accordance with any of the principles and advantages discussed with reference to any of the RF couplers of FIG. 3A, 4, 5, 7A, 8A, 9A, 10A, 13A, 14, 15, 16A, 17A, 19A, or 20 to 25A. The example wireless device 270 can be a mobile phone, such as a smart phone. The example wireless device 270 can include elements that are not illustrated in FIG. 27 and/or a subcombination of the illustrated elements.

The example wireless device 270 depicted in FIG. 27 can represent a multi-band and/or multi-mode device such as a multi-band/multi-mode mobile phone. By way of example, the wireless device 270 can communicate in accordance with Long Term Evolution (LTE). In this example, the wireless device can be configured to operate at one or more frequency bands defined by an LTE standard. The wireless device 270 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated, the wireless device 270 can include a transceiver 273, an antenna switch module 40, an RF coupler 20, an antenna 30, power amplifiers 10, a control component 278, a computer readable storage medium 279, a processor 280, and a battery 271.

The transceiver 273 can generate RF signals for transmission via the antenna 30. Furthermore, the transceiver 273 can receive incoming RF signals from the antenna 30. It will be understood that various functionalities associated with transmitting and receiving of RF signals can be achieved by one or more components that are collectively represented in FIG. 27 as the transceiver 273. For example, a single component can be configured to provide both transmitting and receiving functionalities. In another example, transmitting and receiving functionalities can be provided by separate components.

In FIG. 27, one or more output signals from the transceiver 273 are depicted as being provided to the antenna 30 via one or more transmission paths 275. In the example shown, different transmission paths 275 can represent output paths associated with different frequency bands (e.g., a high band and a low band) and/or different power outputs. One or more of the transmission paths 275 can be associated with different transmission modes. One of the illustrated transmission paths 275 can be active while one or more of the other transmission paths 275 are non-active. Other transmission paths 275 can be associated with different power modes (e.g., high power mode and low power mode) and/or paths associated with different transmit frequency bands. The transmit paths 275 can include one or more power amplifiers 10 to aid in boosting an RF signal having a relatively low power to a higher power suitable for transmission. As illustrated, the power amplifiers **10*a* and 10*b* can include the power amplifiers 10 discussed above. The wireless device 270 can be adapted to include any suitable number of transmission paths 275**.

In FIG. 27, one or more signals from the antenna 30 are depicted as being provided to the transceiver 273 via one or more receive paths 277. In the example shown, different receive paths 277 can represent paths associated with different signaling modes and/or different receive frequency bands. The wireless device 270 can be adapted to include any suitable number of receive paths 277.

To facilitate switching between receive and/or transmit paths, the antenna switch module 40 can be included and can be used to selectively electrically connect the antenna 30 to a selected transmit or receive path. Thus, the antenna switch module 40 can provide a number of switching functionalities associated with an operation of the wireless device 270. The antenna switch module 40 can include a multi-throw switch configured to provide functionalities associated with, for example, switching between different bands, switching between different modes, switching between transmission and receiving modes, or any combination thereof.

The RF coupler 20 can be disposed between the antenna switch module 40 and the antenna 30. The RF coupler 20 can provide an indication of forward power provided to the antenna 30 and/or an indication of reverse power reflected from the antenna 30. The indications of forward and reverse power can be used, for example, to compute a reflected power ratio, such as a return loss, a reflection coefficient, or a voltage standing wave ratio (VSWR). The RF coupler 20 illustrated in FIG. 27 can implement any of the principles and advantages of the RF couplers discussed herein.

FIG. 27 illustrates that in certain embodiments, the control component 278 can be provided for controlling various control functionalities associated with operations of the antenna switch module 40 and/or other operating component(s). For example, the control component 278 can aid in providing control signals to the antenna switch module 40 so as to select a particular transmit or receive path. As another example, the control component 278 can provide control signals to configure the RF coupler 20 and/or an associated termination impedance circuit and/or an associated switch network in accordance with any of the principles and advantages discussed herein.

In certain embodiments, the processor 280 can be configured to facilitate implementation of various processes on the wireless device 270. The processor 280 can be, for example, a general purpose processor or special purpose processor. In certain implementations, the wireless device 270 can include a non-transitory computer-readable medium 279, such as a memory, which can store computer program instructions that may be provided to and executed by the processor 280.

The battery 271 can be any suitable battery for use in the wireless device 270, including, for example, a lithium-ion battery.

Some of the embodiments described above have provided examples in connection with power amplifiers and/or mobile devices. However, the principles and advantages of the embodiments can be used for any other systems or apparatus, such as any uplink cellular device, that could benefit from any of the circuits described herein. Any of the principles and advantages discussed herein can be implemented in an electronic system with a need for detecting and/or monitoring a power level associated with an RF signal, such as forward RF power and/or a reverse RF power. Any of the switch networks and/or switch circuit discussed herein can alternatively or additionally be implemented by any other suitable logically equivalent and/or functionally equivalent switch networks. The teachings herein are applicable to a variety of power amplifier systems including systems with multiple power amplifiers, including, for example, multi-band and/or multi-mode power amplifier systems. The power amplifier transistors discussed herein can be, for example, gallium arsenide (GaAs), complementary metal oxide semiconductor (CMOS), or silicon germanium (SiGe) transistors. Moreover, power amplifiers discussed herein can be implemented by FETs and/or bipolar transistors, such as heterojunction bipolar transistors.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand-held computer, a laptop computer, a tablet computer, an electronic book reader, a wearable computer such as a smart watch, a personal digital assistant (PDA), a microwave, a refrigerator, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "electrically coupled", as generally used herein, refer to two or more elements that may be either directly electrically connected, or electrically connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, where context permits, covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bi-directional radio frequency coupler having a forward power state and a reverse power state, comprising:

a power input port configured to receive a radio frequency signal, a power output port, a coupled port and an isolation port;

a main transmission line electrically connected between the power input port and the power output port;

a coupled line electrically connected between the coupled port and the isolation port, the main transmission line and the coupled line together being configured to provide an indication of forward power of the radio frequency signal at the coupled port in a forward power state and to provide an indication of reverse power of the radio frequency signal at the isolation port in a reverse power state;

a termination impedance circuit configured to provide an adjustable termination impedance;

an isolation switch circuit configured to electrically connect the termination impedance circuit to the isolation port in the forward power state and to electrically isolate the termination impedance circuit from the isolation port in the reverse power state;

a memory; and a control circuit coupled to the memory and to the termination impedance circuit, the control circuit being configured to adjust the adjustable termination impedance based on data stored in the memory.

2. The coupler of claim 1 further comprising a second termination impedance circuit configured to provide a second adjustable termination impedance, and the isolation switch circuit being configured to selectively electrically connect the second termination impedance circuit to the coupled port and to selectively electrically isolate the second termination impedance circuit from the coupled port.

3. The coupler of claim 1 wherein the isolation switch circuit is configured to electrically connect the termination impedance circuit to the coupled port when the isolation switch circuit isolates the isolation port from the termination impedance circuit.

4. The coupler of claim 1 wherein the coupler has a decoupled state in which the coupled line is decoupled from the main transmission line.

5. The coupler of claim 1 wherein the termination impedance circuit includes a plurality of switches and a plurality of passive impedance elements.

6. The coupler of claim 1 wherein the control circuit is configured to adjust the adjustable termination impedance based at least partly on an indication of a frequency of the radio frequency signal.

7. A bi-directional radio frequency coupler having a forward power state and a reverse power state, comprising:

a power input port, a power output port, a coupled port, and an isolation port;

a main transmission line electrically connected between the power input port and the power output port;

a coupled line electrically connected between the coupled port and the isolation port, the coupled line configured to couple a portion of a radio frequency signal from the main transmission line;

a termination impedance circuit configured to provide an adjustable termination impedance;

an isolation switch disposed between the isolation port and the termination impedance circuit, the isolation switch configured to electrically connect the isolation port to the termination impedance circuit when the isolation switch is on such that the coupled port provides an indication of radio frequency power traveling from the power input port to the power output port, and the isolation switch configured to electrically isolate the isolation port from the termination impedance circuit when the isolation switch is off;

a memory; and a control circuit coupled to the memory and to the termination impedance circuit, the control circuit being configured to adjust the adjustable termination impedance based on data stored in the memory.

8. The coupler of claim 7 wherein the isolation switch is a single pole, single throw switch.

9. The coupler of claim 7 wherein the isolation switch includes a series-shunt-series circuit topology.

10. The coupler of claim 7 further comprising a second termination impedance circuit configured to provide a second adjustable termination impedance and a second isolation switch, the second isolation switch disposed between the second termination impedance circuit and the coupled port.

11. The coupler of claim 7 further comprising a second isolation switch disposed between the termination impedance circuit and the coupled port, the second isolation switch configured to electrically connect the coupled port to the termination impedance circuit when the second isolation switch is on such that the isolation port provides an indication of radio frequency power traveling from the power output port to the power input port, and the second isolation switch configured to electrically isolate the coupled port from the termination impedance circuit when the second isolation switch is off.

12. The coupler of claim 7 wherein the termination impedance circuit includes a plurality of switches and a plurality of passive impedance elements.

13. The coupler of claim 12 wherein the isolation switch and at least one of the plurality of switches is in series between each of the plurality of passive impedance elements and the isolation port.

14. A bi-directional radio frequency coupler having a forward power state and a reverse power state, comprising:

a power input port configured to receive a radio frequency signal, a coupled port and an isolation port, the radio frequency coupler configured to provide an indication of forward radio frequency power of the radio frequency signal at the coupled port in a forward power state and to provide an indication of reverse radio frequency power of the radio frequency signal at the isolation port in a reverse power state;

a main transmission line electrically connected to the power input port;

a coupled line electrically connected between the coupled port and the isolation port, the coupled line configured to couple a portion of the radio frequency signal from the main transmission line;

a termination impedance circuit configured to provide an adjustable termination impedance;

an isolation switch circuit configured to selectively electrically connect the termination impedance circuit to a selected port of the radio frequency coupler and to selectively electrically isolate the termination impedance circuit from the selected port of the radio frequency coupler, the selected port being the isolation port or the coupled port;

a memory; and a control circuit coupled to the memory and to the termination impedance circuit, the control circuit being configured to adjust the adjustable termination impedance based on data stored in the memory.

15. The coupler of claim 14 further comprising a second termination impedance circuit configured to provide a second adjustable termination impedance, the selected port being the isolation port, and the isolation switch circuit being configured to selectively electrically connect the second termination impedance circuit to the coupled port and to selectively electrically isolate the second termination impedance circuit from the coupled port.

16. The coupler of claim 14 wherein the selected port is the isolation port and the isolation switch circuit is further configured to electrically connect the termination impedance circuit to the coupled port when the isolation switch circuit isolates the isolation port from the termination impedance circuit.

17. The coupler of claim 14 wherein the control circuit is configured to adjust the adjustable termination impedance based at least partly on an indication of a frequency of the radio frequency signal.

18. The coupler of claim 14 wherein the termination impedance circuit includes a switch disposed between the isolation switch circuit and a passive impedance element.

19. The coupler of claim 14 wherein the termination impedance circuit includes at least two switches and at least two passive impedance elements, the two switches and the two passive impedance elements being disposed in series between the isolation switch circuit and ground.

20. The coupler of claim 14 wherein the termination impedance circuit includes a switch bank of switches disposed in parallel with each other and passive impedance elements, each of the switches of the switch bank being disposed between the isolation switch circuit and a respective passive impedance element of the passive impedance elements.

* * * * *